(12) United States Patent
Yarmis et al.

(10) Patent No.: US 9,412,979 B2
(45) Date of Patent: Aug. 9, 2016

(54) DEVICE FOR MONITORING PERFORMANCE CHARACTERISTICS ASSOCIATED WITH USER ACTIVITIES INVOLVING SWINGING INSTRUMENTS

(71) Applicants: Benjamin B. Yarmis, Stamford, CT (US); Adrienne Murphy Jalbert, Waltham, MA (US); Paul Chandler Sabin, Needham, MA (US)

(72) Inventors: Benjamin B. Yarmis, Stamford, CT (US); Adrienne Murphy Jalbert, Waltham, MA (US); Paul Chandler Sabin, Needham, MA (US)

(73) Assignee: Arccos Golf LLC, Stamford, CT (US)

( * ) Notice: Subject to any disclaimer, the term of this patent is extended or adjusted under 35 U.S.C. 154(b) by 101 days.

(21) Appl. No.: 14/273,115

(22) Filed: May 8, 2014

(65) Prior Publication Data
US 2015/0327386 A1 Nov. 12, 2015

(51) Int. Cl.
| | |
|---|---|
| H01L 21/336 | (2006.01) |
| H01M 2/10 | (2006.01) |
| H05K 5/03 | (2006.01) |
| H05K 5/02 | (2006.01) |
| H05K 5/00 | (2006.01) |
| H05K 13/00 | (2006.01) |
| H05K 13/04 | (2006.01) |

(52) U.S. Cl.
CPC .............. *H01M 2/10* (2013.01); *H05K 5/0086* (2013.01); *H05K 5/0221* (2013.01); *H05K 5/0239* (2013.01); *H05K 5/03* (2013.01); *H05K 13/0023* (2013.01); *H05K 13/04* (2013.01); *Y10T 29/49126* (2015.01)

(58) Field of Classification Search
CPC ................................... H05K 5/03; H01M 2/10
USPC ........................................................... 438/300
See application file for complete search history.

(56) References Cited

U.S. PATENT DOCUMENTS

| | | | | |
|---|---|---|---|---|
| 5,224,870 | A * | 7/1993 | Weaver | A61B 5/0404 429/97 |
| 6,413,167 | B1 | 7/2002 | Burke | |
| 6,602,145 | B1 * | 8/2003 | Yeh | A63B 69/3685 473/219 |
| 6,753,778 | B2 | 6/2004 | Kruger | |
| 7,648,422 | B2 | 1/2010 | Brooks et al. | |
| 8,840,483 | B1 | 9/2014 | Steusloff et al. | |

(Continued)

FOREIGN PATENT DOCUMENTS

WO    WO 2013/131740    9/2013

OTHER PUBLICATIONS

PCT International Search Report and Writtent Opinion for PCT/US2015/029678 dated Jul. 22, 2015.

*Primary Examiner* — Ajay K Arora
(74) *Attorney, Agent, or Firm* — McCarter & English, LLP

(57) ABSTRACT

Exemplary embodiments are directed to devices for attachment to a swinging instrument that generally include a cover, a base, a chassis, and positive and negative electrical contacts. The base includes a fastening portion and a support portion. The chassis supports a printed circuit board. The devices include a cap configured and dimensioned to mate relative to the support portion of the base. The support portion can support the chassis, the printed circuit board, the positive and negative electrical contacts, and the cap. The cover can be configured and dimensioned to detachably interlock relative to the base. In the mated configuration, the cap and the base can form a battery opening configured and dimensioned to receive therethrough a battery. Exemplary embodiments are also directed to methods of device assembly.

29 Claims, 54 Drawing Sheets

(56) References Cited

U.S. PATENT DOCUMENTS

| | | |
|---|---|---|
| 8,894,502 B2 | 11/2014 | Rose |
| 2005/0054457 A1 | 3/2005 | Eyestone et al. |
| 2005/0191543 A1* | 9/2005 | Harrington ........... H01M 2/024 429/65 |
| 2012/0120573 A1* | 5/2012 | Bentley .............. A63B 21/1469 361/679.01 |

* cited by examiner

DEVICE FOR MONITORING PERFORMANCE CHARACTERISTICS ASSOCIATED WITH USER ACTIVITIES INVOLVING SWINGING INSTRUMENTS

TECHNICAL FIELD

The present disclosure relates to devices and associated methods for monitoring performance characteristics associated with user activities involving swinging instruments and, in particular, to devices which provide convenient access to, and replacement, of an internal battery positioned within a secure housing.

BACKGROUND

In recent years, there have been efforts to monitor, track, and/or analyze a golfer's performance during a round of golf. Conventional devices generally include an internal battery, e.g., a button or coin cell battery, surrounded by a housing which may be difficult to access and/or remove for replacement purposes. For example, due to the small configuration of the battery, it may be difficult to detach the battery from the housing and appropriately insert a replacement battery.

Thus, a need exists for devices and methods for monitoring performance characteristics associated with user activities involving swinging instruments that provides convenient access to and replacement of an internal battery, while maintaining the battery in a secure housing during use of the devices. These and other needs are addressed by the devices and associated methods of the present disclosure.

SUMMARY

In accordance with embodiments of the present disclosure, exemplary devices for attachment to a swinging instrument are provided that generally include a cover, a base, a chassis, and positive and negative electrical contacts. The base includes a fastening portion and a support portion. The chassis can support a printed circuit board. The devices include a cap configured and dimensioned to mate relative to the support portion of the base. The support portion of the base can support the chassis, the printed circuit board, the positive and negative electrical contacts, and the cap. The cover can be configured and dimensioned to detachably interlock relative to the base to cover the chassis, the printed circuit board, the positive and negative electrical contacts, and the cap. In the mated configuration, the cap and the base can form a battery opening, e.g., a side opening or slot, configured and dimensioned to receive therethrough a battery.

In some embodiments, the cover includes an inner circumferential flange configured and dimensioned to snap over an edge of a bottom surface of the base to detachably interlock the cover to the base. In some embodiments, the cover and the base include complementary undulating features for detachably interlocking the cover to the base. In some embodiments, the devices include a retaining ring positioned within a circumferential groove in an inner surface of the cover to detachably interlock the cover and the base.

The cover includes a depressible button on a top surface for actuating an actuator of the printed circuit board. The depressible button can translate a protrusion on an interior surface of the cover through an opening in the cap to actuate the actuator of the printed circuit board. The fastening portion includes a shaft with an external thread thereon. The support portion of the base includes first and second side openings. At least a portion of the first side opening can form the battery opening. In the mated configuration, the cap and the base can form an opening configured and dimensioned to receive an instrument therethrough to eject the battery from the device. The support portion of the base includes two or more slots and the cap includes two or more complementary protrusions extending therefrom. The two or more slots and the two or more complementary protrusions can be configured and dimensioned to mate relative to each other.

The chassis includes two electrical slots for receiving extensions of the negative electrical contact therethrough. The chassis includes a recessed portion on a bottom surface for receiving a body portion of the negative electrical contact. The chassis includes a plurality of side openings or slots for receiving extensions of the positive electrical contact therethrough. The positive electrical contact includes a body, first and second walls extending from the body, and extensions extending from the first and second walls. The first wall and second walls of the positive electrical contact can be asymmetrical. The negative electrical contact includes a body, first and second walls extending from the body, and an extension extending from the first wall. The first and second walls of the negative electrical contact can be asymmetrical. In some embodiments, at least one of the cover, the base, the cap, and the chassis define an off-center, e.g., an egg-shaped, configuration. In some embodiments, the curve and/or perimeter of the off-center configuration can conform or be complementary to the asymmetric curve of a grip of a putter.

In accordance with embodiments of the present disclosure, exemplary methods of device assembly for attachment to a swinging instrument are provided. The methods include assembling positive and negative electrical contacts with a chassis. The methods include positioning a printed circuit board on the chassis to form a chassis assembly. The chassis can support the printed circuit board thereon. The methods include assembling the chassis assembly with a cap to form a cap assembly. The methods further include mating the cap assembly with a base. The base can include a fastening portion and a support portion. The support portion can support the chassis, the printed circuit board, the positive and negative electrical contacts, and the cap. In the mated configuration, the cap assembly and the base can form a battery opening configured and dimensioned to receive therethrough a battery.

The methods include detachably interlocking a cover relative to the base to cover the cap assembly. In some embodiments, the methods include positioning a retaining ring within a circumferential groove in an inner surface of the cover to detachably interlock the cover relative to the base.

Other objects and features will become apparent from the following detailed description considered in conjunction with the accompanying drawings. It is to be understood, however, that the drawings are designed as an illustration only and not as a definition of the limits of the invention.

BRIEF DESCRIPTION OF THE DRAWINGS

To assist those of skill in the art in making and using the disclosed monitoring devices and associated methods, reference is made to the accompanying figures, wherein.

DESCRIPTION OF EXEMPLARY EMBODIMENT(S)

Figure 1:
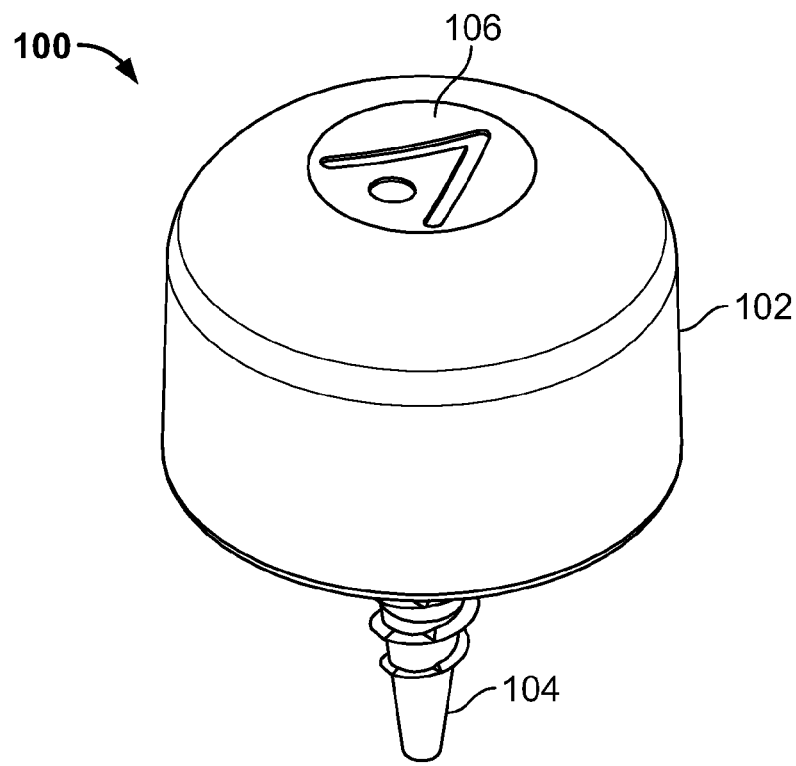
FIG. 1 is a top perspective view of an exemplary monitoring device according to the present disclosure.
Figure 2:
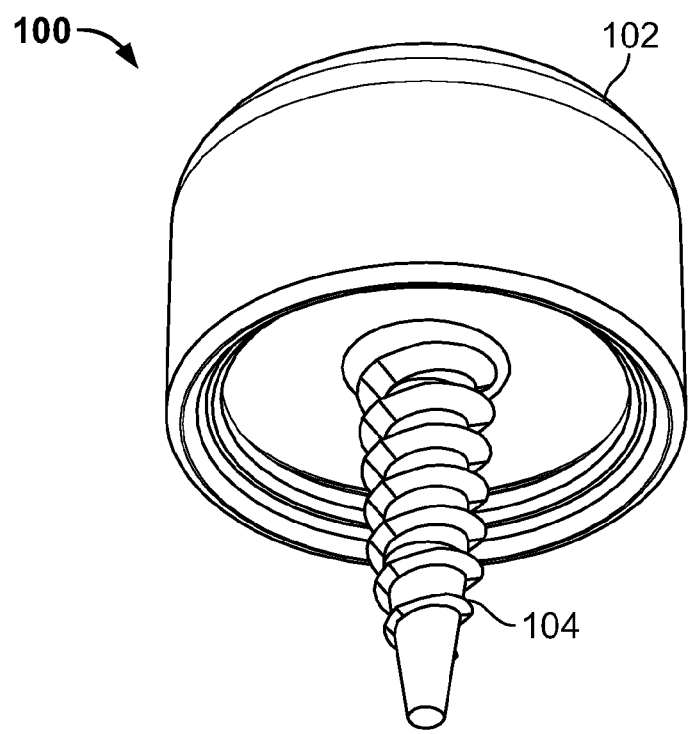
FIG. 2 is a bottom perspective view of an exemplary monitoring device according to the present disclosure.
Figure 3:
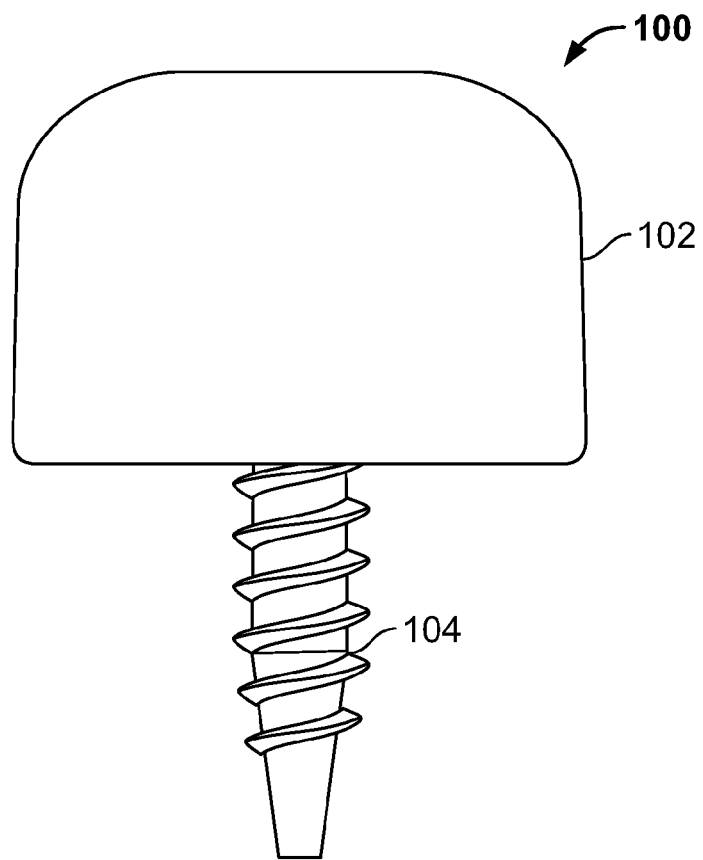
FIG. 3 is a side view of an exemplary monitoring device according to the present disclosure.
Figure 4:
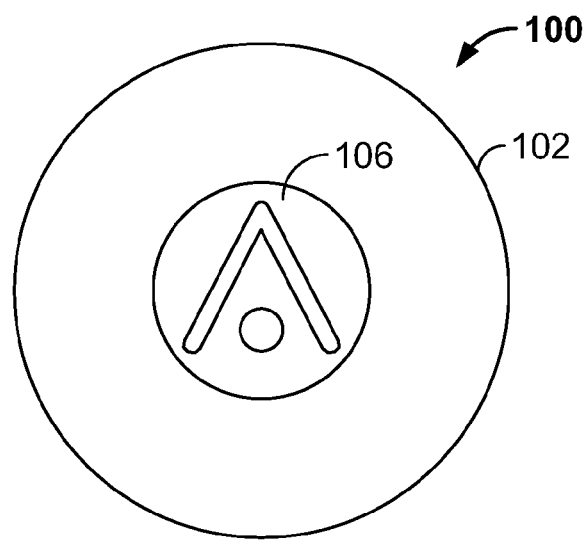
FIG. 4 is a top view of an exemplary monitoring device according to the present disclosure.

With reference to FIGS. 1-4, perspective, side and top views of an exemplary embodiment of a device for monitoring and/or tracking performance characteristics associated with user activities involving swinging instruments 100 (hereinafter "device 100") is provided. A swinging instrument can be, for example, a golf club, a bat (e.g., baseball, softball, cricket), a hockey stick (e.g., a field and/or ice hockey stick), a racquet (e.g., a tennis, squash, racquet ball, badminton, ping pong, and/or any other type of racquet), a long handled mallet (e.g., a polo, croquet, and/or any other type of mallet), and/or any other suitable instrument that may be swung by a user during a sporting activity, recreational activity, leisure activity, occupational activity, and the like.

As will be described in greater detail below, the device 100 can be configured to be secured to the instrument. The device 100 can include a sensor module with a processing device therein for detecting an impact between a swinging instrument and an object. The processing device can be programmed to determine whether an impact occurred between the object and the instrument based on, e.g., electrical signals. The sensor module can transmit swing information to an electronic device associated with the user, e.g., a mobile phone, a tablet, a laptop, and the like, which can display the swing information, process the swing information, and/or transmit the swing information to a remote system.

In exemplary embodiments, the sensor module within the device 100 can detect when a user is preparing to swing a respective instrument, can detect when the instrument is being swung, and/or can detect when the instrument strikes an object. The sensor module can use this information to compute and/or identify performance characteristics associated with the user's use of the instrument. The performance characteristics related to the swing can be transmitted, directly or indirectly, to one or more electronic devices associated with the user.

The one or more electronic devices can use the performance characteristics to monitor and/or track the user's performance and to render one or more graphical user interfaces to display the performance characteristics as well as other data maintained and/or received by the one or more electronic devices. For example, the one or more electronic devices and/or a remote system associated with the one or more electronic devices can be programmed and/or configured to receive user performance information and to process and/or analyze the performance information to determine statistics regarding the user's performance and/or provide an analysis regarding a user's mechanics (e.g., a swing analysis). Some statistics and swing analysis information that can be determined by the remote system include a swing tempo, swing velocity, swing force, club face angle, swing plane, and/or impact force with which the instrument strikes or will strike an object, and/or any other swing parameters as well as club consistency (e.g., variations in shot distances), putting statistics (e.g., average putts per hole, 2– putt percentage, 3+ putt percentage, 1 putt per round, and the like), scrambling statistics (e.g., the golfer's ability to get par when hitting the green in regulation is missed), sand saves (e.g., the ability of a golfer to get par when the ball lands in a bunker during a hole), fairway hits (e.g., percentage of times a golfer hits the fairway when the golf ball is hit from the tee), and the like.

Devices 100 can be secured to multiple instruments, e.g., multiple golf clubs. As the user plays a round of golf, the devices 100 and/or a remote system can monitor and/or track which golf clubs were used by the golfer for which holes and shots, a distance the golf ball traveled for each shot, a location of the user (e.g., with a global positioning system), holes that have been completed by the user, hole(s) that the user still has to complete, a golf score of the user, and/or other performance information associated with the round of golf being played by the user.

Still with reference to FIGS. 1-4, the device 100 includes a cover 102 which acts as a housing and surrounds an internal assembly of components, and a base 104. The cover 102 can house sensor module circuitry that can be programmed and/or configured to perform one or more operations, tasks, functions and/or processes described herein. In the embodiment illustrated in FIGS. 1-4, the cover 102 defines a substantially cylindrical configuration including chamfered corners at a top surface. The cover 102 can snap onto the base 104 to maintain the internal components in a weather-resistant and/or water-resistant manner. In some embodiments, the cover 102 can include a depressible button 106 formed on a top surface. For example, the button 106 can be formed in the cover 102 such that a user can depress the button 106 relative to the top surface of the cover 102. As will be described in greater detail below, depressing the button 106 can actuate electronic equipment within the cover 102. In some embodiments, the button 106 can include a logo formed thereon.

Figure 5:
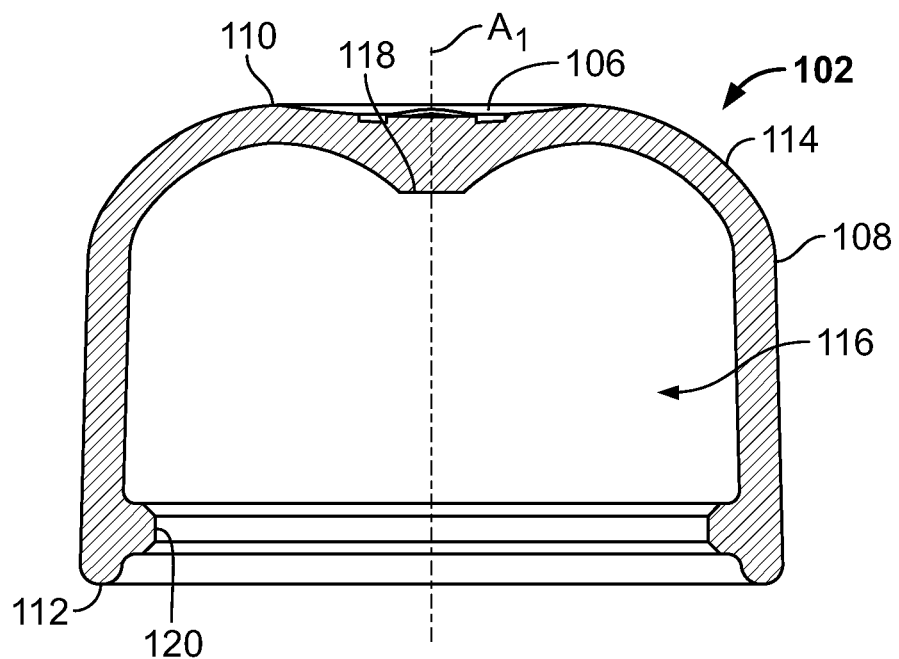
FIG. 5 is a side cross-sectional view of a cover of an exemplary monitoring device according to the present disclosure.
Figure 6:
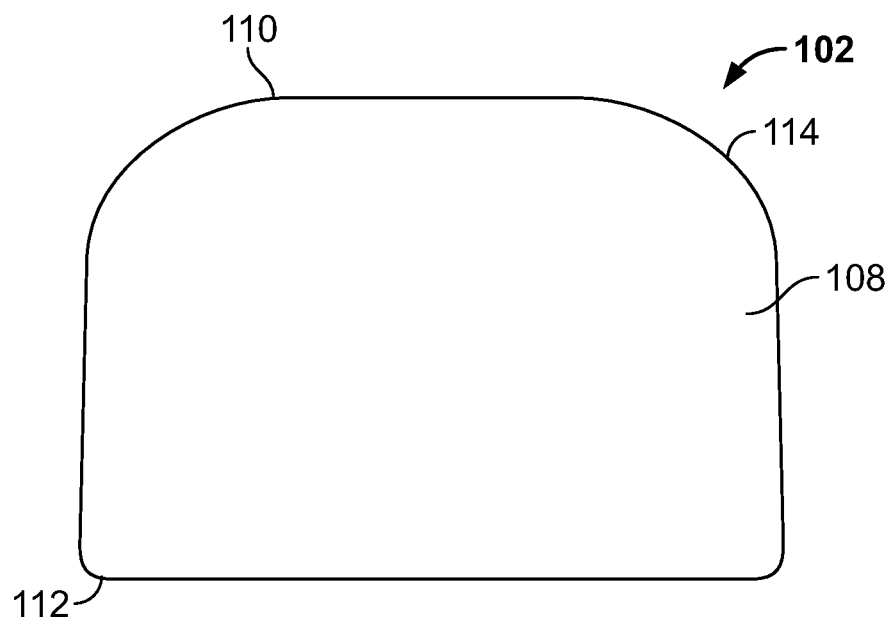
FIG. 6 is a side view of a cover of an exemplary monitoring device according to the present disclosure.
Figure 7:
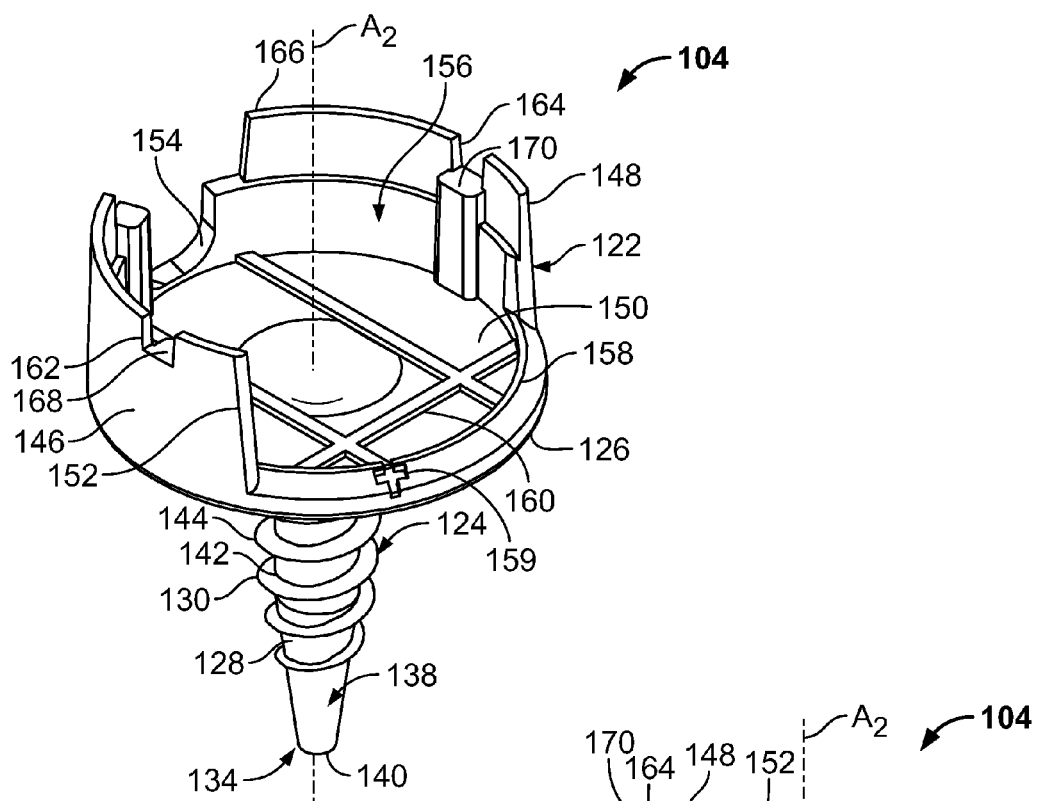
FIG. 7 is a top perspective view of a base of an exemplary monitoring device according to the present disclosure.
Figure 8:
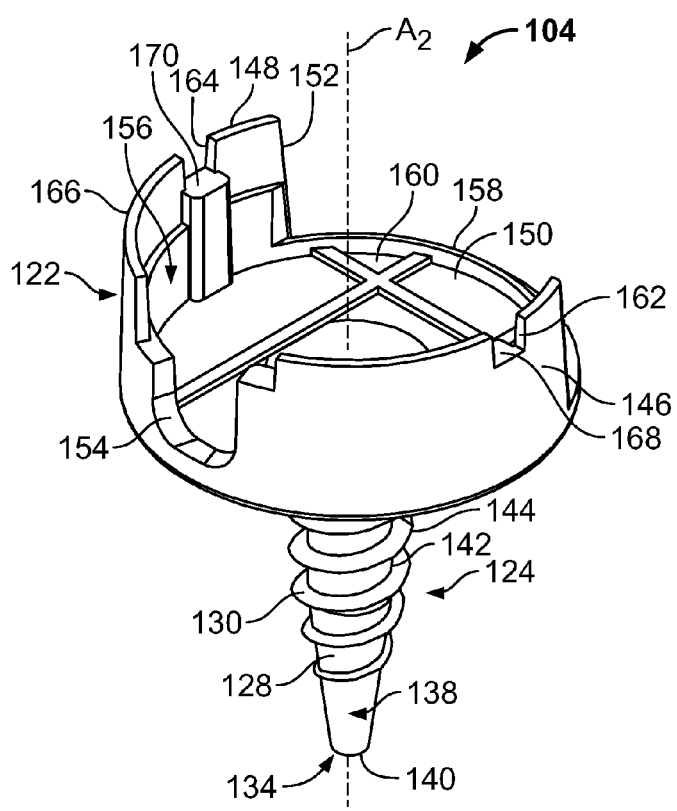
FIG. 8 is a top perspective view of a base of an exemplary monitoring device according to the present disclosure.

FIGS. 5 and 6 show cross-sectional and side views of an exemplary cover 102. An outer surface 108 of the cover 102 can define a substantially cylindrical configuration. In some embodiments, the outer surface 108 can taper slightly in an outward direction from the top surface 110 to the bottom surface 112. A diameter of the cover 102 at the top surface 110 can therefore be dimensioned smaller than a diameter of the cover 102 at the bottom surface 112. The cover 102 further includes a chamfered edge 114 around the circumference of the top surface 110.

As can be seen from the cross-sectional view of FIG. 5, the cover 102 includes a hollow interior portion 116, e.g., a cavity. The interior portion 116 can be configured and dimensioned to house therein electrical and non-electrical components of the device 100. The cover 102 includes a substantially uniform wall thickness along the majority of the cover 102, except for a central protrusion 118 and a circumferential flange 120, e.g., a circumferential lip. In particular, the central protrusion 118 extends from an inner surface of the top surface 110 of the cover 102 in the direction of the bottom surface 112 along a central vertical axis $A_1$. The central protrusion 118 can be aligned with the button 106 such that depression of the button 106 can translate the central protrusion 118 along the central vertical axis $A_1$. In some embodiments, the cover 102 can be fabricated from a flexible material, e.g., a rubber, to allow such flexibility of the top surface 110.

The circumferential flange 120 can extend or protrude from an inner surface of the cover 102 in the direction of the central vertical or longitudinal axis $A_1$ and can be positioned offset from the bottom surface 112 of the cover 102. The flange 120 extends along the entire inner circumference of the cover 102. As will be discussed in greater detail below, the flange 120 can be configured and dimensioned to snap into a complementary groove located on the base 104 such that the cover 102 can releasably interlock with the base 104 to create the secure inner environment, e.g., a water-resistant environment.

With reference to FIGS. 7-10, perspective, side and top views of an exemplary base 104 are provided. The base 104 includes a support portion 122 and a fastening portion 124 integrally formed relative to each other. The support portion 122 can define a substantially circular configuration. The fastening portion 124 can be centered relative to the support portion 122 and extends from a bottom surface 126 of the support portion 122 along a central vertical or longitudinal axis $A_2$. The fastening portion 124 can be configured to releasably affix the device 100 to an instrument, e.g., to a butt end of a grip portion of the instrument, and the like. The fastening portion 124 can include a shaft 128 having an external thread 130 that can be used to threadingly engage a complementary opening in an instrument.

Figure 9:
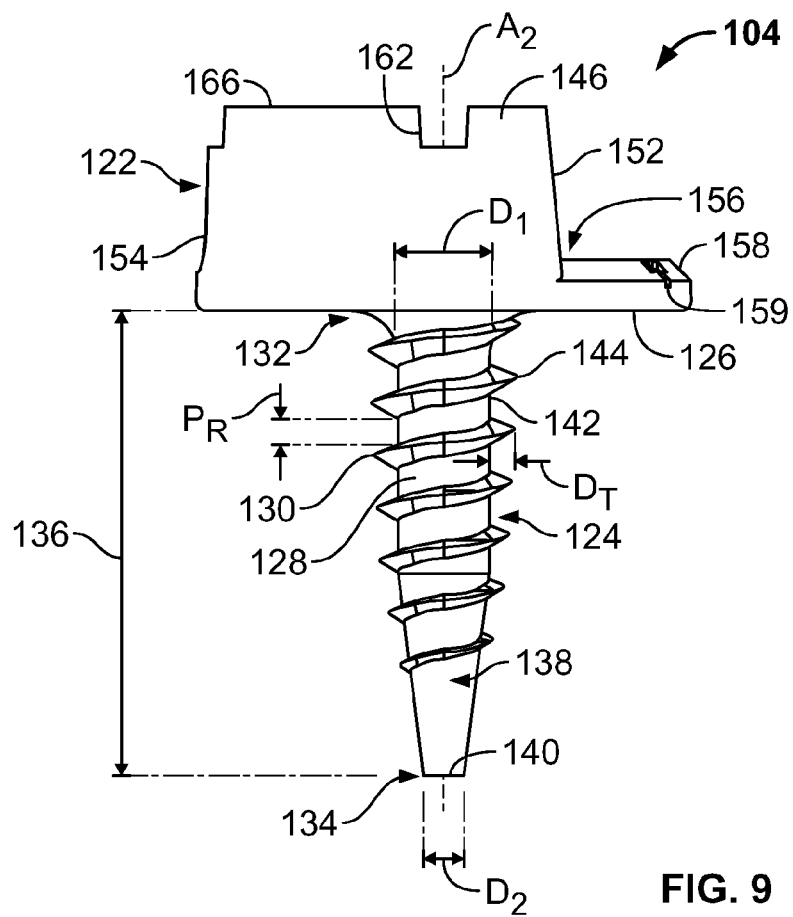
FIG. 9 is a side view of a base of an exemplary monitoring device according to the present disclosure.
Figure 10:
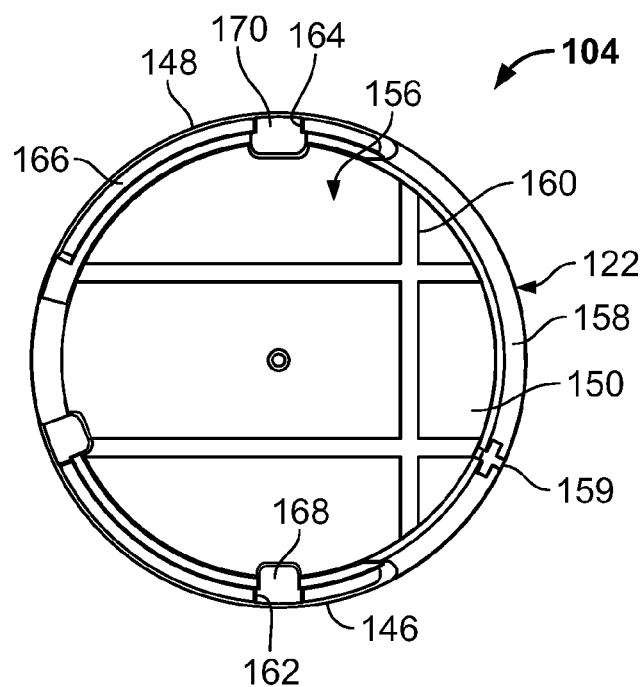
FIG. 10 is a top view of a base of an exemplary monitoring device according to the present disclosure.
Figure 11:
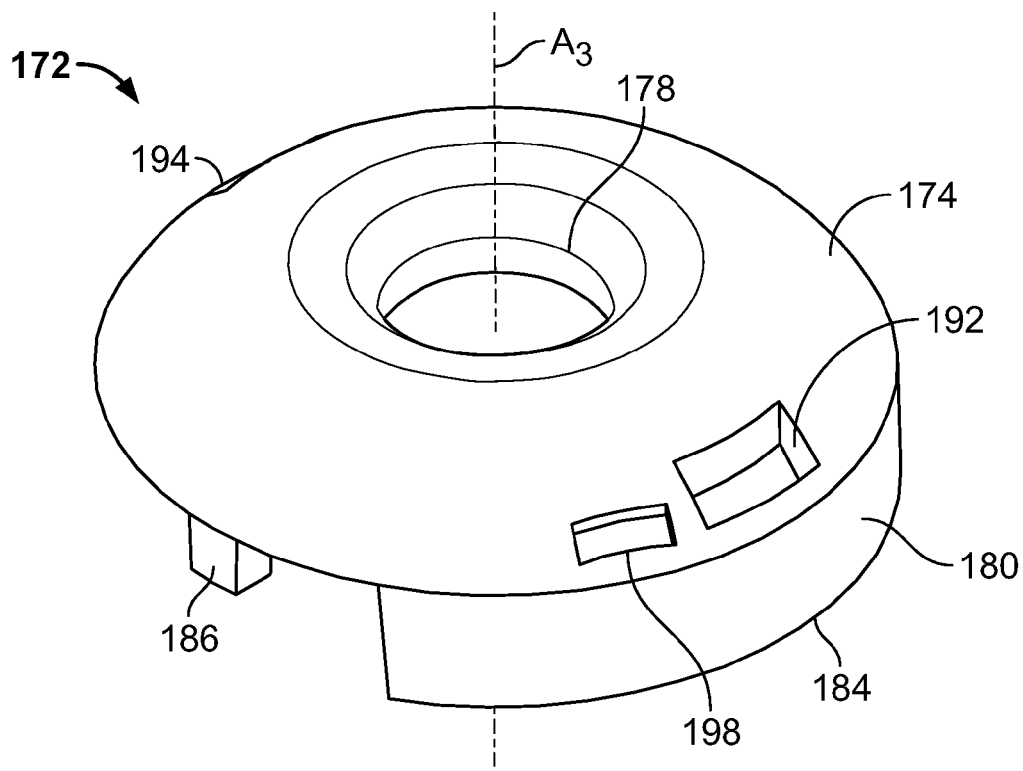
FIG. 11 is a top perspective view of a cap of an exemplary monitoring device according to the present disclosure.

As shown in FIG. 9, the shaft 128 can extend along the central vertical axis $A_2$ from a proximal end 132 at the bottom surface 126 of the support portion 122 to a distal end 134 defining a length 136 of the fastening portion 124. In some embodiments, the shaft 128 can have a length of approximately 10 mm to approximately 23 mm. The proximal end 132 can be integrally formed to the bottom surface 126 of the support portion 122. An outer surface 138 of the shaft 128 can have a diameter $D_1$ at the proximal end 132 and a diameter $D_2$ at the distal end 134 of the shaft 128. The diameters $D_1$ and $D_2$ can be measured perpendicularly to the central vertical axis $A_2$ and between opposing portions of the outer surface 138. The diameter $D_1$ is larger than the diameter $D_2$. For example, in some embodiments, the diameter $D_1$ can be 1.5 to 3 times larger than the diameter $D_2$. In some embodiments, the diameter $D_1$ can be approximately 4.5 mm and the diameter $D_2$ can be approximately 2 mm. The shaft 128 can have a generally conical configuration for which the outer surface 138 of the shaft 128 generally tapers inwardly along the central vertical axis $A_2$ from the proximal end 132 to the distal end 134. The outer surface 138 of the shaft 128 can terminate at the distal end 134 to form a flat edge 140. In some embodiments, the distal end 134 can form a rounded edge.

The external thread 130 can be disposed circumferentially about the outer surface 138 of the shaft 128 along the central vertical axis $A_2$ to form a helical or spiral ridge around the shaft 128. The external thread 130 can have a trapezoidal thread form (e.g., the thread 130 can have a trapezoidal cross-sectional shape) or a triangular thread form (e.g., the thread 130 can have a triangular cross-sectional shape) and can generally extend radially outward from the outer surface 138 of the shaft 128 from a root 142 of the thread 130 to a crest 144 of the thread 130. A thread depth $D_T$ can be measured perpendicularly to the central vertical axis $A_2$ (e.g., along a radial axis of the shaft 128) from the root 142 to the crest 144. In some embodiments, the thread depth $D_T$ can be approximately 1 mm to approximately 2 mm. In some embodiments, the diameters $D_1$ and $D_2$ and the depth $D_T$ can be dimensioned such that $(D_1+D_2)*D_T$ can equal approximately 6.5 mm. In some embodiments, the thread depth $D_T$ can be greatest at the proximal end 132 and can gradually decrease as the threads 130 progress in the direction of the distal end 134. A root pitch $P_R$ of the thread 130 can be a distance between adjacent portions of the root 142 of the thread 130 measured along the central vertical axis $A_2$. In some embodiments, the root pitch $P_R$ can be approximately 1.5 mm to approximately 2.5 mm.

The fastening portion 124 can advantageously provide pull-out resistance of greater than, e.g., approximately 10 N of force, approximately 25 N of force, and the like. The pull-out resistance can be the force required to pull the device 100 out of an end portion of the grip of a golf club or an alternative swinging instrument. The pull-out resistance of the fastening portion 124 can be determined based on the diameters $D_1$ and $D_2$ of the fastening portion 124, the root pitch $P_R$ of the fastening portion 124 and/or the thread depth $D_T$ of the fastening portion 124. As one example, the fastening portion 124 can advantageously deform the rubber grip of a golf club to radially pre-stress the rubber grip to increase the density of the rubber at the bottom of the thread 130 such that the rubber at the bottom of the thread 130 is less likely to be prone to deformation induced by axial compression force, thereby increasing the radial resistance. In some embodiments, the diameter of the end of the grip of a golf club can be between approximately 20 mm to approximately 30 mm. In some embodiments, the diameter $D_1$ of the fastening portion 124 can be approximately 4.5 mm. In some embodiments, the diameter $D_2$ of the fastening portion 124 can be approximately 2 mm. As another example, a root pitch $P_R$ of approximately 1.5 mm to approximately 2.5 mm can be used to advantageously improve the resistance of the rubber grip at the root 142 of the thread 130 such that the rubber grip resists deformation. As yet another example, a thread depth $D_T$ of approximately 1.5 mm to approximately 2 mm can be used to advantageously increase the force required to deform the rubber grip beyond the crest 144 of the thread 130 on the fastening device 124.

The support portion 122 of the base 104 includes a first wall 146 and a second wall 148 circumferentially extending from a support surface 150 in a direction parallel to the central vertical axis $A_2$. The first and second walls 146, 148 can be positioned at opposing sides of the support surface 150 and can form a first side opening 152 and a second side opening 154 located between the first and second walls 146, 148. The circumferential distance of the first side opening 152 between the first and second walls 146, 148 can be dimensioned greater than the circumferential distance of the second side opening 154. In some embodiments, the second side opening 154 can define a U-shaped configuration. In particular, the support surface 150 and the first and second walls 146, 148 can define an interior space 156 configured and dimensioned to house internal components, e.g., a battery, electrical contacts, a printed circuit board, support structures, and the like, which will be discussed in greater detail below. The interior space 156 can be fully enclosed at the support surface 150, partially enclosed along the side surfaces and fully open at the top surface. The circumferential distance of the first side opening 152 can be dimensioned to permit a battery, e.g., a button or coil cell battery, to be slid into the interior space 156 through the first side opening 152 without interference from the first and second walls 146, 148. The circumferential distance of the second side opening 154 can be dimensioned to permit insertion of a narrow instrument or device, e.g., a golf peg, a screwdriver, a key, and the like, through the second side opening 154 to push the battery out of the interior space 156 through the first side opening 152.

In some embodiments, the base 104 can include a circumferential lip 158 between the first and second walls 146, 148 extending from the support surface 150 in a direction parallel to the central vertical axis $A_2$. The lip 158 can be dimensioned to assist in retaining internal components within the interior space 156 of the support portion 122. In some embodiments, the lip 158 can include a positive mark 159, e.g., a "+", formed thereon to provide a user with a label for the proper orientation of the battery during insertion of the battery into the device 100. In some embodiments, the support surface 150 can include one or more horizontal inner ribs 160 extending and/or crossing relative to each other between the first and second walls 146, 148 and the lip 158. The inner ribs 160 can extend in directions perpendicular to the central vertical axis $A_2$. The inner ribs 160 can provide additional strength or rigidity to the structure of the base 104. For example, the inner ribs 160 can increase the amount of torque which can be applied to the base 104 for attachment of the fastening portion 124 to an instrument.

Each of the first and second walls 146, 148 can include a slot 162, 164 extending a partial distance from the top surface 166 in the direction of the support surface 150 in a direction parallel to the central vertical axis $A_2$. Each of the first and second walls 146, 148 can further include an interior vertical rib 168, 170 aligned with and positioned below the slots 162, 164. The slots 162, 164 and the vertical ribs 168, 170 can provide a space configured and dimensioned to receive complementary extensions from a cap (which will be discussed below) such that the base 104 and the cap can interlock to maintain the internal components therein.

With reference to FIGS. 11-15, perspective, top, bottom and side views of an exemplary cap 172 are provided. The cap 172 defines a circular configuration and can be configured and dimensioned to interlock or mate with the support portion 122 of the base 104. The cap 172 includes an outer surface 174, e.g., a top surface, and an interior surface 176. Although the outer surface 174 is illustrated as curved, in some embodiments, the outer surface 174 can be planar. The cap 172 includes an opening 178, e.g., a circular opening, extending through the cap 172 along a central vertical axis $A_3$. In an assembled configuration, the central protrusion 118 of the cover 102 (see, e.g., FIG. 5) can be positioned immediately above the cap 172 such that depression of the button 106 translates the central protrusion 118 at least partially into the opening 178 along the central vertical axis $A_3$.

The cap 172 includes a first wall 180 and a second wall 182 circumferentially extending from the interior surface 176 along a portion of the circumference of the cap 172 in a direction parallel to the central vertical axis $A_3$. In particular, the first and second walls 180, 182 can extend from the interior surface 176 to a bottom surface 184 of the cap 172. The first and second walls 180, 182 can be positioned on opposing sides of the cap 172. The circumferential distance of the first wall 180 can be dimensioned greater than the circumferential distance of the second wall 182. In particular, the circumferential distance of the first wall 180 can be dimensioned complementary to the first side opening 152 of the support portion 122 of the base 104, and the circumferential distance of the second wall 182 can be dimensioned complementary to the second side opening 154 of the support portion 122 of the base 104. The cap 172 further includes first, second and third protrusions 186, 188, 190 extending from the interior surface 176 in a direction parallel to the central vertical axis $A_3$. The first, second and third protrusions 186, 188, 190 can extend a partial distance between the interior surface 176 and the bottom surface 184 of the cap 172, e.g., approximately half of the distance of the first and second walls 180, 182. The first and second protrusions 186, 188 can be positioned on opposing sides of the cap 172 and the third protrusion 190 can be radially offset from the first protrusion 186. In particular, the third protrusion 190 can be positioned closer to the first protrusion 186 along a radial distance between the first and second protrusions 186, 188.

The first and second walls 180, 182, and the first, second and third protrusions 186, 188, 190 can thereby form first, second, third and fourth side openings 185, 187, 189, 191. In particular, the first side opening 185 can be formed between the first wall 180 and the first protrusion 186, the second side opening 187 can be formed between the first protrusion 186 and the third protrusion 190, the third side opening 189 can be formed between the second wall 182 and the second protrusion 188, and the fourth side opening 191 can be formed between the second protrusion 188 and the first wall 180.

In some embodiments, the cap 172 can include first and second slots 192, 194 extending through the cap 172 in a direction parallel to the central vertical axis $A_3$. The position of first and second slots 192, 194 can be aligned with the first and second walls 180, 182 such that the first and second slots 192, 194 pass into the interior space 196 of the cap 172 adjacent to the interior surface 176. In some embodiments, the cap 172 can include a third slot 198 positioned adjacent to and radially offset from the first slot 192. In some embodiments, the third slot 198 can act as a negative mark, e.g., a "−", which provides a user with a label for the proper orientation of the battery during insertion of the battery into the device 100. For example, the third slot 198 can correspond to the positive mark 159 on the base 104 such that a user can properly orient the positive and negative sides of the battery prior to insertion of the battery into the device 100. In some embodiments, the second wall 182 can include a latch 200, e.g., an undercut snap, extending perpendicularly from the second wall 182 in the direction of the central vertical axis $A_3$. The latch 200 can assist in retaining at least one of the internal components, e.g., a chassis, to be positioned within the interior space 196. In some embodiments, the first wall 180 can include a complementary and opposing latch 200 extending therefrom in the direction of the central vertical axis $A_3$ to further assist in retaining at least one of the internal components to be positioned within the interior space 196. In some embodiments, the first and second slots 192, 194 can be used during fabrication of the cap 172 to allow an injection-molding tool to pass through the cap 172 and form the latches 200.

Figure 12:
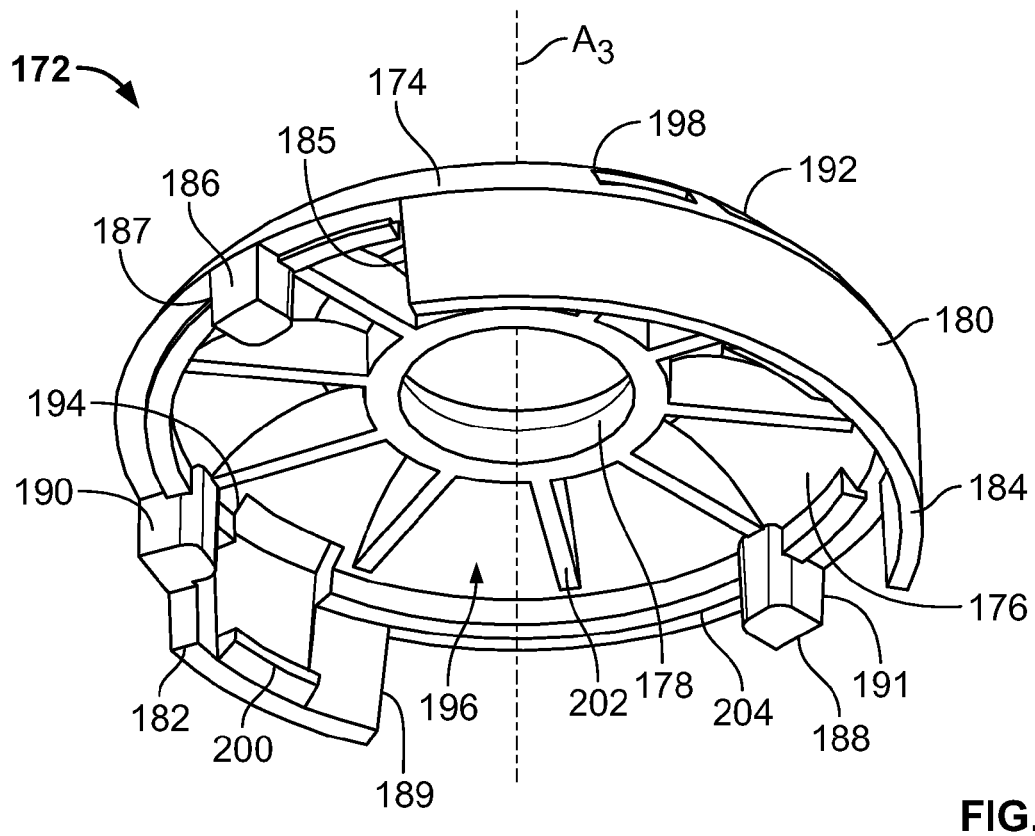
FIG. 12 is a bottom perspective view of a cap of an exemplary monitoring device according to the present disclosure.
Figure 13:
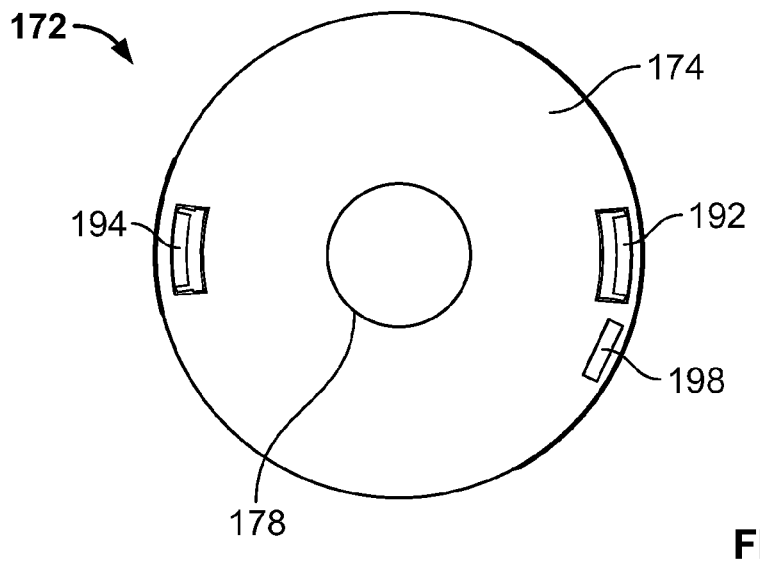
FIG. 13 is a top view of a cap of an exemplary monitoring device according to the present disclosure.
Figure 14:
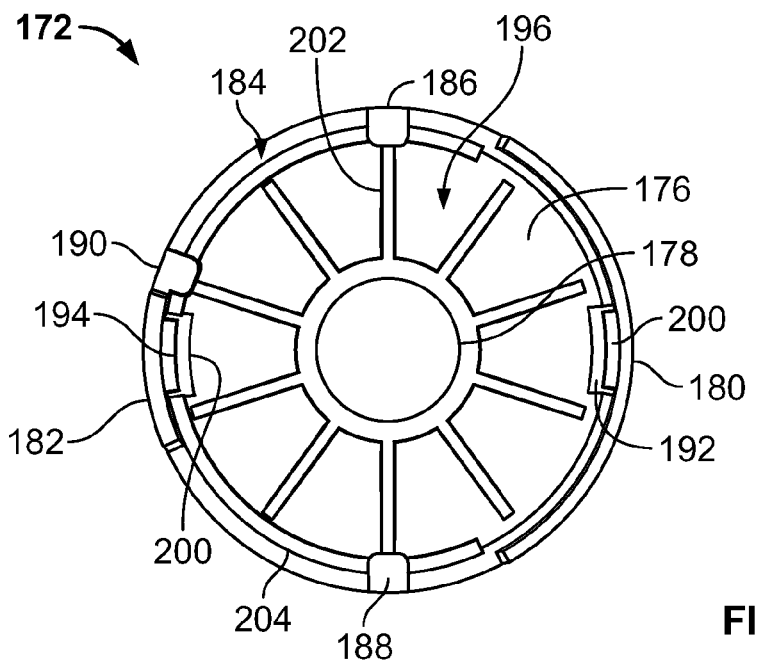
FIG. 14 is a bottom view of a cap of an exemplary monitoring device according to the present disclosure.
Figure 15:
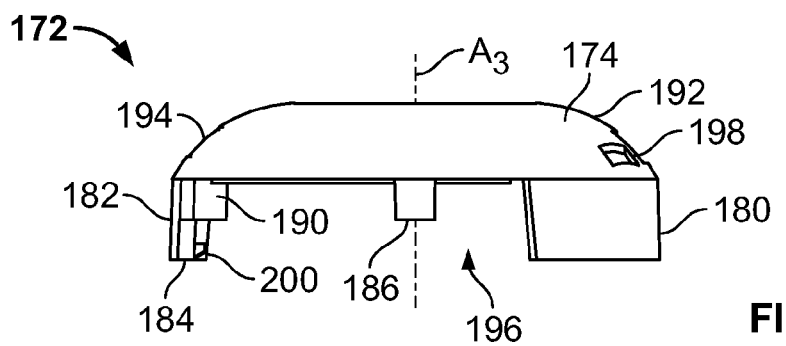
FIG. 15 is a side view of a cap of an exemplary monitoring device according to the present disclosure.
Figure 16:
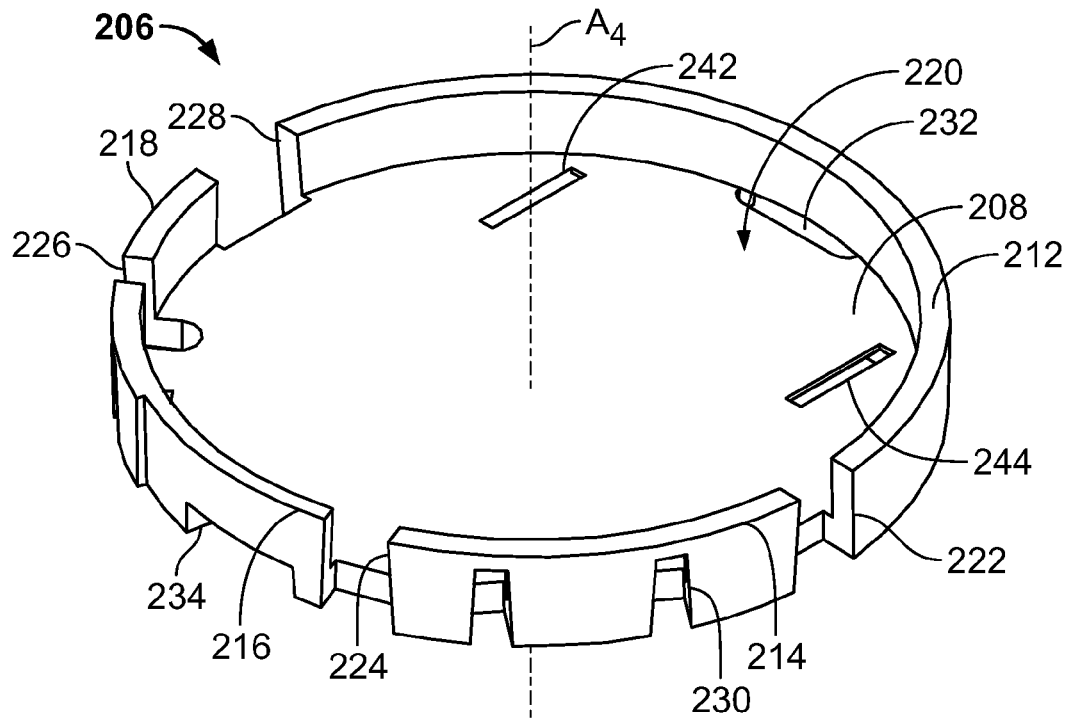
FIG. 16 is a top perspective view of a chassis of an exemplary monitoring device according to the present disclosure.
Figure 17:
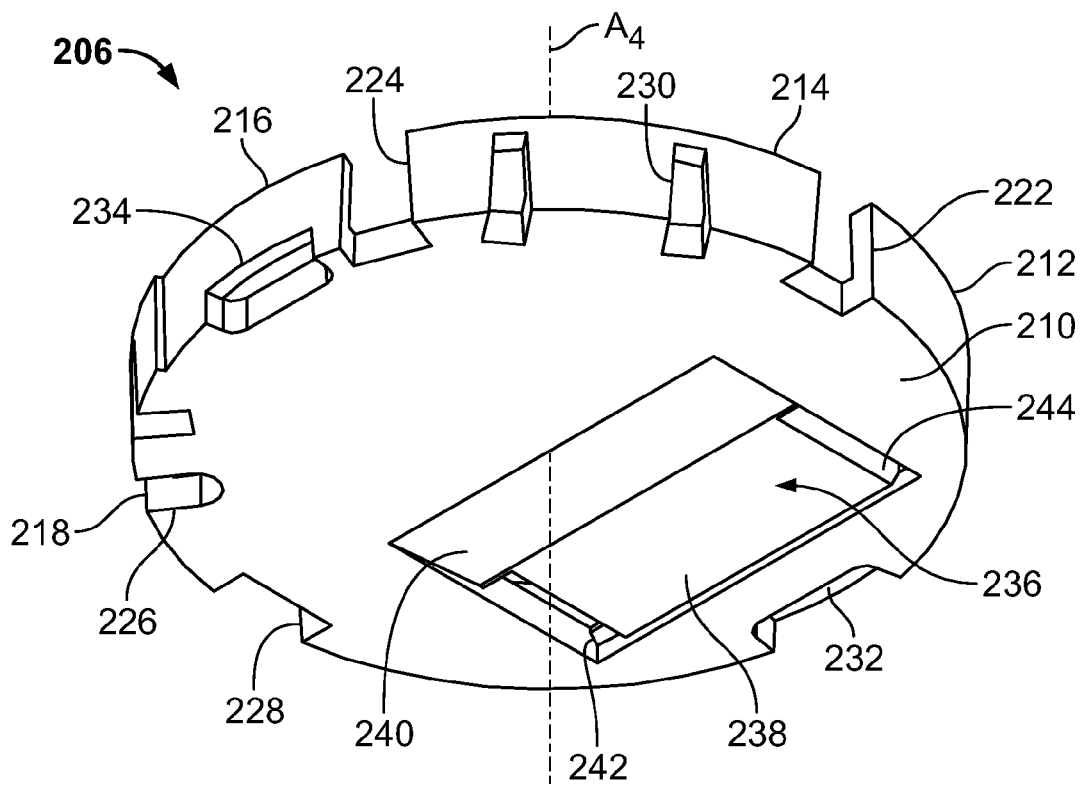
FIG. 17 is a bottom perspective view of a chassis of an exemplary monitoring device according to the present disclosure.
Figure 18:
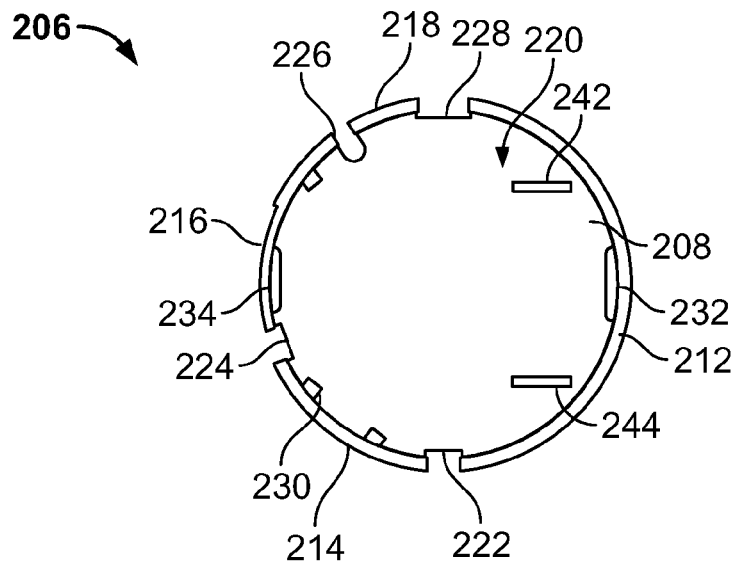
FIG. 18 is a top view of a chassis of an exemplary monitoring device according to the present disclosure.
Figure 19:
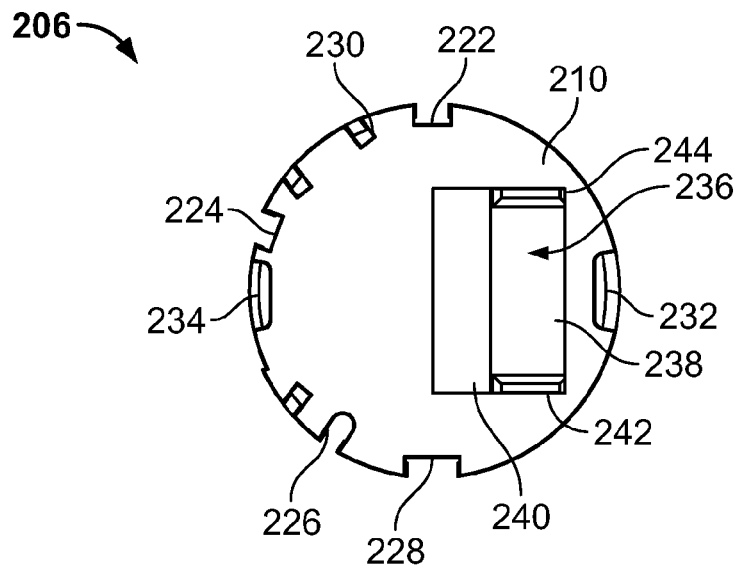
FIG. 19 is a bottom view of a chassis of an exemplary monitoring device according to the present disclosure.
Figure 20:
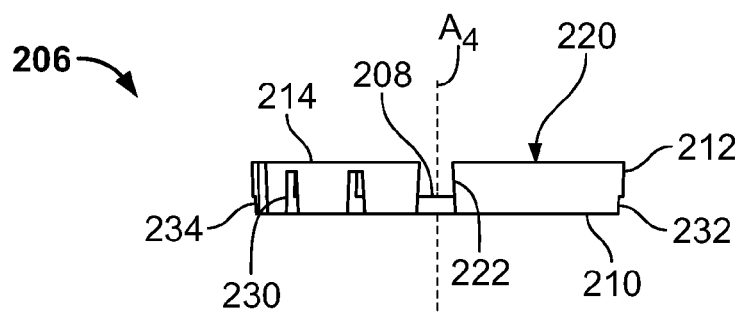
FIG. 20 is a side view of a chassis of an exemplary monitoring device according to the present disclosure.

In some embodiments, the cap 172 can include interior ribs 202 extending from the interior surface 176. For example, as illustrated in FIGS. 12 and 14, the ribs 202 can extend radially outward from the opening 178 at least partially in the direction of the first and second walls 180, 182, the first, second and third protrusions 186, 188, 190, and/or a circumferential lip 204 circumferentially extending from the interior surface 176 between the first and second walls 180, 182 and the first, second and third protrusions 186, 188, 190. In some embodiments, the circumferential lip 204 can be offset from the outer surface 174 of the cap 172 to permit mating with the support portion 122 of the base 104.

In particular, the first and second walls 180, 182, the first, second and third protrusions 186, 188, 190, the first, second, third, and fourth side openings 185, 187, 189, 191, and the circumferential lip 204 can be configured and dimensioned to mate relative to the complementary first and second walls 146, 148, the first and second slots 162, 164, and the first and second side opening 152, 154 of the support portion 122 of the base 104. Thus, the radial positioning of the walls, protrusions, openings and/or lips of the base 104 and the cap 172 can be determined to permit mating between the base 104 and the cap 172. For example, the cap 172 can be mated to the base 104 by aligning and inserting the first protrusion 186 into the first slot 162, the third protrusion 190 and the second wall 182 into the second side opening 154, the second protrusion 188 into the second slot 164, and the first wall 180 into the first side opening 152 (see, e.g., FIGS. 50-52). In an assembled configuration, the circumferential lip 204 of the cap 172 can be positioned against an inside portion of the first and second walls 146, 148 of the base 104 to prevent movement of the cap 172 relative to the base 104. Mating of the cap 172 relative to the base 104 can maintain a portion of the first and second side openings 152, 154 exposed to allow insertion of the batter through the first side opening 152 and insertion of an instrument or device through the second side opening 154 to remove the battery.

With reference to FIGS. 16-20, perspective, top, bottom and side views of an exemplary chassis 206 are provided. The chassis 206 can be configured and dimensioned to retain and/or support a printed circuit board therein. The chassis 206 defines a substantially circular configuration and includes a top surface 208 and a bottom surface 210. The chassis 206 includes first, second, third and fourth walls 212, 214, 216, 218 extending circumferentially from the top surface 208 in a direction parallel to the central vertical axis $A_4$. The first, second, third and fourth walls 212, 214, 216, 218 can form an interior space 220 therebetween for housing and/or supporting a printed circuit board. The circumferential distance of the first wall 212 can be dimensioned greater than the circumferential distance of the second, third and fourth walls 214, 216, 218. In some embodiments, the circumferential distance of the second and third walls 214, 216 can be dimensioned substantially similarly. In some embodiments, the circumferential distance of the second wall 214 can be dimensioned greater than the circumferential distance of the third wall 216. The circumferential distance of the second and third walls 214, 216 can be dimensioned greater than the circumferential distance of the fourth wall 218.

The first, second, third and fourth walls 212, 214, 216, 218 can form first, second, third and fourth side openings 222, 224, 226, 228 therebetween. In particular, the first side opening 222 can be formed between the first and second walls 212, 214, the second side opening 224 can be formed between the second and third walls 214, 216, the third side opening 226 can be formed between the third and fourth walls 216, 218, and the fourth side opening 228 can be formed between the first and fourth walls 212, 218. In some embodiments, the chassis 206 can include one or more slots 230 in the second and third walls 214, 216. As will be discussed in greater detail below, the slots 230 can receive extensions from a positive electrical contact. In some embodiments, the slots 230 can provide a passage for air circulation and/or heat dissipation from the printed circuit board positioned in the interior space 220. Thus, the slots 230 can allow cool air to pass therethrough to cool the printed circuit board and/or can allow heat to escape from the printed circuit board through the slots 230 to prevent overheating of the printed circuit board during use of the device 100.

It should be understood that the first, second, third and fourth walls 212, 214, 216, 218 and the first, second, third and fourth side openings 222, 224, 226, 228 can be radially positioned such that the chassis 206 can mate and/or releasably interlock relative to the cap 172. In particular, after a printed circuit board has been positioned or fitted into the interior space 220, the chassis 206 can be fitted into the interior space 196 of the cap 172. For example, the cap 172 and the chassis 206 can be mated by aligning and inserting the first protrusion 186 into the first side opening 222, the second protrusion 188 into the fourth side opening 228, and the third protrusion 190 into the second side opening 224. In some embodiments, the chassis 206 can include first and second slots 232, 234 formed on the bottom surface 210 and aligned with the first and third walls 212, 216. In particular, the first and second slots 232, 234 can pass through the chassis 206 and can be configured and dimensioned to receive therein the latches 200 of the cap 172. For example, when the chassis 206 is inserted into the interior space 196 of the cap 172, the latches 200 can snap into the respective first and second slots 232, 234 to detachably secure the chassis 206 relative to the cap 172. In particular, inserting the chassis 206 into the interior space 196 of the cap 172 can initially cause the first and second walls 180, 182 to partially bend outward away from the central vertical axis $A_3$ until the chassis 206 has been fully positioned within the interior space 196. Once the chassis 206 has been fully positioned within the interior space 196, the first and second walls 180, 182 can spring back in the direction of the central vertical axis $A_3$, thereby positioning the latches 200 in the first and second slots 232, 234.

The bottom surface 210 of the chassis 206 can include a rectangular recess 236 formed therein. As will be described in greater detail below, the recess 236 can be configured and dimensioned to mate with a negative electrical contact. The recess 236 can be formed between the first and fourth side openings 222, 228, and between the central vertical axis $A_4$ and the first slot 232. Thus, the recess 236 can be offset from the center of the chassis 206 and can be positioned closer to the first slot 232 than the second slot 234. The recess 236 can include a deep recess 238 and an angled recess 240. As can be seen from FIGS. 17 and 19, the angled recess 240 can expend a partial distance from the central vertical axis $A_4$ in the direction of the first slot 232 and can gradually progress to the depth of the deep recess 238. The deep recess 238 can define a substantially uniform depth. The deep recess 238 further includes first and second electrical slots 242, 244 on opposing ends of the deep recess 238 which pass through the chassis 206. As will be described below, extensions of a negative electrical contact can be passed through the first and second electrical slots 242, 244 such that at least a portion of the extensions passes through the chassis 206 and out of the first and second electrical slots 242, 244 on the top surface 208. The extensions of the negative electrical contact can further be electrically coupled to the printed circuit board positioned within the interior space 220 of the chassis 206. The deep recess 238 can be configured and dimensioned to receive at least a portion of the negative electrical contact.

Figure 21:
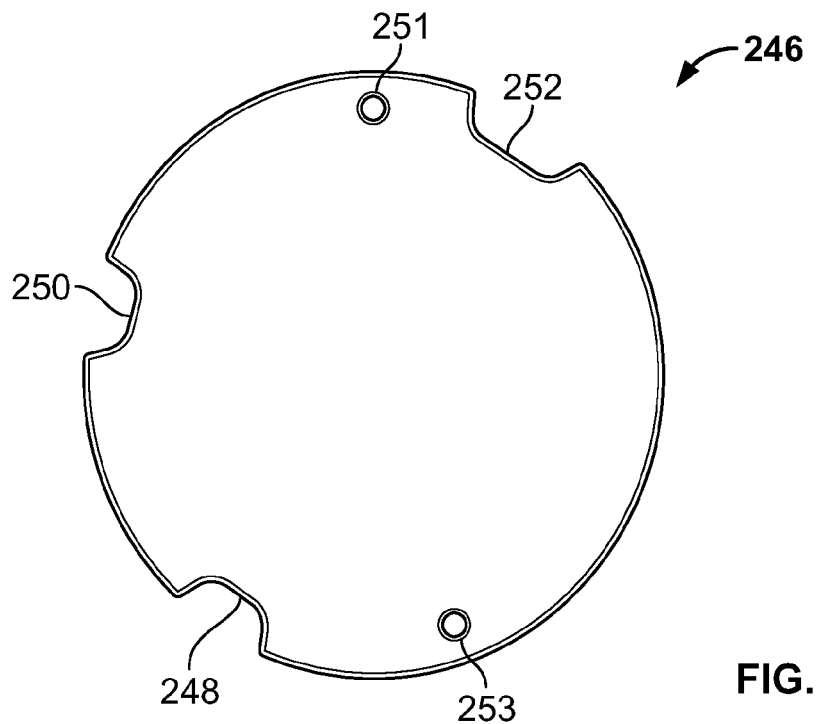
FIG. 21 is a top view of a printed circuit board of an exemplary monitoring device according to the present disclosure.
Figure 22:
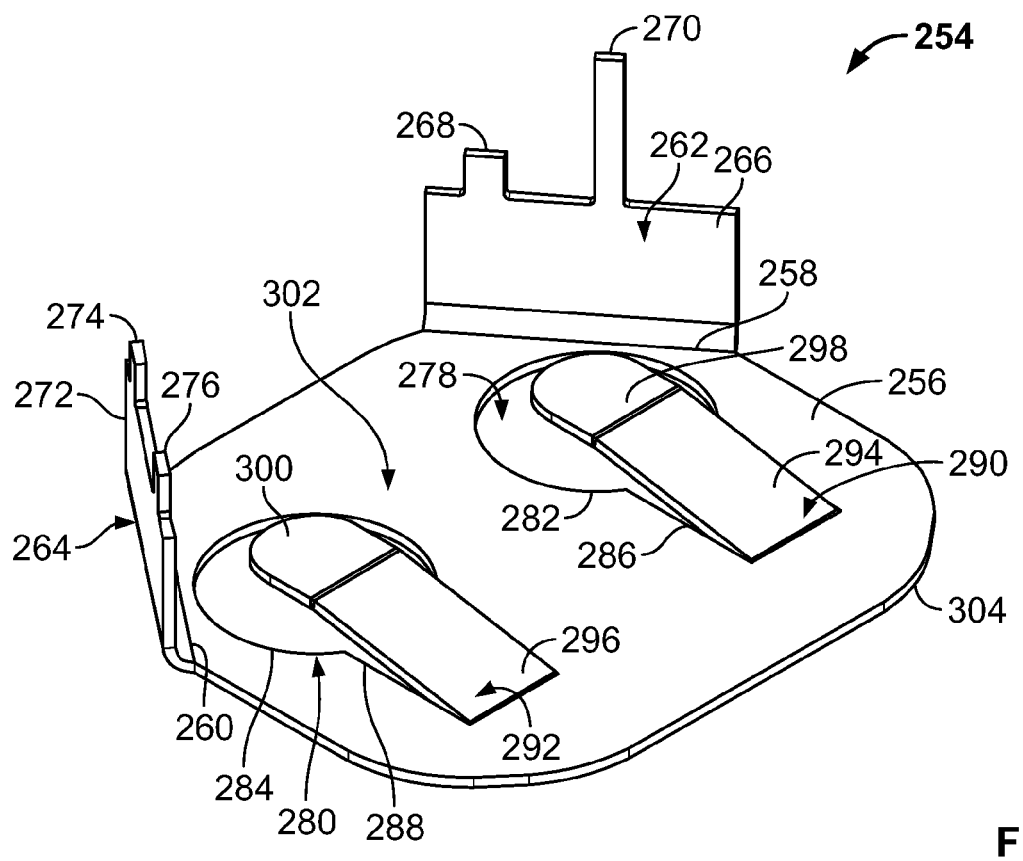
FIG. 22 is a top perspective view of a positive electrical contact of an exemplary monitoring device according to the present disclosure.
Figure 23:
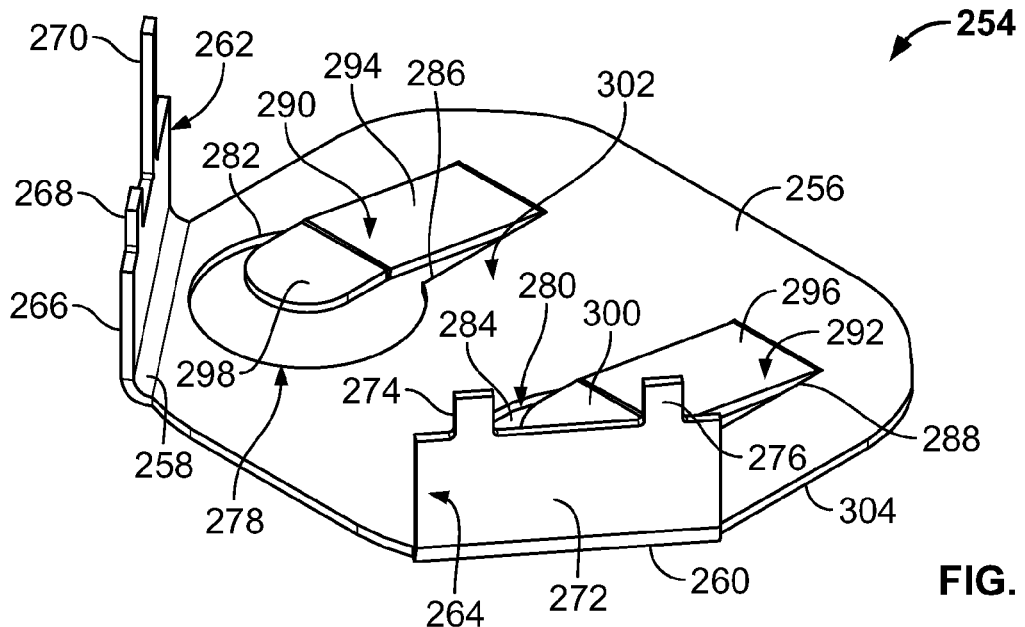
FIG. 23 is a top perspective view of a positive electrical contact of an exemplary monitoring device according to the present disclosure.
Figure 24:
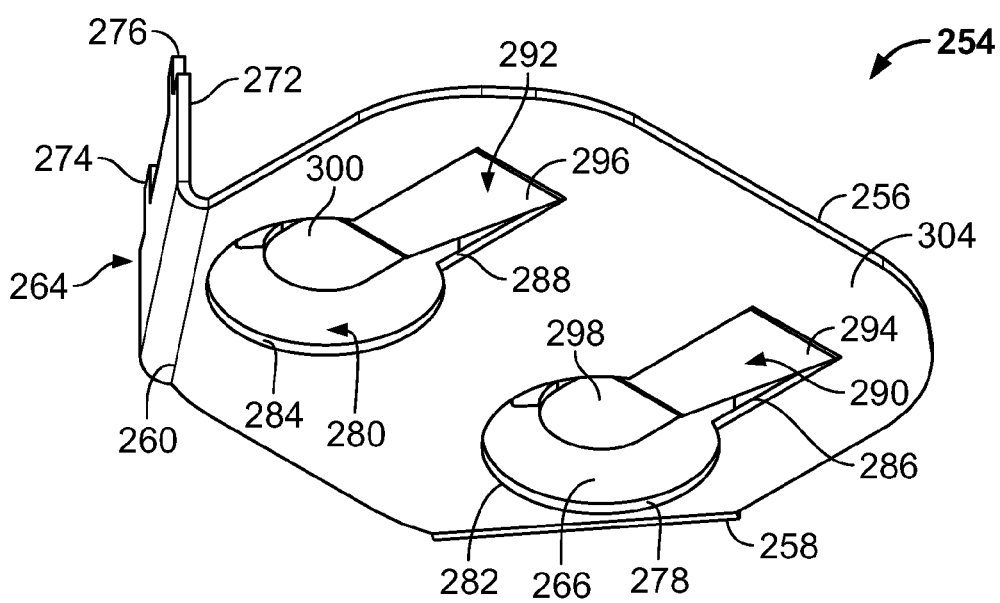
FIG. 24 is a bottom perspective of a positive electrical contact of an exemplary monitoring device according to the present disclosure.
Figure 25:
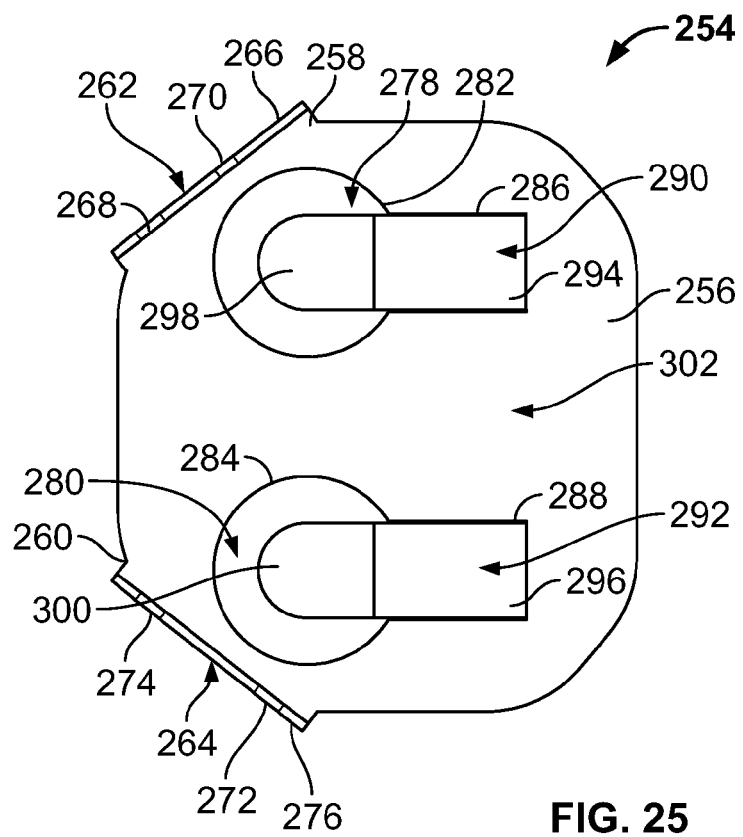
FIG. 25 is a top view of a positive electrical contact of an exemplary monitoring device according to the present disclosure.
Figure 26:
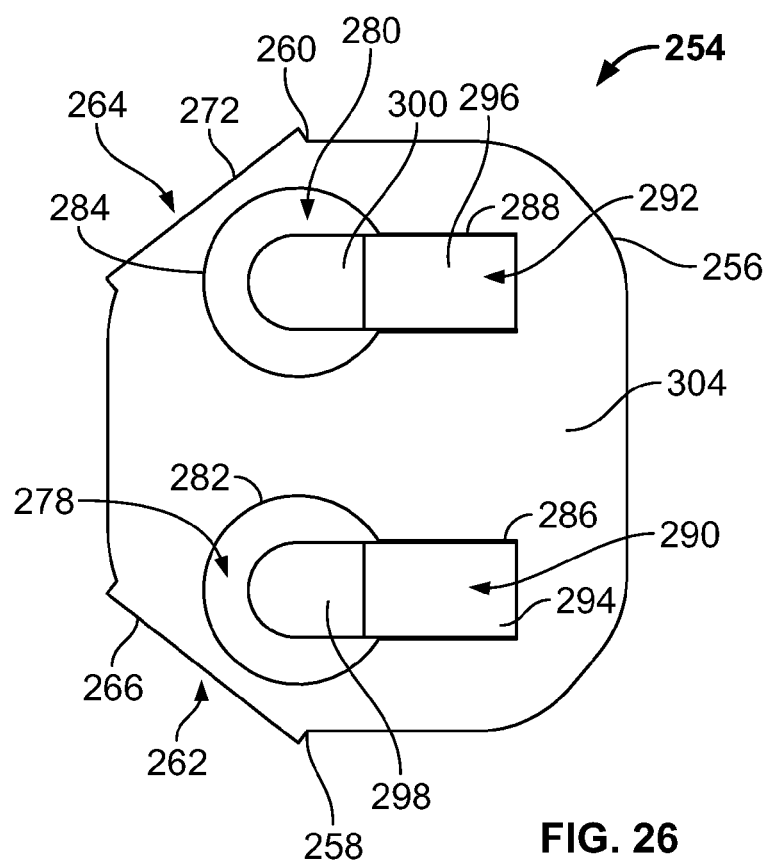
FIG. 26 is a bottom view of a positive electrical contact of an exemplary monitoring device according to the present disclosure.
Figure 27:
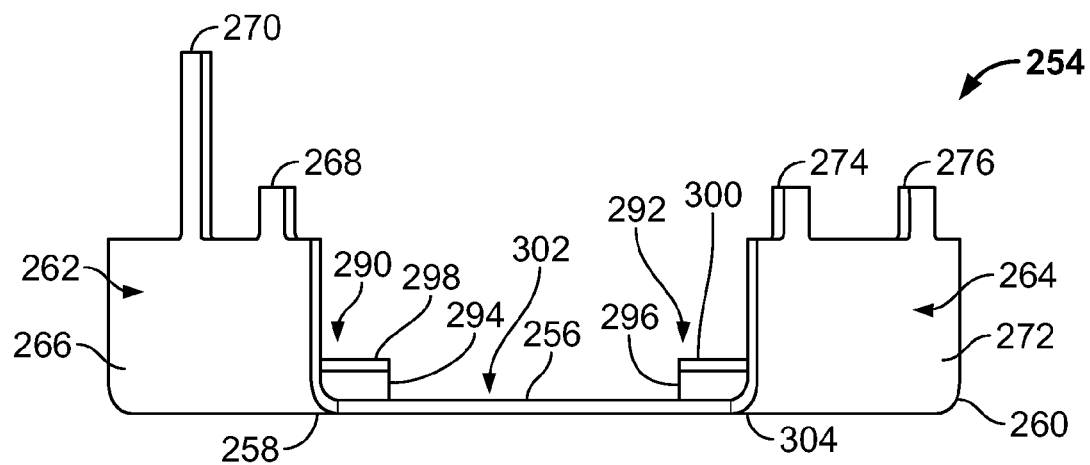
FIG. 27 is a rear view of a positive electrical contact of an exemplary monitoring device according to the present disclosure.
Figure 28:
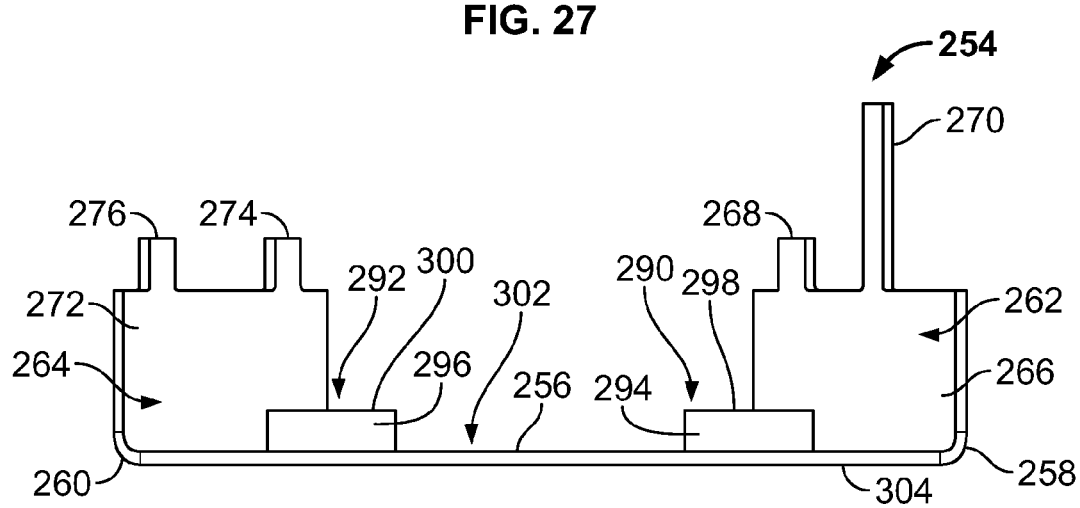
FIG. 28 is a front view of a positive electrical contact of an exemplary monitoring device according to the present disclosure.
Figure 29:
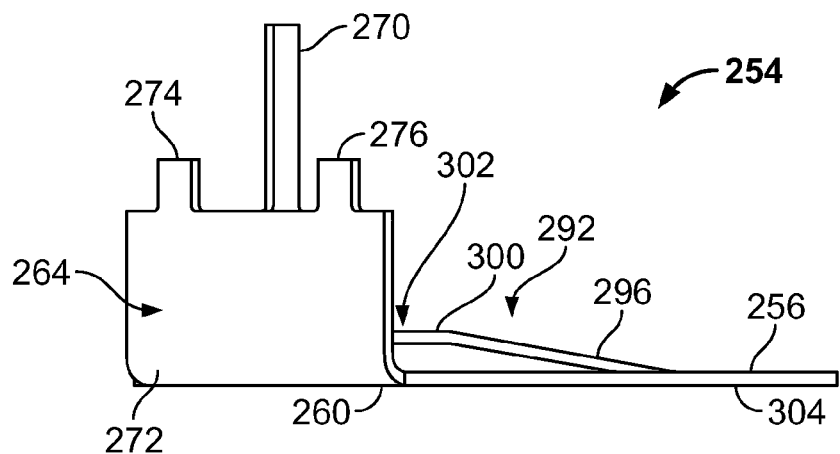
FIG. 29 is a side view of a positive electrical contact of an exemplary monitoring device according to the present disclosure.
Figure 30:
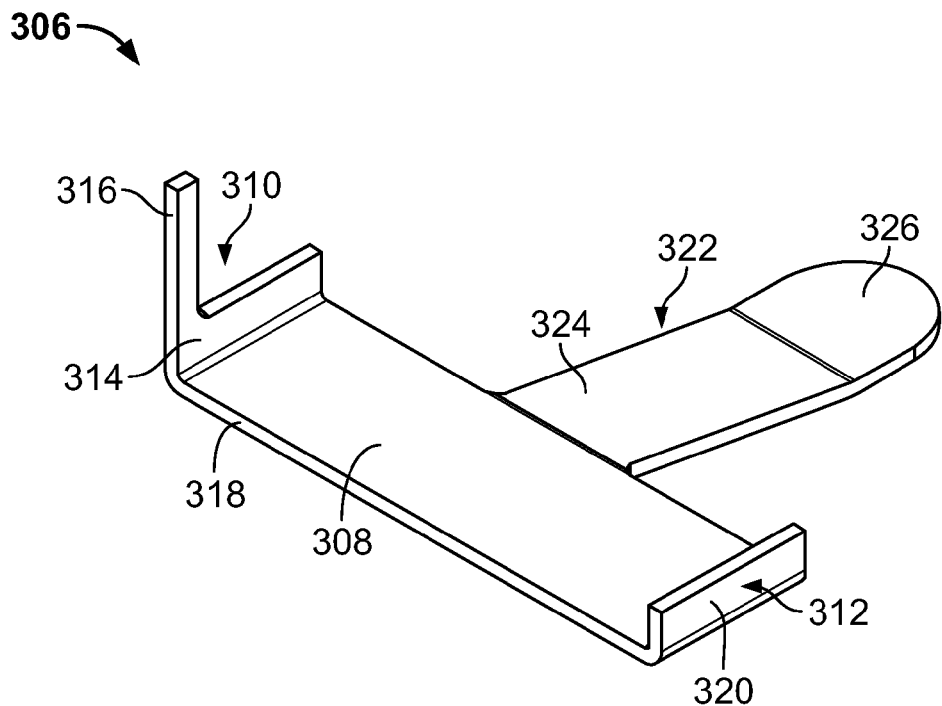
FIG. 30 is a top perspective view of a negative electrical contact of an exemplary monitoring device according to the present disclosure.
Figure 31:
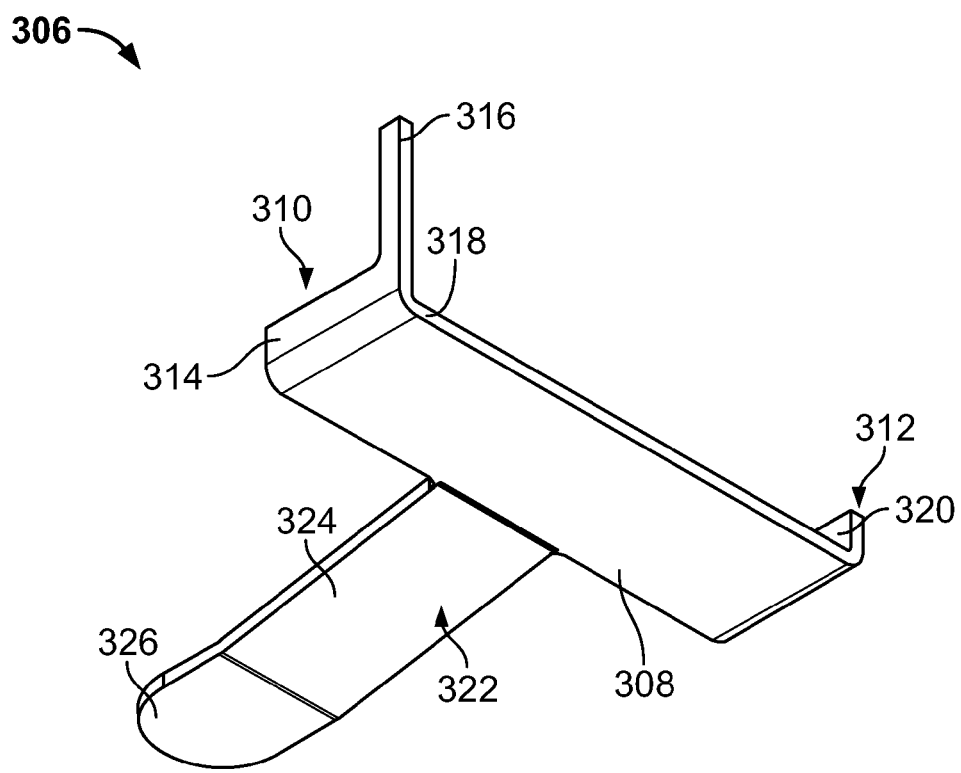
FIG. 31 is a bottom perspective view of a negative electrical contact of an exemplary monitoring device according to the present disclosure.
Figure 32:
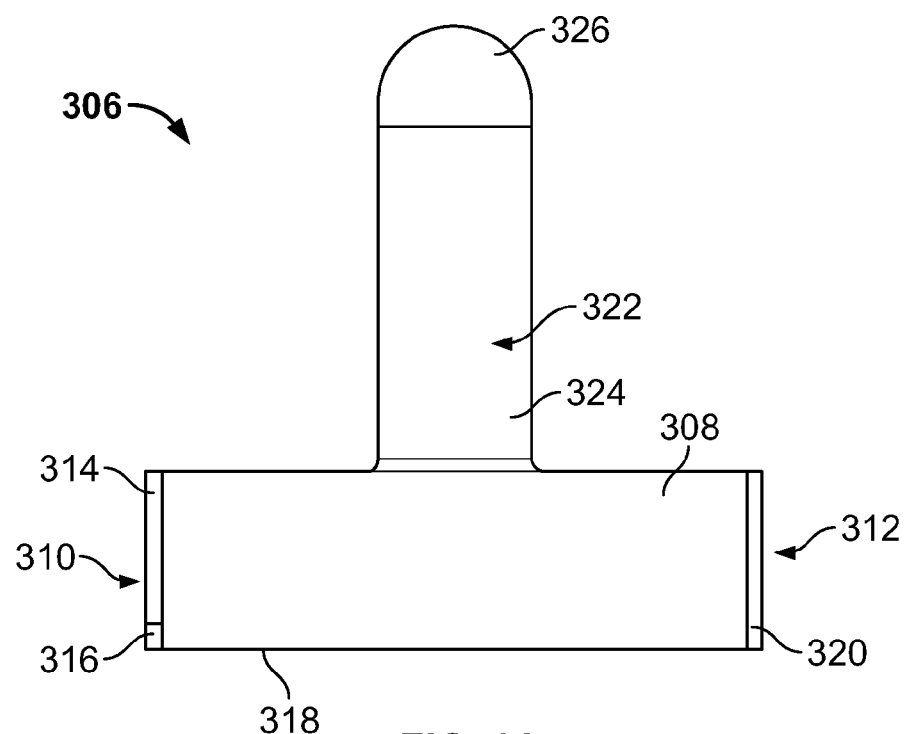
FIG. 32 is a top view of a negative electrical contact of an exemplary monitoring device according to the present disclosure.
Figure 33:
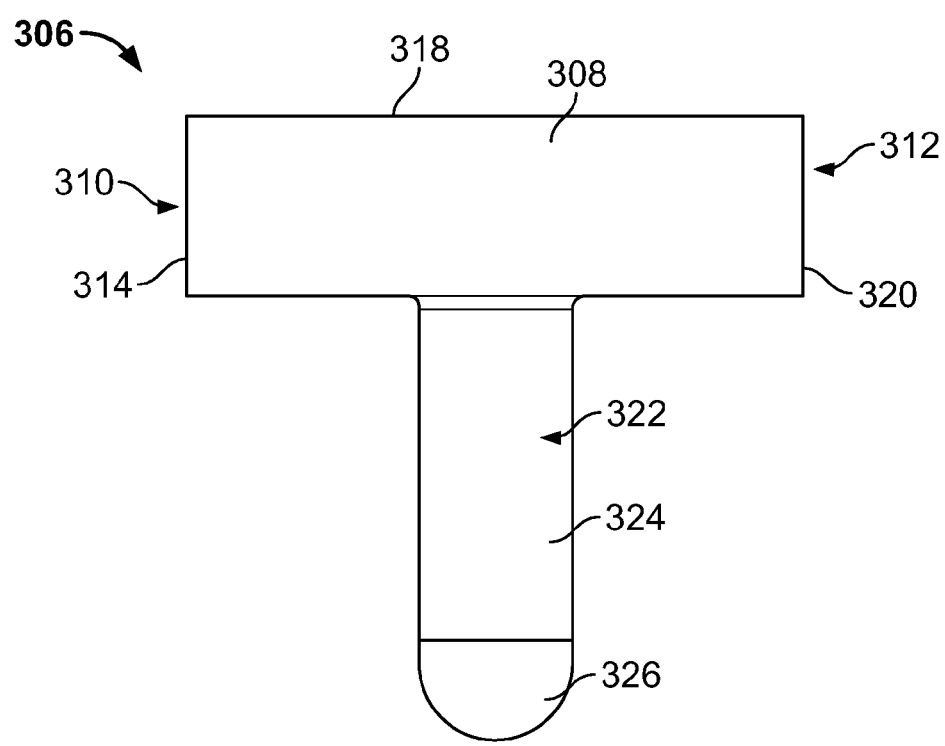
FIG. 33 is a bottom view of a negative electrical contact of an exemplary monitoring device according to the present disclosure.
Figure 34:
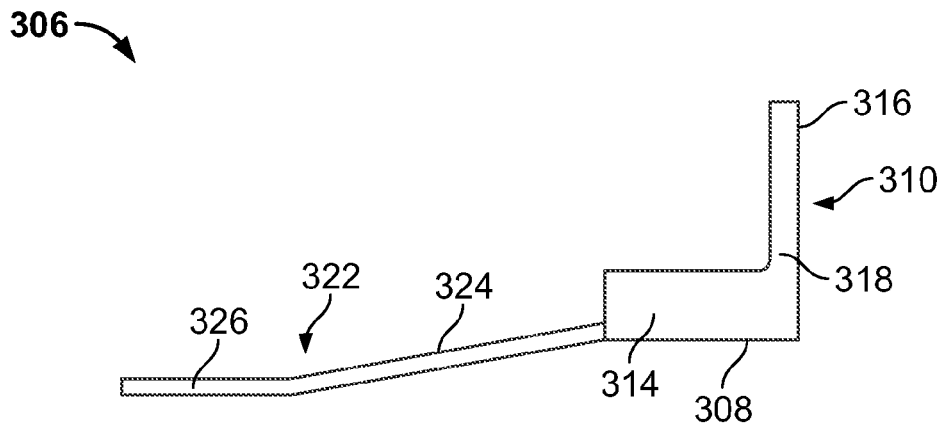
FIG. 34 is a side view of a negative electrical contact of an exemplary monitoring device according to the present disclosure.
Figure 35:
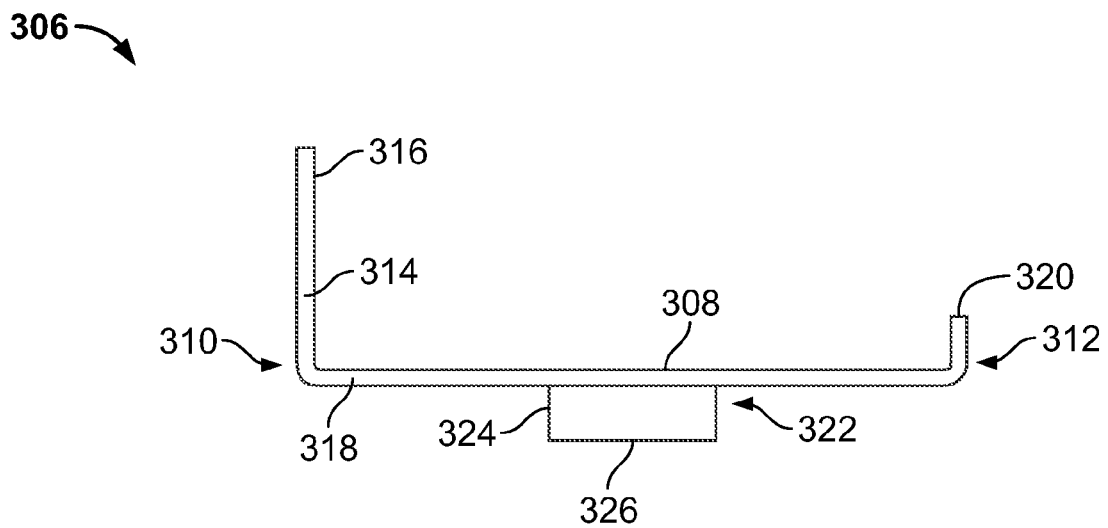
FIG. 35 is a side view of a negative electrical contact of an exemplary monitoring device according to the present disclosure.
Figure 36:
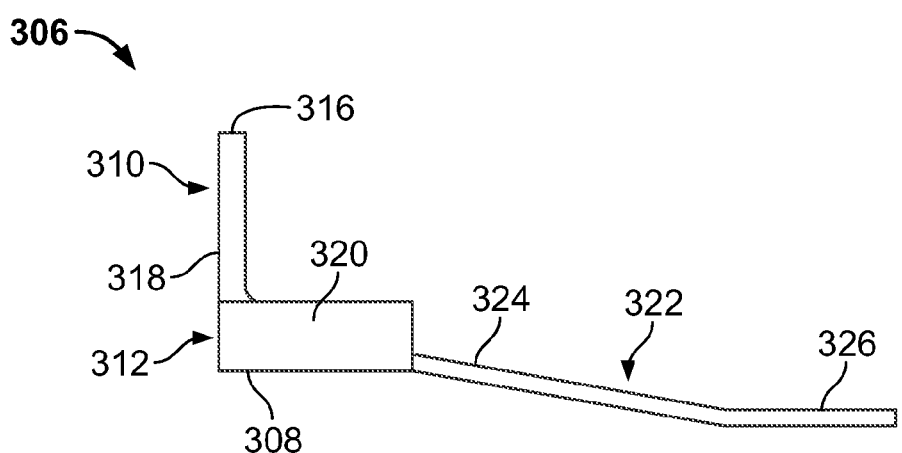
FIG. 36 is a side view of a negative electrical contact of an exemplary monitoring device according to the present disclosure.

FIG. 21 shows a top view of an exemplary printed circuit board (PCB) 246. The PCB 246 can define a substantially circular configuration. In some embodiments, the PCB 246 can include first, second and third notches 248, 250, 252 circumferentially positioned around the PCB 246. For example, the first and third notches 248, 252 can be positioned on opposing sides of the PCB 246 and the circumferential distance between the second and third notches 250, 252 can be greater than the circumferential distance between the first and second notches 248, 250. In particular, the first, second and third notches 248, 250, 252 can be radially positioned such that the PCB 246 can mate with the first, second and third projections 186, 188, 190 of the cap 172. In addition, the PCB 246 can include first and second holes 251, 253 positioned on opposing sides of the PCB 246. The first and second holes 251, 253 can be configured and dimensioned to receive electrical contact extensions to create an electrical contact with a battery.

For example, during assembly, the PCB 246 can be positioned into or above the interior space 220 of the chassis 206 such that the first notch 248 aligns with the first side opening 222, the second notch 250 aligns with the second opening 224, and the third notch 252 aligns with the fourth opening 228. Thus, when the chassis 206 is mated with the interior space 196 of the cap 172, the first protrusion 186 can align and be positioned adjacent to the first notch 248, the second protrusion 188 can align and be positioned adjacent to the third notch 252, and the third protrusion 190 can align and be positioned adjacent to the second notch 250. In addition, during assembly, the first and second holes 251, 253 of the PCB 246 can be aligned with third side opening 226 and a portion of the second electrical slot 244, respectively. The proper orientation of the PCB 246 can thereby be maintained relative to the chassis 206 and the cap 172.

With reference to FIGS. 22-29, perspective, top, bottom, rear, front and side views of an exemplary positive electrical contact 254 are provided. The positive electrical contact 254 can be fabricated from a metal or other conductive material to provide the necessary electrical contact for a battery. The positive electrical contact 254 includes a planar body 256 defining a substantially rectangular configuration with two beveled corners 258, 260. The first beveled corner 258 includes a first wall 262 and the second beveled corner 260 includes a second wall 264 extending perpendicularly relative to the body 256.

The first wall 262 can define a body portion 266, e.g., a substantially rectangular body portion, and first and second extensions 268, 270 extending therefrom. The first and second extensions 268, 270 can extend from the body portion 266 in a direction parallel to the first wall 262, e.g., perpendicular to the body 256. The first extension 268 can be shorter in length than the second extension 270. In some embodiments, the first extension 268 can be wider in width than the second extension 270. Similarly, the second wall 264 can define a body portion 272, e.g., a substantially rectangular body portion, and first and second extensions 274, 276. The first and second extensions 274, 276 can extend from the body portion 272 in a direction parallel to the second wall 264, e.g., perpendicular to the body 256. The first and second extensions 274, 276 can be dimensioned to have substantially equal lengths and widths. Thus, the first and second extensions 268, 270 of the first wall 262 can be asymmetrical relative to each other, while the first and second extensions 274, 276 of the second wall 264 can be symmetrical relative to each other. Similarly, the first and second walls 262, 264 can be asymmetrical relative to each other. As will be discussed below, the asymmetrical configuration of the first and second walls 262, 264 can assist in guiding assembly of the components of the device 100.

The body 256 of the positive electrical contact 254 can include first and second keyhole-shaped cutouts 278, 280, each including a circular cutout portion 282, 284 and a rectangular cutout portion 286, 288 extending therefrom. The body 256 further includes first and second battery contacts 290, 292, e.g., conductors. The first and second battery contacts 290, 292 can connect to the body 256 at an endpoint of the respective rectangular cutout portions 286, 288 and can extend over the circular cutout portions 282, 284. In particular, the first and second battery contacts 290, 292 can include an angled portion 294, 296 connected to the body 256 and extending upwards away from the body 256 (e.g., upward relative to a plane defined by the body 256), and further include a planar portion 298, 300 extending from the angled portion 294, 296 in a direction parallel to the surface of the body 256. Thus, the angled portions 294, 296 can extend over and be aligned with the rectangular cutout portions 286, 288, and the planar portions 298, 300 can extend over the circular cutout portions 282, 284. It should be understood that the angled portions 294, 296 can provide a spring-like retaining force against a battery to ensure a continuous electrical contact, while the planar portions 298, 300 can provide a planar contact surface against the battery. Thus, as will be described in greater detail below, during assembly, a battery can be inserted into the interior portion 302 defined by the first and second walls 262, 264 and the body 256, and a bottom surface 304 of the positive electrical contact 254 can be positioned within the base interior space 156 of the base 104.

With reference to FIGS. 30-36, perspective, top, bottom, side and front views of an exemplary negative electrical contact 306 are provided. The negative electrical contact 306 can be fabricated from a metal or other conductive material to provide the necessary electrical contact for a battery. The negative electrical contact 306 can include a planar body 308, e.g., a rectangular body portion, with first and second walls 310, 312 extending from the body 308 on opposing sides of the body 308. In particular, the first and second walls 310, 312 can extend from the body 308 in a direction perpendicular relative to the body 308.

The first wall 310 can define a body portion 314, e.g., a substantially rectangular body portion, and includes an extension 316 extending therefrom. The extension 316 can extend in a direction parallel to the first wall 310, e.g., perpendicular to the body portion 314. The extension 316 can be aligned with a rear wall 318 of the negative electrical contact 306. The second wall 312 can define a body portion 320, e.g., a substantially rectangular body portion, and does not generally include an extension. Thus, the first wall 310 can define an asymmetrical configuration and the second wall 312 can define a symmetrical configuration. Similarly, the first and second walls 310, 312 can be asymmetrical relative to each other. As will be discussed below, the asymmetrical configuration can guide assembly of the components of the device 100.

The negative electrical contact 306 includes a battery contact 322, e.g., a conductor, extending from the body 308. In particular, the battery contact 322 can extend from a position centrally located between the first and second walls 310, 312. The battery contact 322 includes an angled portion 324 and a planar portion 326. The angled portion 324 can connect to and extend from the body 308 in a downward direction relative to a plane defined by the planar body 308. The planar portion 326 can extend from a distal end of the angled portion 324 in a direction parallel to the body 308. It should be understood that the angled portion 324 can provide a spring-like retaining force against a battery to ensure a continuous electrical contact, while the planar portion 326 can provide a planar contact surface against the battery. It should be understood that the angled and planar portions 324, 326 of the negative electrical contact 306 can be configured and dimensioned substantially similarly to the angled and planar portions 294, 296, 298, 300 of the positive electrical contact 254 such that a battery can be inserted between the positive and negative electrical contacts 254, 306 and an electrical connection can be maintained therebetween.

Figure 37:
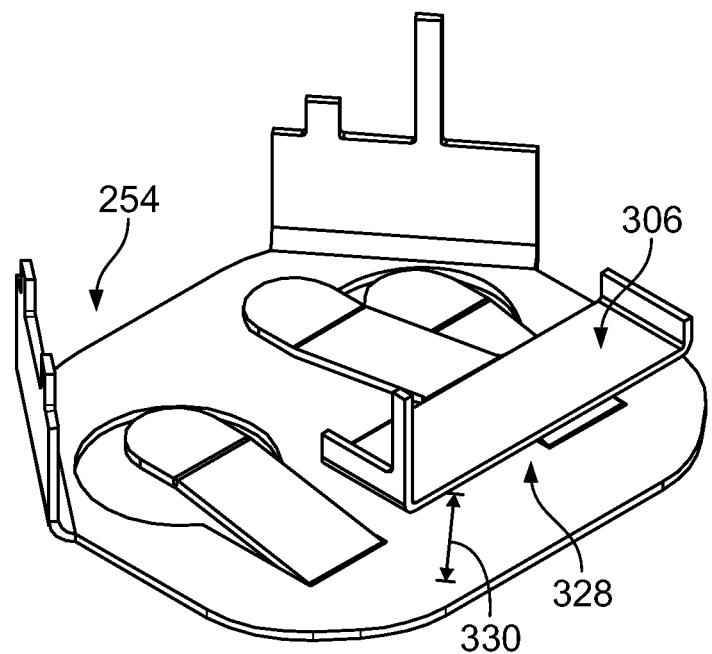
FIG. 37 is a perspective view of a positive electrical contact and a negative electrical contact of an exemplary monitoring device according to the present disclosure.
Figure 38:
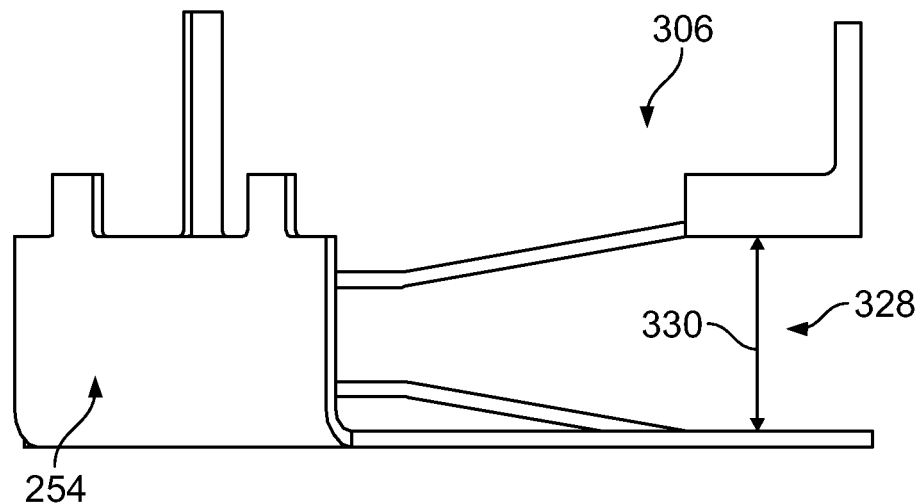
FIG. 38 is a side view of a positive electrical contact and a negative electrical contact of an exemplary monitoring device according to the present disclosure.
Figure 39:
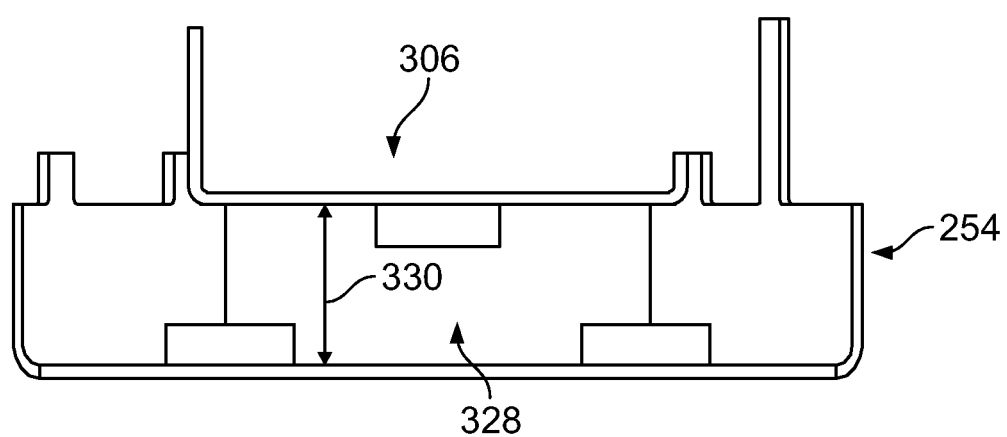
FIG. 39 is a side view of a positive electrical contact and a negative electrical contact of an exemplary monitoring device according to the present disclosure.
Figure 40:
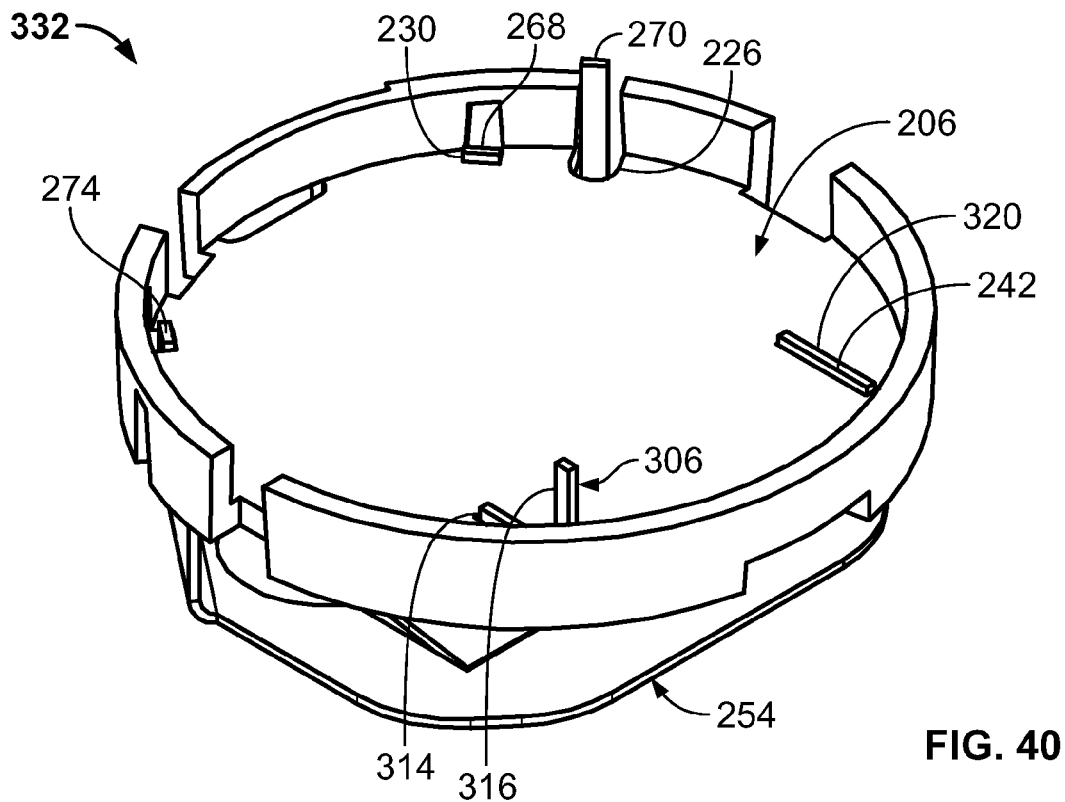
FIG. 40 is a top perspective view of an assembly including a chassis, a positive electrical contact and a negative electrical contact of an exemplary monitoring device according to the present disclosure.
Figure 41:
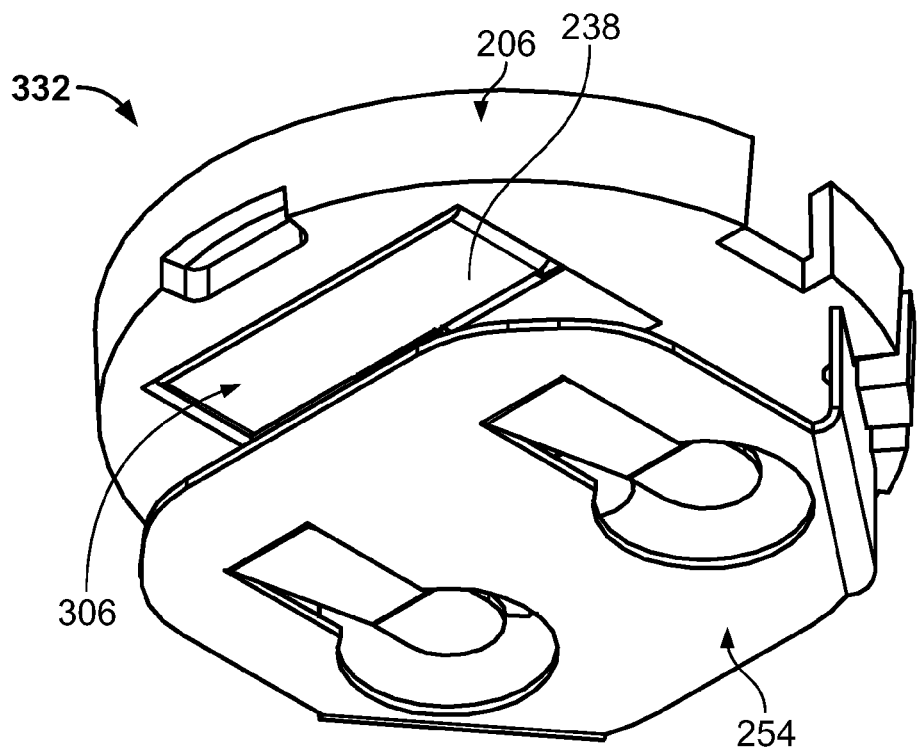
FIG. 41 is a bottom perspective view of an assembly including a chassis, a positive electrical contact and a negative electrical contact of an exemplary monitoring device according to the present disclosure.
Figure 42:
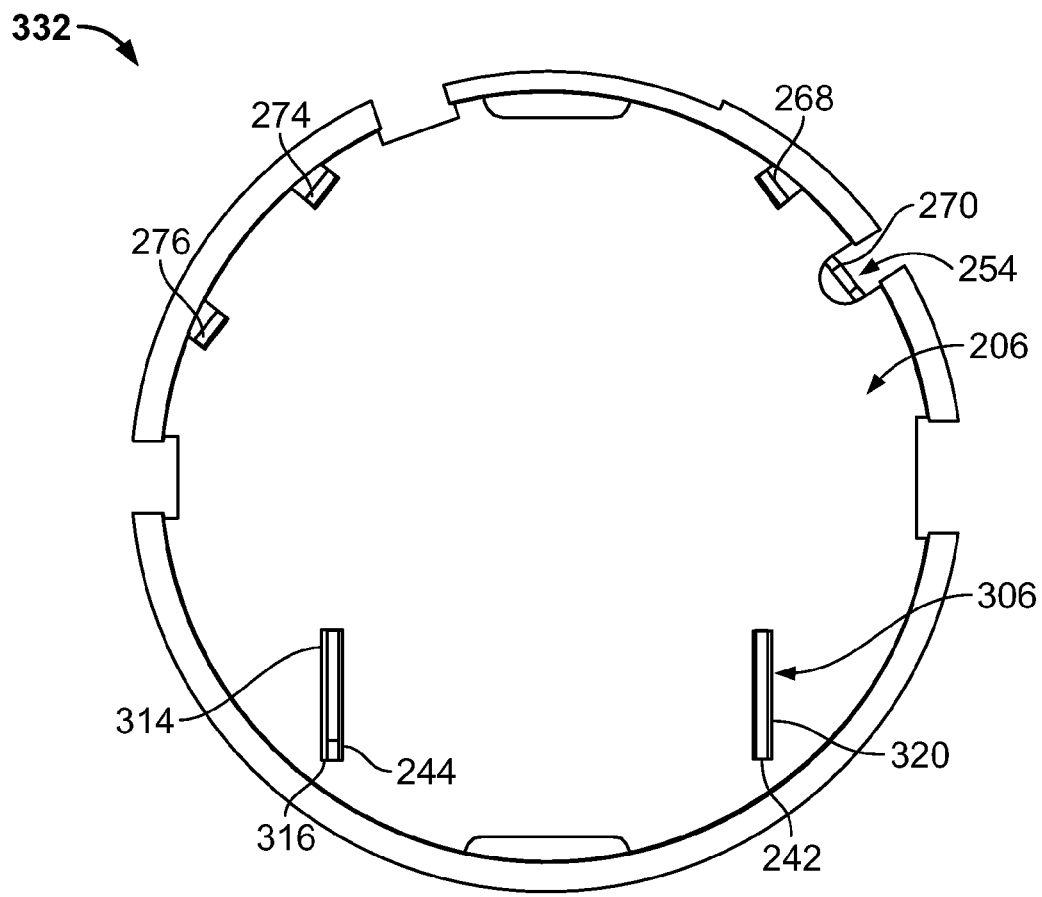
FIG. 42 is a top view of a chassis assembly including a chassis, a positive electrical contact and a negative electrical contact of an exemplary monitoring device according to the present disclosure.
Figure 43:
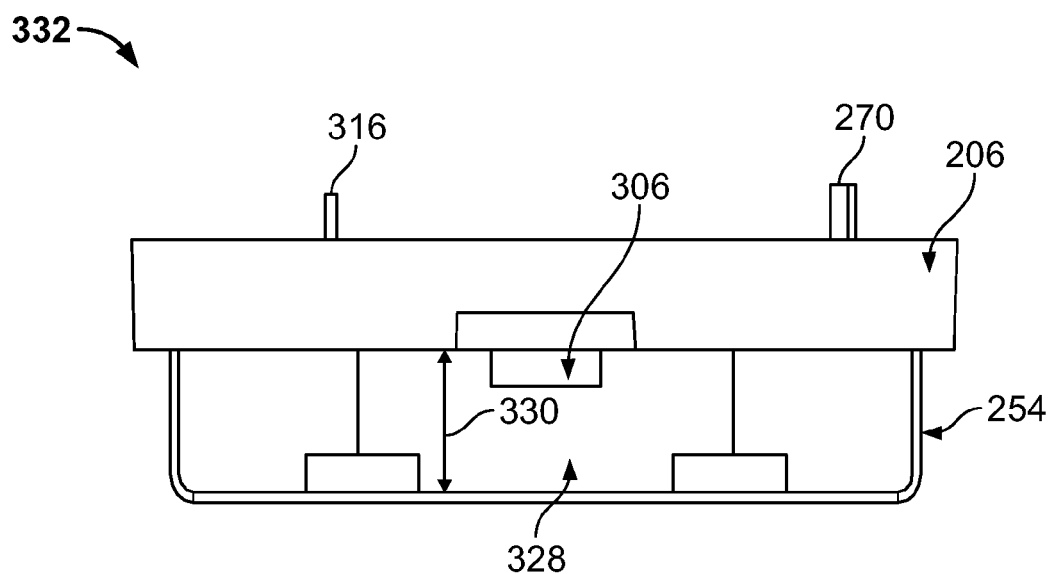
FIG. 43 is a side view of a chassis assembly including a chassis, a positive electrical contact and a negative electrical contact of an exemplary monitoring device according to the present disclosure.
Figure 44:
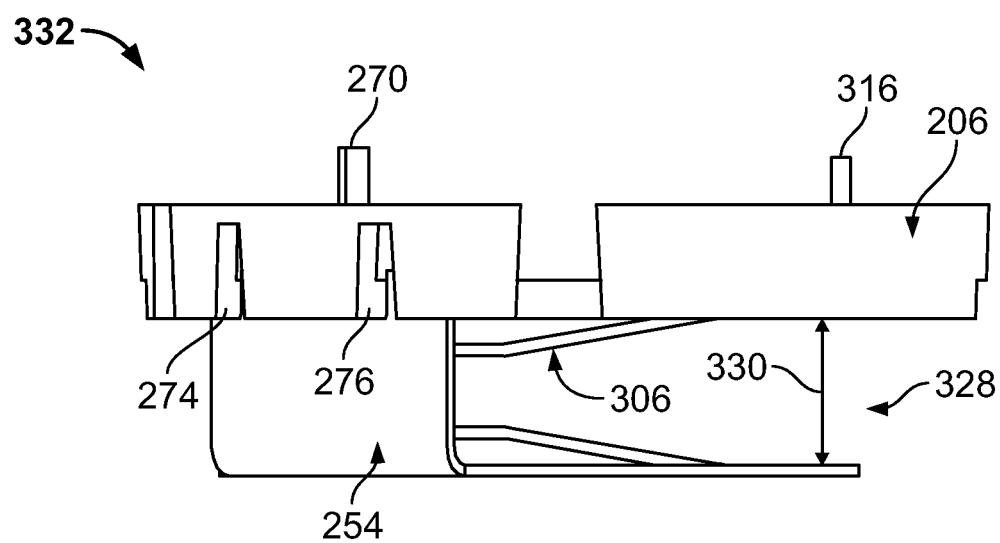
FIG. 44 is a side view of a chassis assembly including a chassis, a positive electrical contact and a negative electrical contact of an exemplary monitoring device according to the present disclosure.
Figure 45:
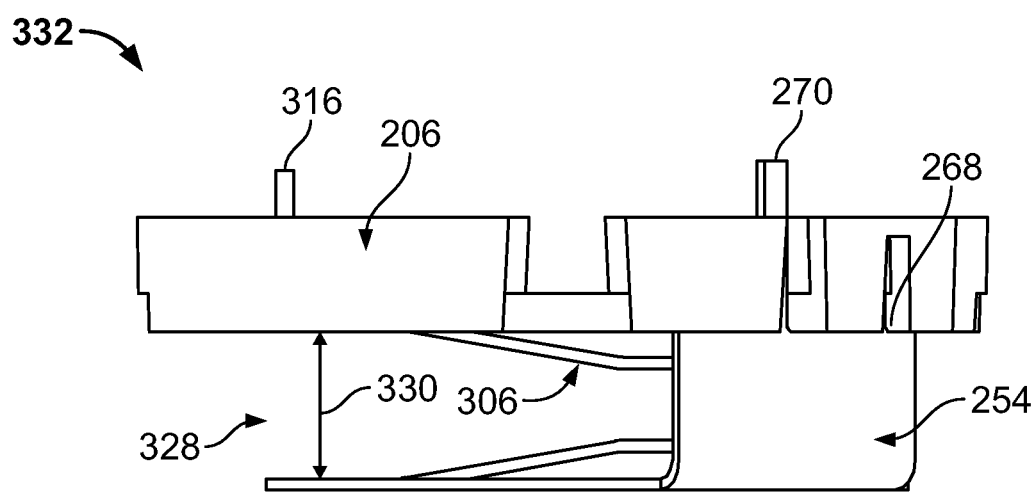
FIG. 45 is a side view of a chassis assembly including a chassis, a positive electrical contact and a negative electrical contact of an exemplary monitoring device according to the present disclosure.
Figure 46:
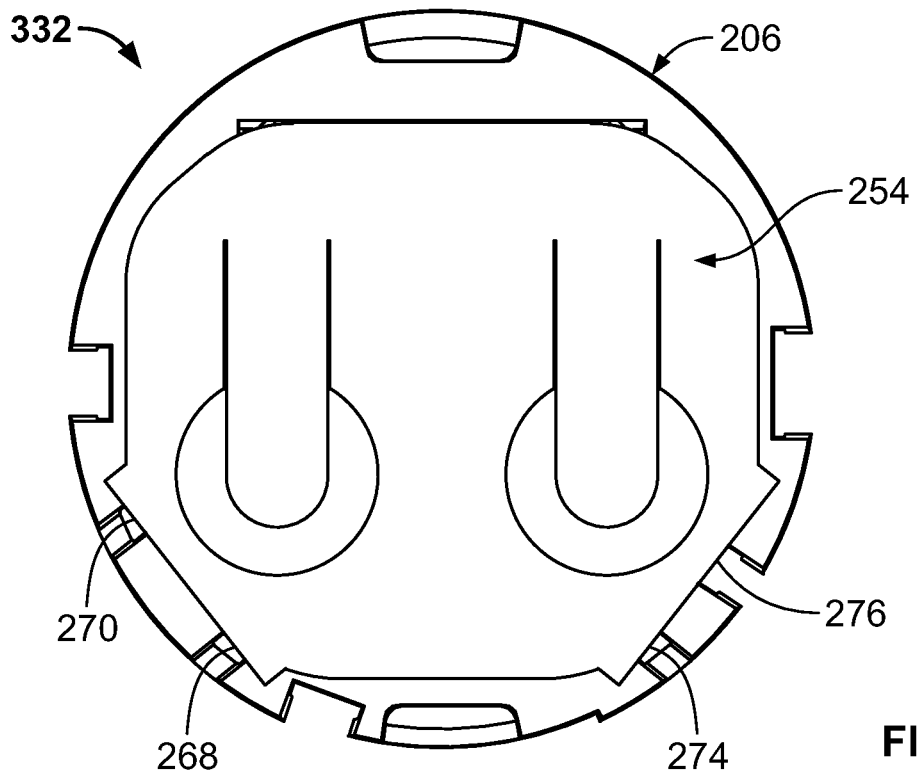
FIG. 46 is a bottom view of a chassis assembly including a chassis, a positive electrical contact and a negative electrical contact of an exemplary monitoring device according to the present disclosure.

With reference to FIGS. 37-39, perspective, side and front views of the positive and negative electrical contacts 254, 306 are provided. In particular, FIGS. 37-39 illustrate the positioning of the positive and negative electrical contacts 254, 306 relative to each other during assembly. The positive and negative electrical contacts 254, 306 can be positioned in a spaced relation such that an inner passage 328 defining a height 330 is formed therebetween. The height 330 can be dimensioned such that a battery can be received within the inner passage 328. The planar portions 298, 300, 326 of the positive and negative electrical contacts 254, 306 can be aligned during assembly to provide an electrical contact against opposing surfaces of the battery. As discussed above, the angled portions 294, 296, 324 of the positive and negative electrical contacts 254, 306 provide a retaining force against the battery to ensure that an electrical connection is maintained while the battery is within the inner passage 328.

FIGS. 40-46 show perspective, top, front, side and bottom views of an exemplary chassis assembly 332 including a chassis 206, a positive electrical contact 254 and a negative electrical contact 306. In particular, the negative electrical contact 306 can be assembled with the chassis 206 by aligning and inserting the body portion 310 and the extension 316 of the negative electrical contact 306 into and through the second electrical slot 244 of the chassis 206, and aligning and inserting the body portion 314 of the negative electrical contact 306 into and through the first electrical slot 242 of the chassis 206. The body 308 of the negative electrical contact 306 can further be received by the deep recess 238 on the bottom surface 210 of the chassis 206. In some embodiments, the body portions 314, 320 can extend through the second and first electrical slots 244, 242 up to the top surface 208 of the chassis 206, while the extension 316 passes through the second electrical slot 244 and extends in a direction parallel to the central vertical axis $A_4$ out of the second electrical slot 244 and away from the top surface 208.

The positive electrical contact 254 can be assembled with the chassis 206 by aligning and inserting the first and second extensions 268, 270 of the positive electrical contact 254 into and at least partially through the slot 230 in the third wall 216 and the third side opening 226, respectively, of the chassis 206. Similarly, the first and second extensions 274, 276 of the positive electrical contact 254 can be aligned and at least partially inserted into the respective slots 230 in the second wall 214 of the chassis 206. In some embodiments, the first extension 268 of the first wall 262 and the first and second extensions 274, 276 of the second wall 264 of the positive electrical contact 254 can extend through the slots 230 up to the top surface 208 of the chassis 206, while the second extension 270 passes through the third side opening 226 and extends in a direction parallel to the central vertical axis $A_4$ out of the third side opening 226 and away from the top surface 208. In particular, in an assembled configuration, the second extension 270 of the positive electrical contact 254 and the extension 316 of the negative electrical contact 306 can extend through the chassis 206 on substantially opposing sides thereof. It should be understood that during assembly of the positive electrical contact 254 with the chassis 206, the body portions 266, 272 of the first and second walls 262, 264 can abut against the bottom surface 210 of the chassis 206 such that the inner passage 328 for receiving a battery between the positive and negative electrical contacts 254, 306 is maintained.

Figure 47:
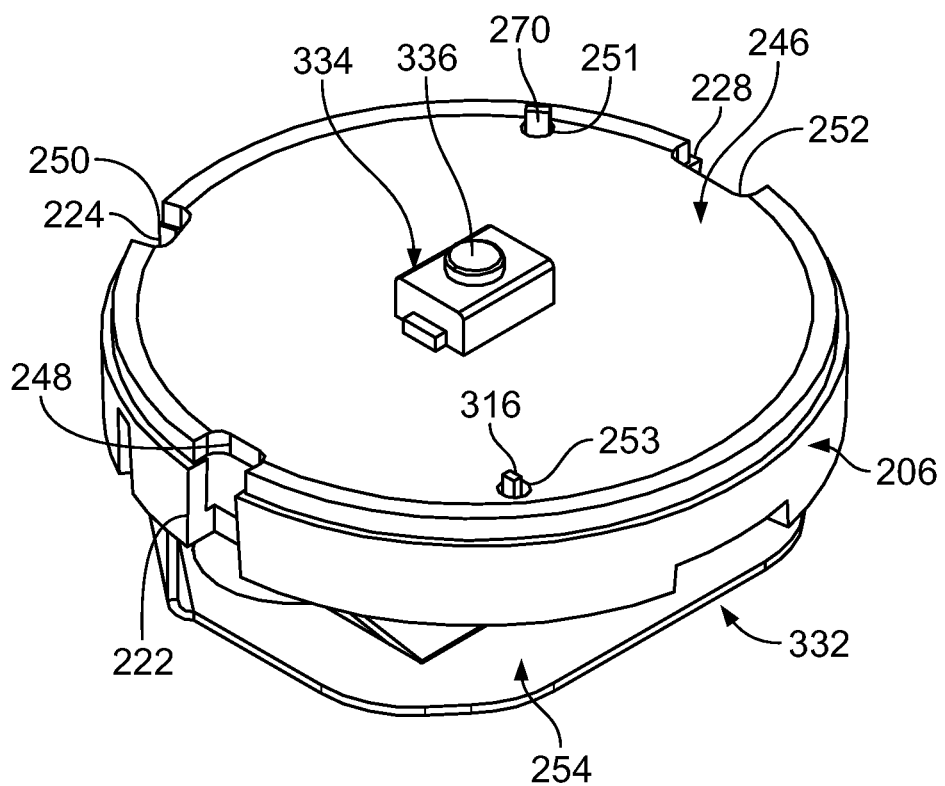
FIG. 47 is a top perspective view of a chassis assembly including a chassis, a positive electrical, a negative electrical contact and a printed circuit board of an exemplary monitoring device according to the present disclosure.

FIG. 47 shows a top perspective view of a chassis assembly 332 including a PCB 246. In particular, the asymmetrical positioning of the second extension 270 of the positive electrical contact 254 and the extension 316 of the negative electrical contact 306 can assist in guiding insertion and proper contact of the PCB 246 relative to the chassis 206 during assembly. For example, the first hole 251 of the PCB 246 can be aligned with the second extension 270 and the second extension 270 can be passed through the first hole 251 until the PCB 246 is positioned within or above the interior space 220 of the chassis 206. Simultaneously, the second hole 253 of the PCB 246 can be aligned with the extension 316 and the extension 316 can be passed through the second hole 253. For example, rather than being position within the interior space 220 of the chassis 206, the PCB 246 can be supported by a top surface of the first, second, third and fourth walls 212, 214, 216, 218 of the chassis 206. In some embodiments, the second extension 270 and the extension 316 can be soldered to the PCB 246. As can be seen from FIG. 47, in an assembled configuration, the first notch 248 of the PCB 246 can be aligned with the first side opening 222 of the chassis 206, the second notch 250 of the PCB 246 can be aligned with the second side opening 224 of the chassis 206, and the third notch 252 of the PCB 246 can be aligned with the fourth side opening 228 of the chassis 206. This alignment of the PCB 246 and the chassis 206 creates slots which can mate with components of the cap 172.

In some embodiments, the PCB 246 can include an actuator 334, e.g., a button, electrically connected and centrally positioned thereon. For example, the actuator 334 can be soldered onto an exposed surface of the PCB 246 such that the actuator 334 extends upwards and away from the chassis assembly 332. In some embodiments, the actuator 334 can include a depressible button 336. Actuation of the actuator 334 by depressing and/or holding the button 336 can, e.g., turn the device 100 on or off, start or stop preprogrammed actions, initiate Bluetooth pairing with another device, and the like. For example, depression of the button 106 of the cover 106 can actuate the central protrusion 118 to translate through the opening 178 of the cap 172 such that the central protrusion 118 can depress the button 336 of the PCB 246.

Figure 48:
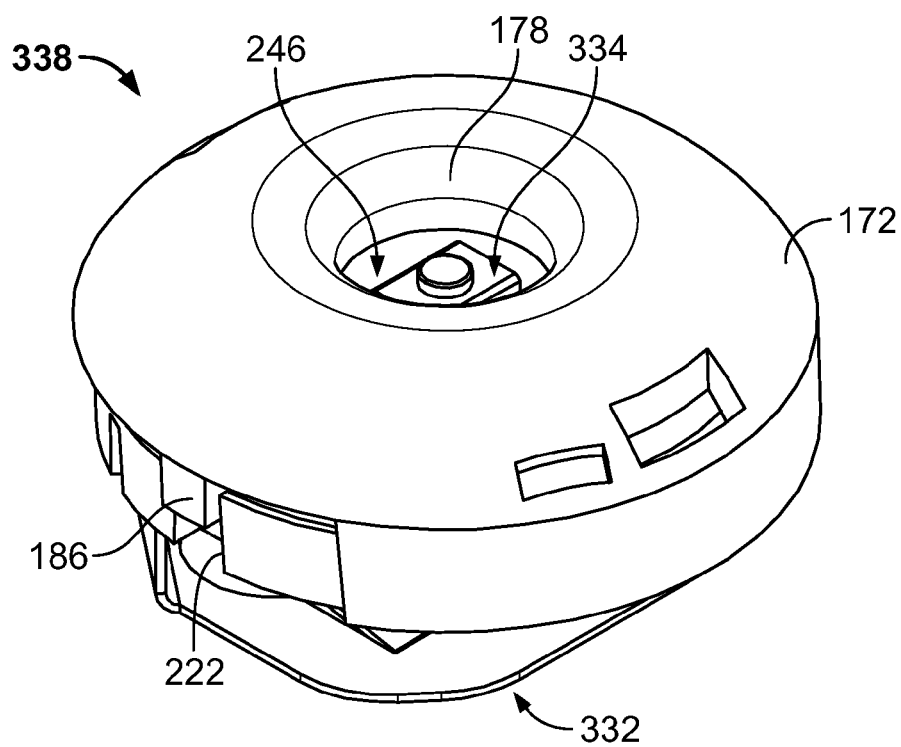
FIG. 48 is a top perspective view of a cap assembly including a chassis assembly and a cap of an exemplary monitoring device according to the present disclosure.
Figure 49:
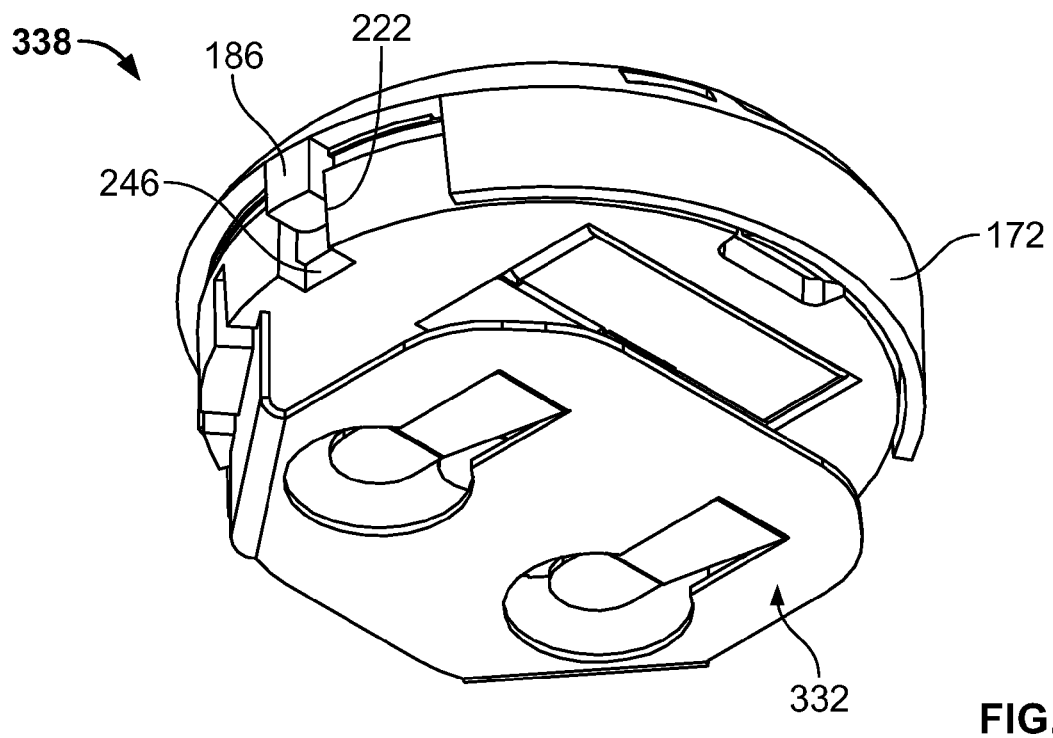
FIG. 49 is a bottom perspective view of a cap assembly including a chassis assembly and a cap of an exemplary monitoring device according to the present disclosure.

With reference to FIGS. 48 and 49, perspective views of an exemplary cap assembly 338 are provided. In particular, the cap assembly 338 includes a chassis assembly 332, a PCB 246 and a cap 172. As discussed above, the protrusions and side openings of the cap 172 and the chassis assembly 332 can mate in the assembled configuration. For example, FIGS. 48 and 49 show the first protrusion 186 of the cap 172 aligned with and inserted through the first side opening 222 of the chassis 206. It should be understood that the second and third protrusions 188, 190 can be similarly aligned with and inserted through the fourth and second side openings 228, 224, respectively. In addition, in the assembled configuration, the actuator 334 of the PCB 246 can be centered relative to the opening 178 of the cap 172. Thus, except for the exposed actuator 334, the PCB 246 can be enclosed by the chassis 206 and the cap 172.

Figure 50:
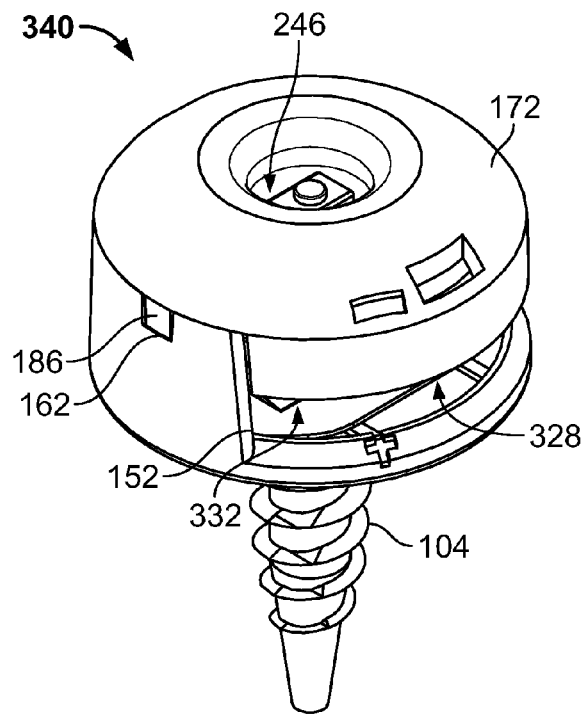
FIG. 50 is a top perspective view of a base and cap assembly including a chassis assembly, a base and a cap of an exemplary monitoring device according to the present disclosure.
Figure 51:
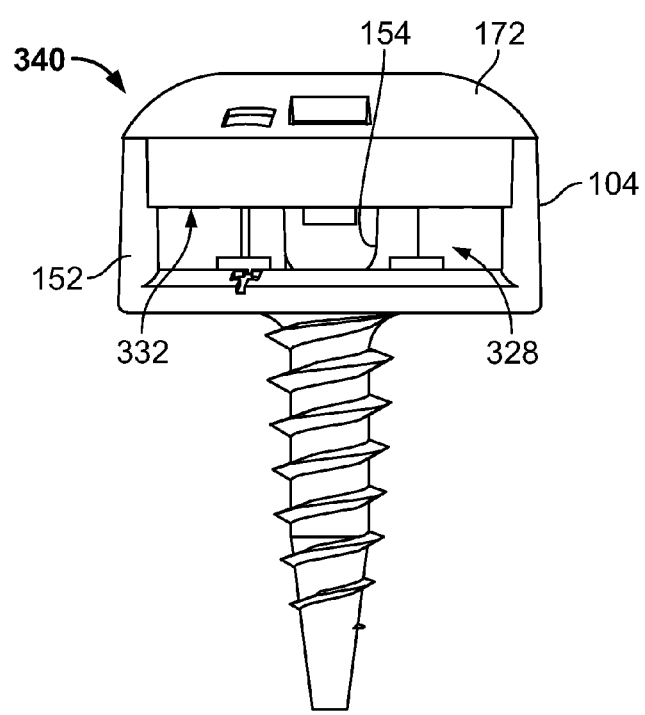
FIG. 51 is a side view of a base and cap assembly including a chassis assembly, a base and a cap of an exemplary monitoring device according to the present disclosure.

FIGS. 50 and 51 show perspective and side views of an exemplary base and cap assembly 340. In particular, the base and cap assembly 340 includes a cap 172, a chassis assembly 332, a PCB 246 and a base 104. As discussed above, the protrusions and slots of the cap 172 and the base 104 can mate in the assembled configuration. For example, FIG. 50 shows the first protrusion 186 of the cap 172 aligned and mated with the first slot 162 of the base 104. It should be understood that the second and third protrusions 188, 190 can be similarly aligned and mated with the second slot 164 and a portion of the second side opening 154, respectively. In some embodiments, the base 104 can be fixedly secured to the cap assembly 338 such that the base 104 and the cap assembly 338 cannot be separated from each other. For example, the base 104 can be ultrasonically welded and/or snapped to the cap assembly 338. The internal components of the cap assembly 338 can thereby be protected from exposure and/or undesired disassembly. In addition, it should be understood that during assembly, the positive electrical contact 254 can be positioned against or adjacent to the support surface 150 of the base 104.

As can be seen in FIG. 51, in the assembled configuration, the inner passage 328 between the positive and negative electrical contacts 254, 306 can be maintained and exposed through a portion of the first side opening 152 in the base 104. Further, in the assembled configuration, a portion of the second side opening 154 in the base 104 can extend into the inner passage 328 on an opposing side of the base and cap assembly 340 relative to the first side opening 152. Thus, a battery can be slid or inserted into the inner passage 328 and pushed into the inner passage 328 until the battery is fully positioned within the base and cap assembly 340. For replacement of the battery, an instrument or device, e.g., a golf tee, can be passed through the second side opening 154 to push or eject the battery from the first side opening 152 and out of the inner passage 328.

Figure 52:
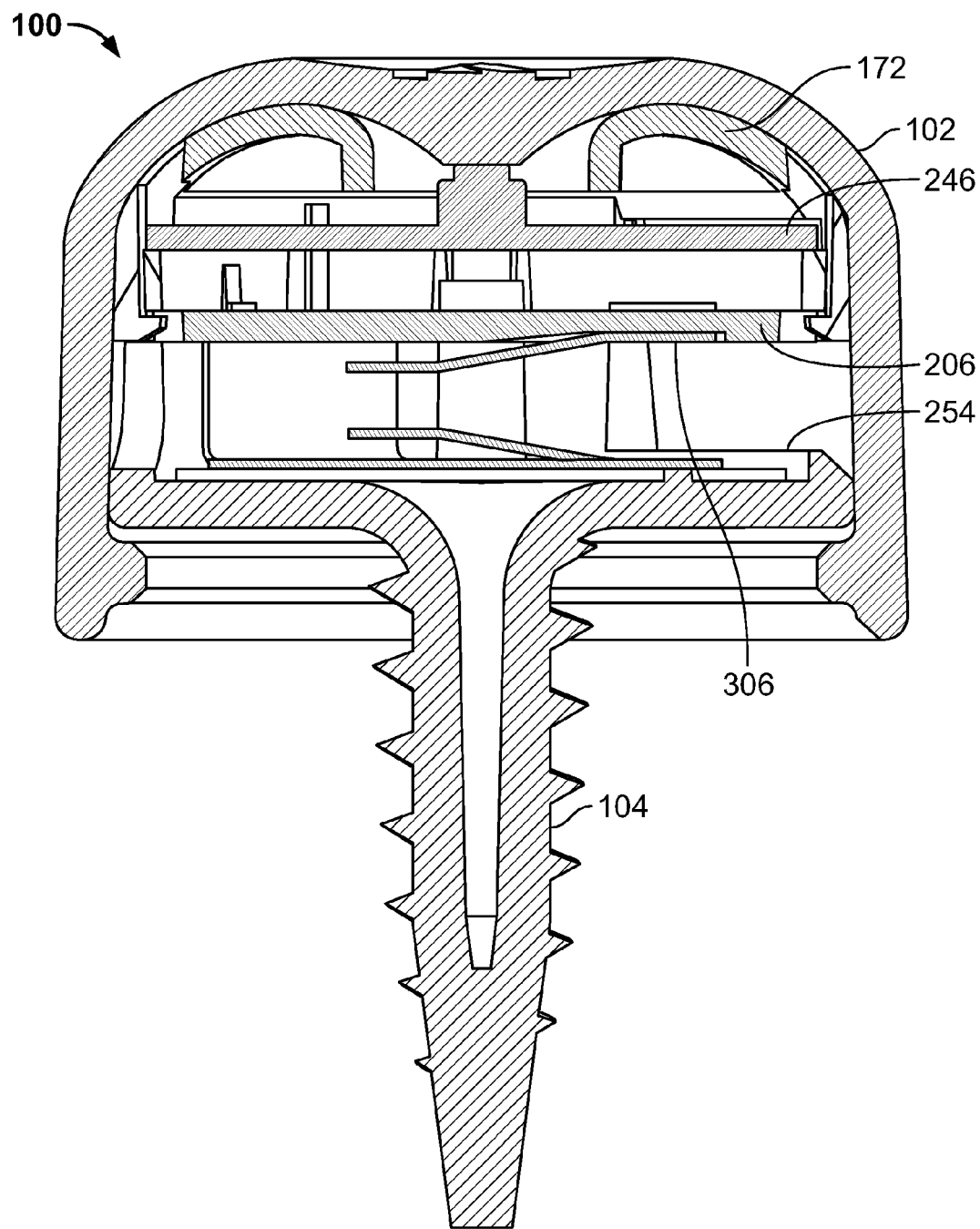
FIG. 52 is a side cross-sectional view of an exemplary monitoring device according to the present disclosure.
Figure 53:
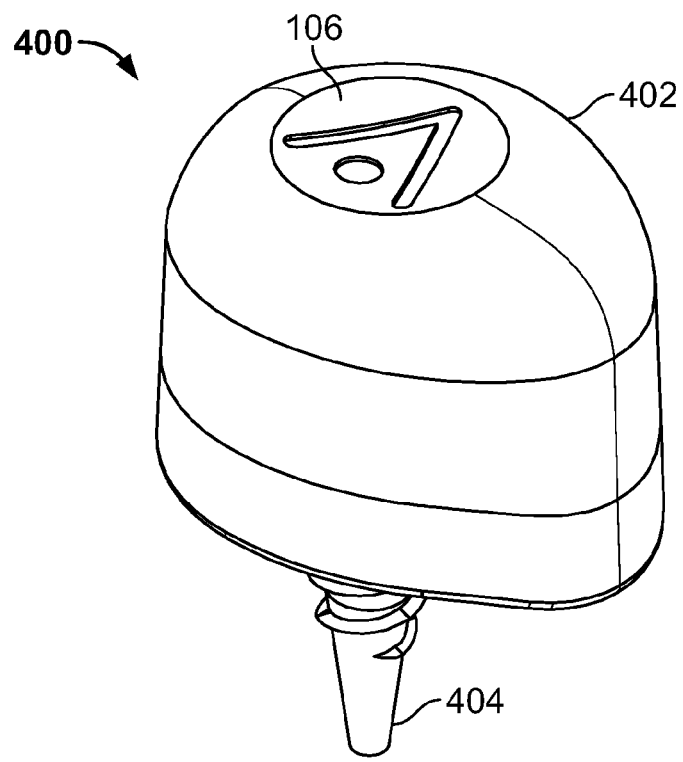
FIG. 53 is a top perspective view of an exemplary monitoring device according to the present disclosure.
Figure 54:
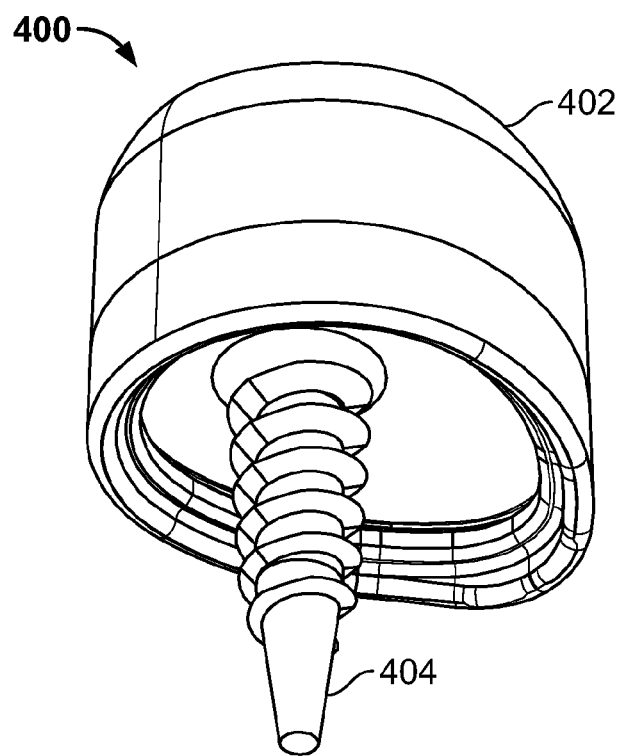
FIG. 54 is a bottom perspective view of an exemplary monitoring device according to the present disclosure.
Figure 55:
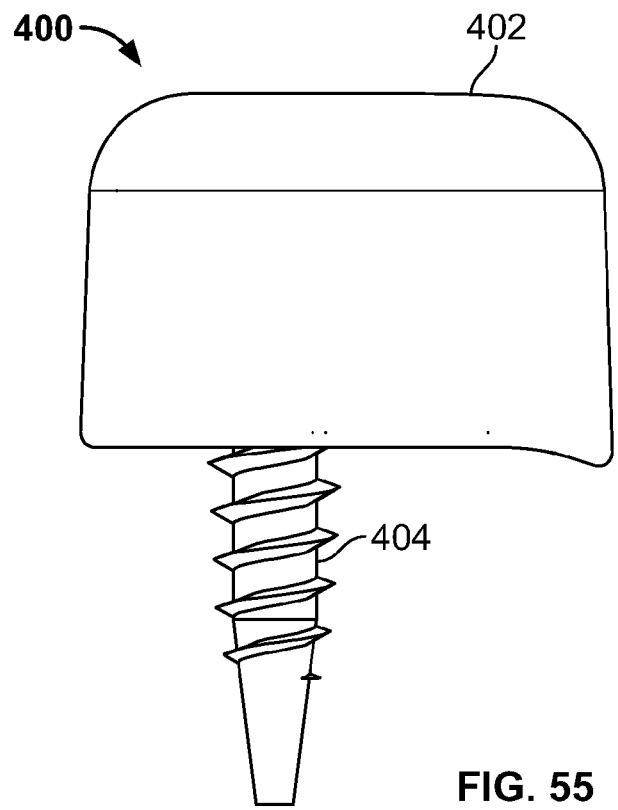
FIG. 55 is a side view of an exemplary monitoring device according to the present disclosure.
Figure 56:
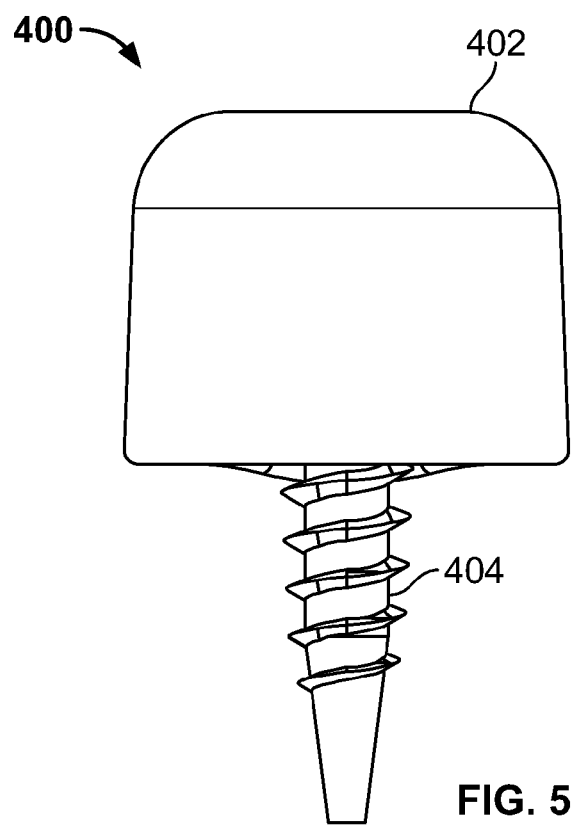
FIG. 56 is a rear view of an exemplary monitoring device according to the present disclosure.
Figure 57:
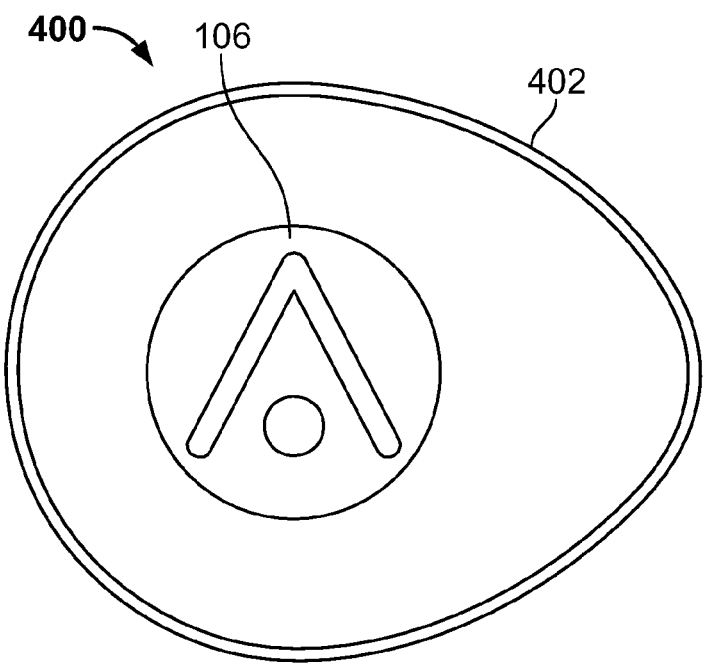
FIG. 57 is a top view of an exemplary monitoring device according to the present disclosure.
Figure 58:
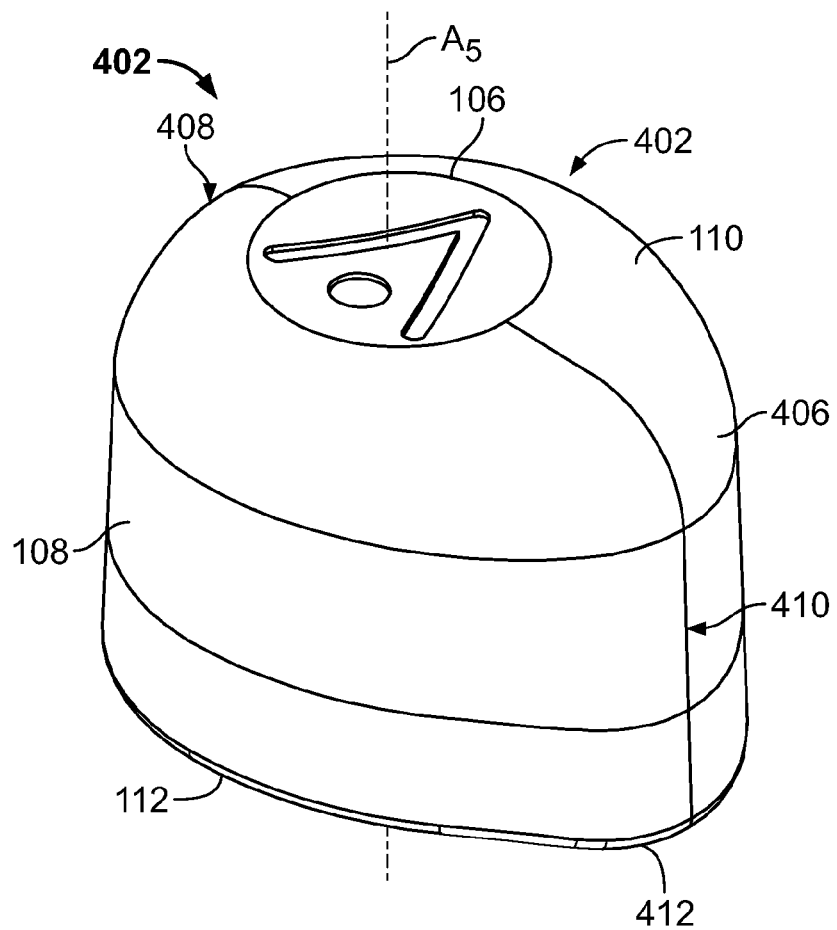
FIG. 58 is a top perspective view of a cover of an exemplary monitoring device according to the present disclosure.
Figure 59:
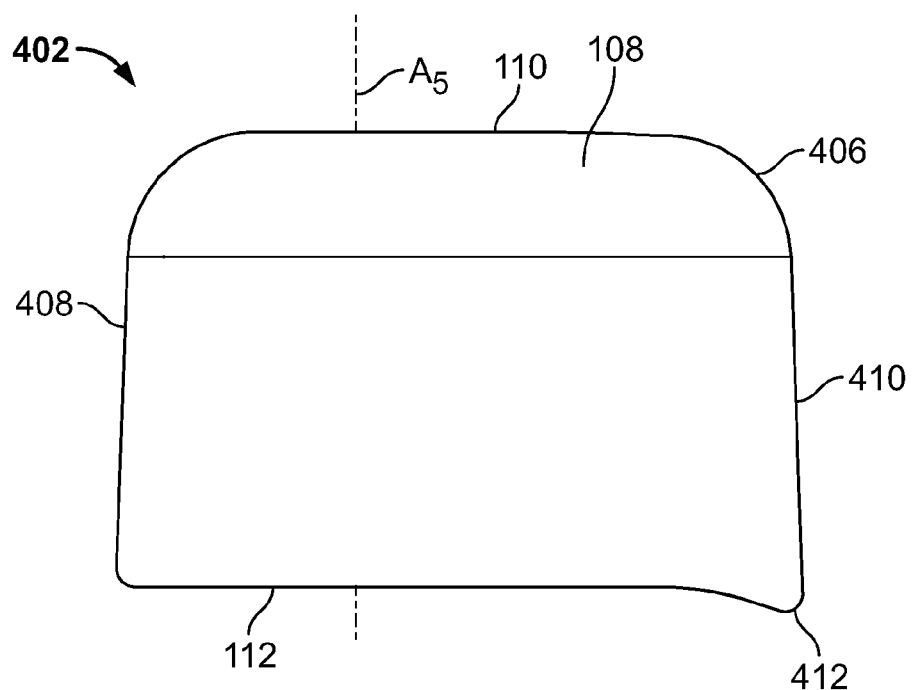
FIG. 59 is a side view of a cover of an exemplary monitoring device according to the present disclosure.
Figure 60:
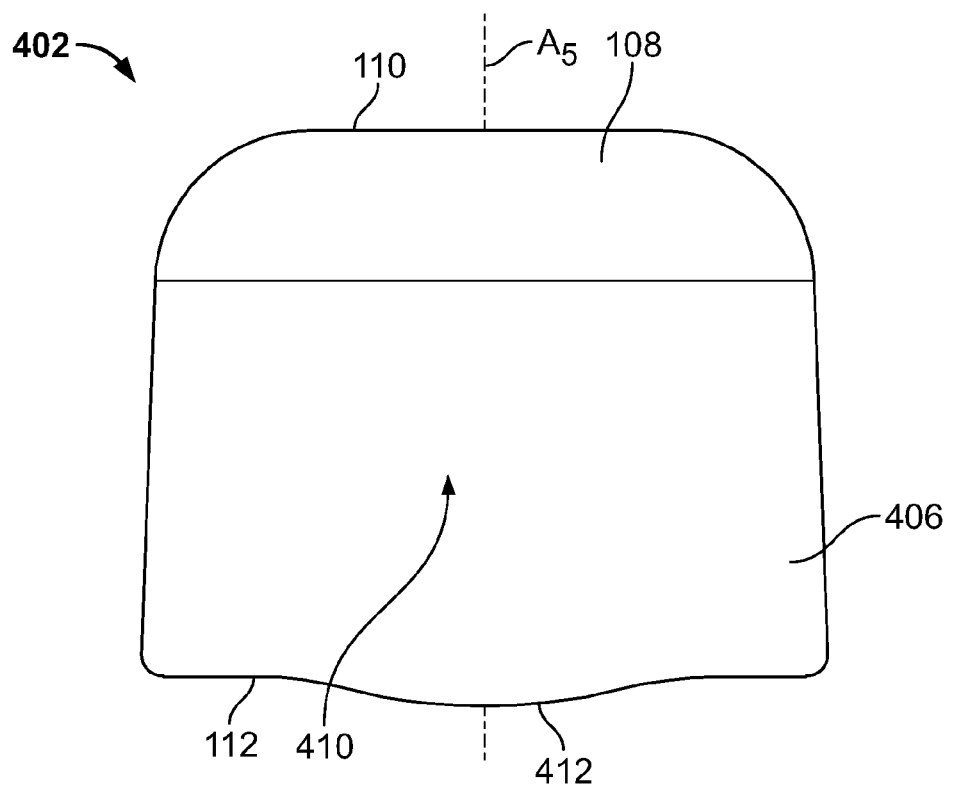
FIG. 60 is a front view of a cover of an exemplary monitoring device according to the present disclosure.
Figure 61:
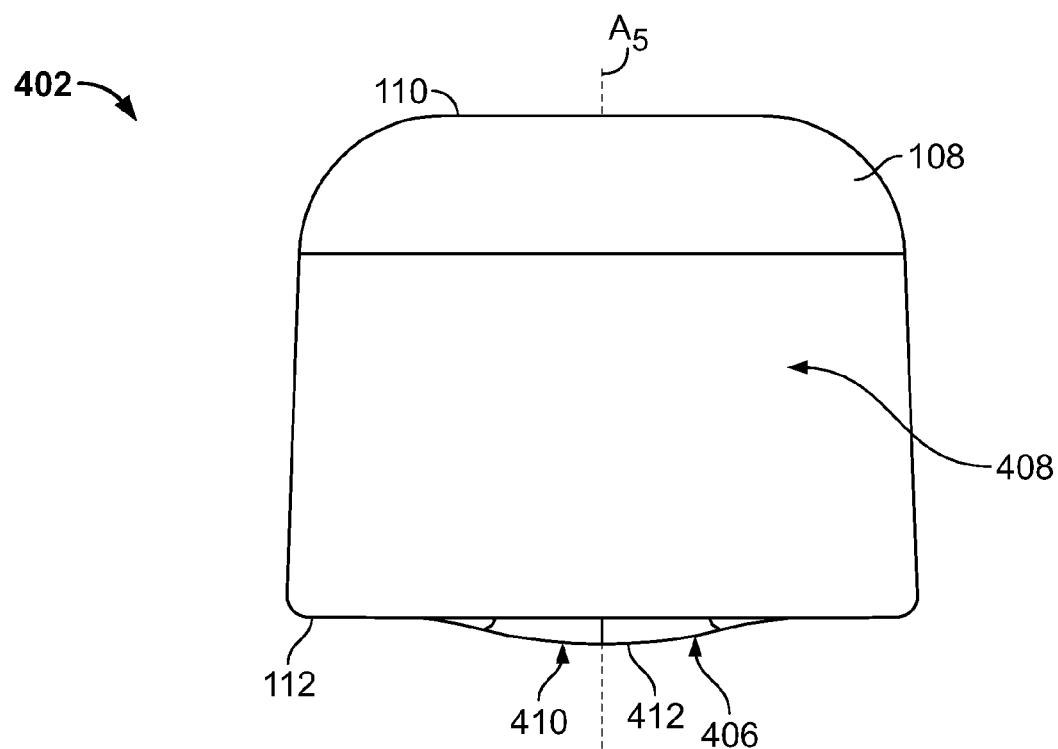
FIG. 61 is a rear view of a cover of an exemplary monitoring device according to the present disclosure.
Figure 62:
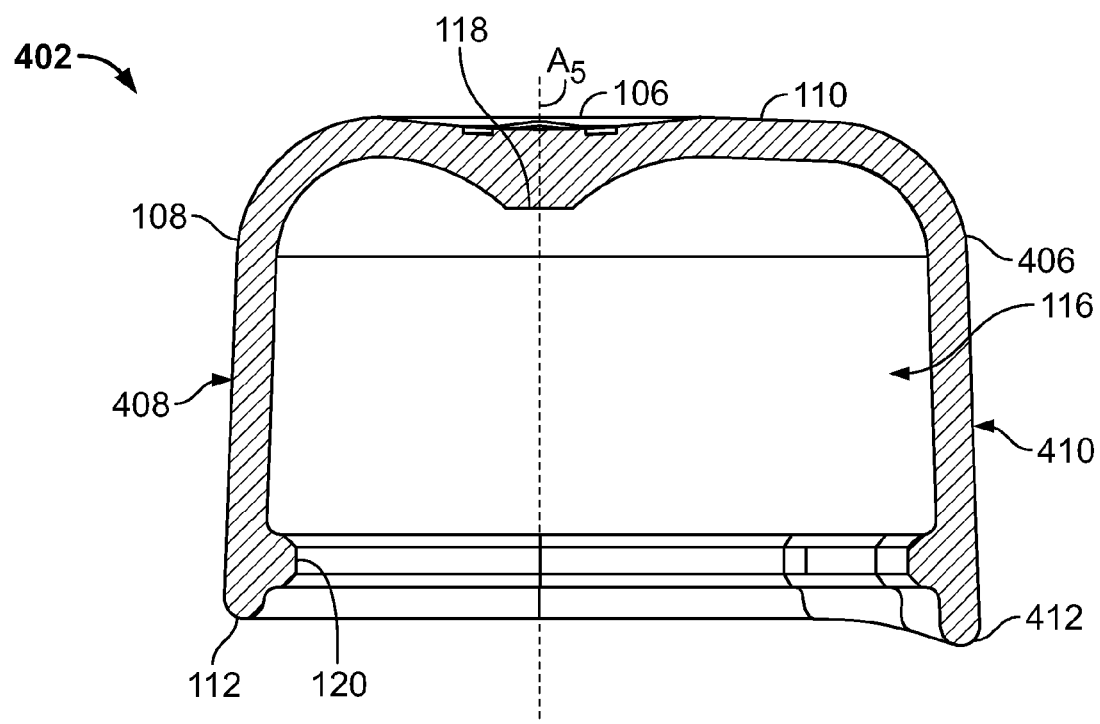
FIG. 62 is a side cross-sectional view of a cover of an exemplary monitoring device according to the present disclosure.
Figure 63:
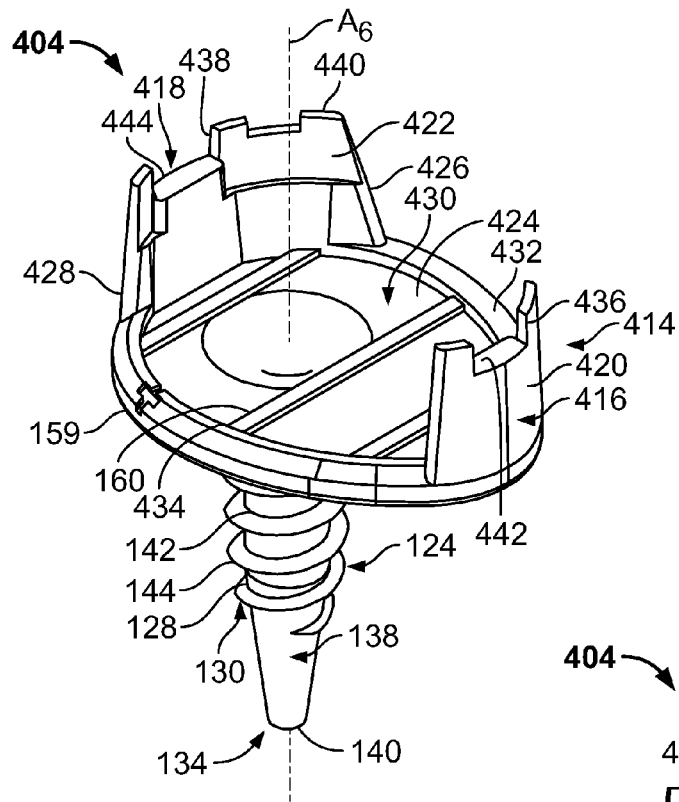
FIG. 63 is a top perspective view of a base of an exemplary monitoring device according to the present disclosure.
Figure 64:
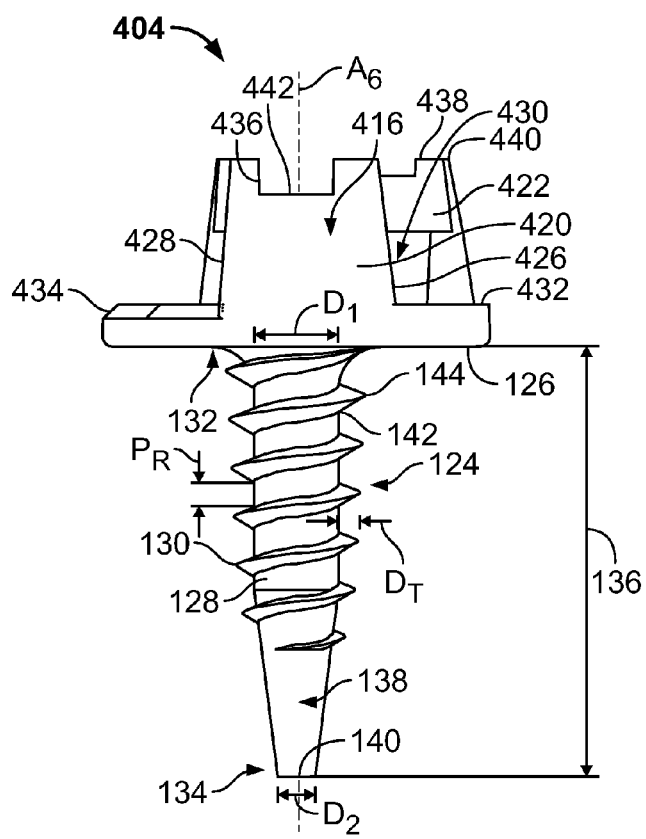
FIG. 64 is a front view of a base of an exemplary monitoring device according to the present disclosure.
Figure 65:
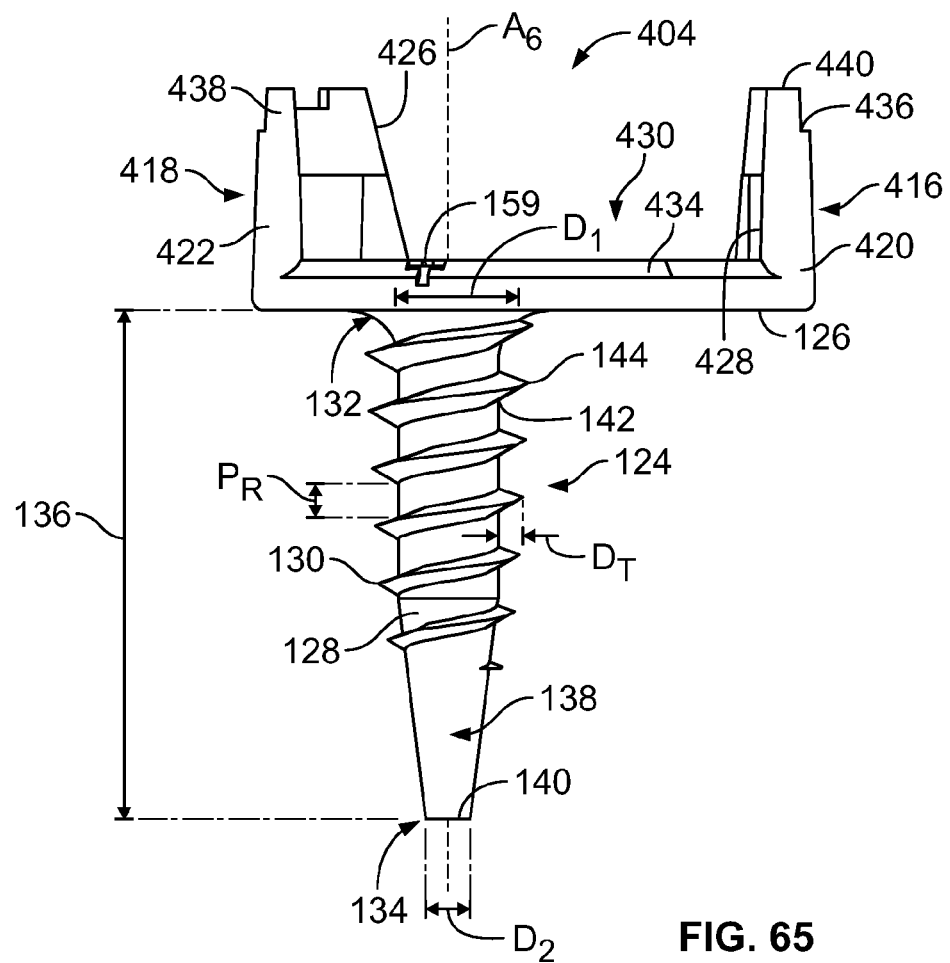
FIG. 65 is a side view of a base of an exemplary monitoring device according to the present disclosure.
Figure 66:
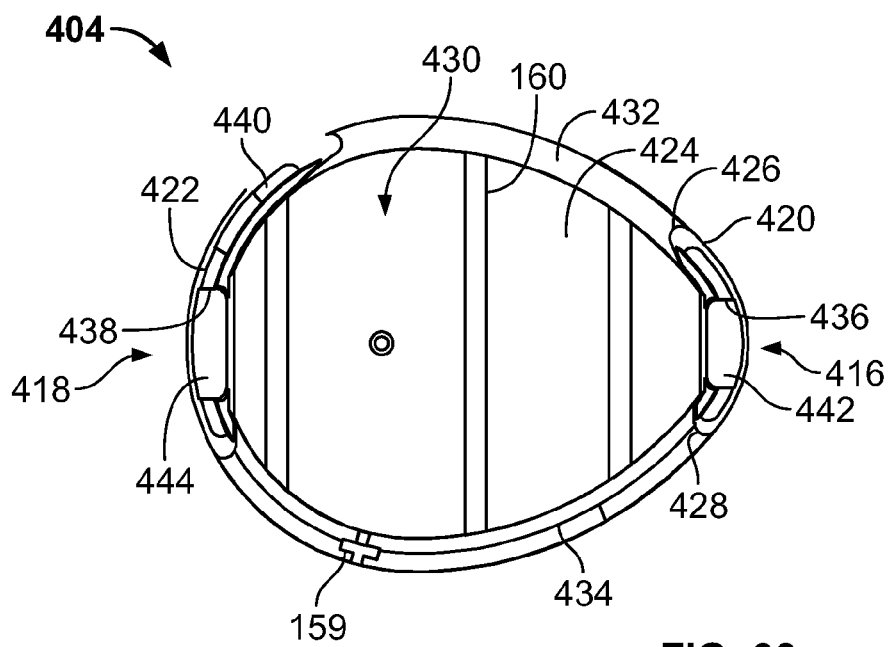
FIG. 66 is a top view of a base of an exemplary monitoring device according to the present disclosure.
Figure 67:
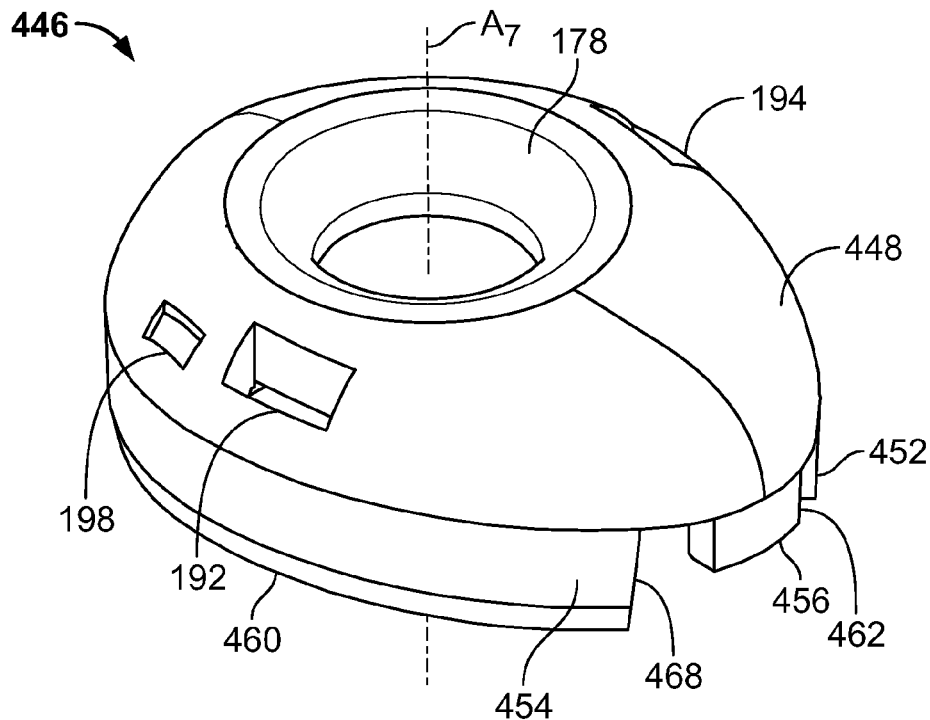
FIG. 67 is a top perspective view of a cap of an exemplary monitoring device according to the present disclosure.
Figure 68:
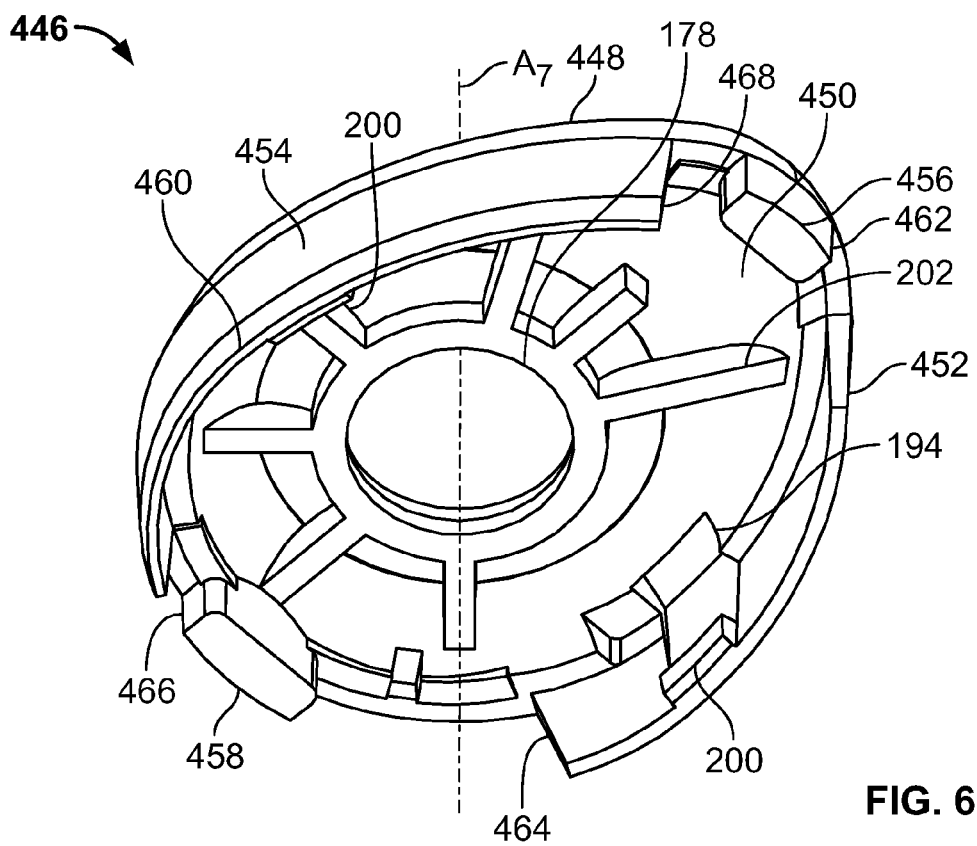
FIG. 68 is a bottom perspective view of a cap of an exemplary monitoring device according to the present disclosure.
Figure 69:
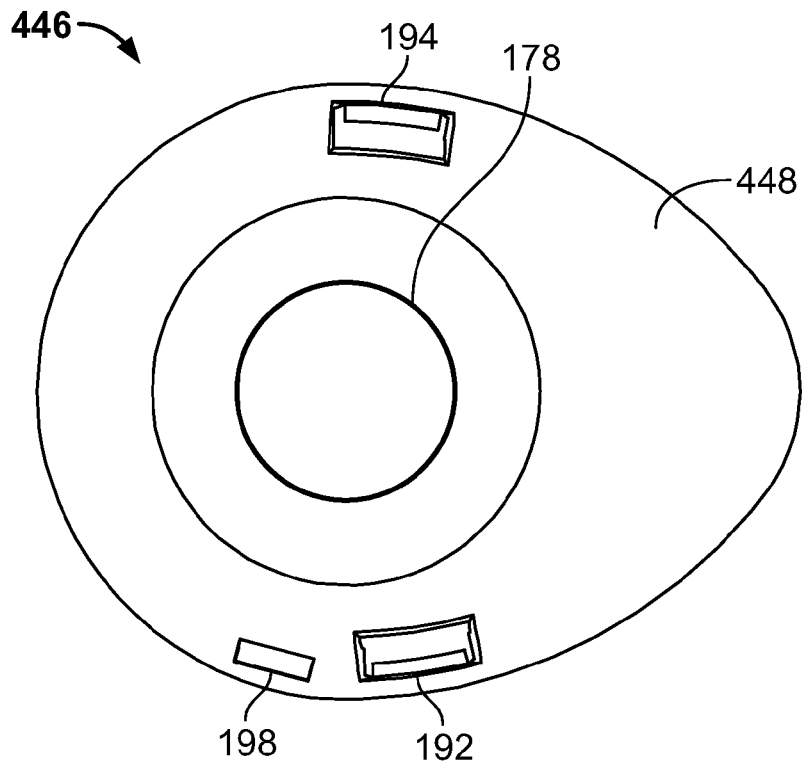
FIG. 69 is a top view of a cap of an exemplary monitoring device according to the present disclosure.
Figure 70:
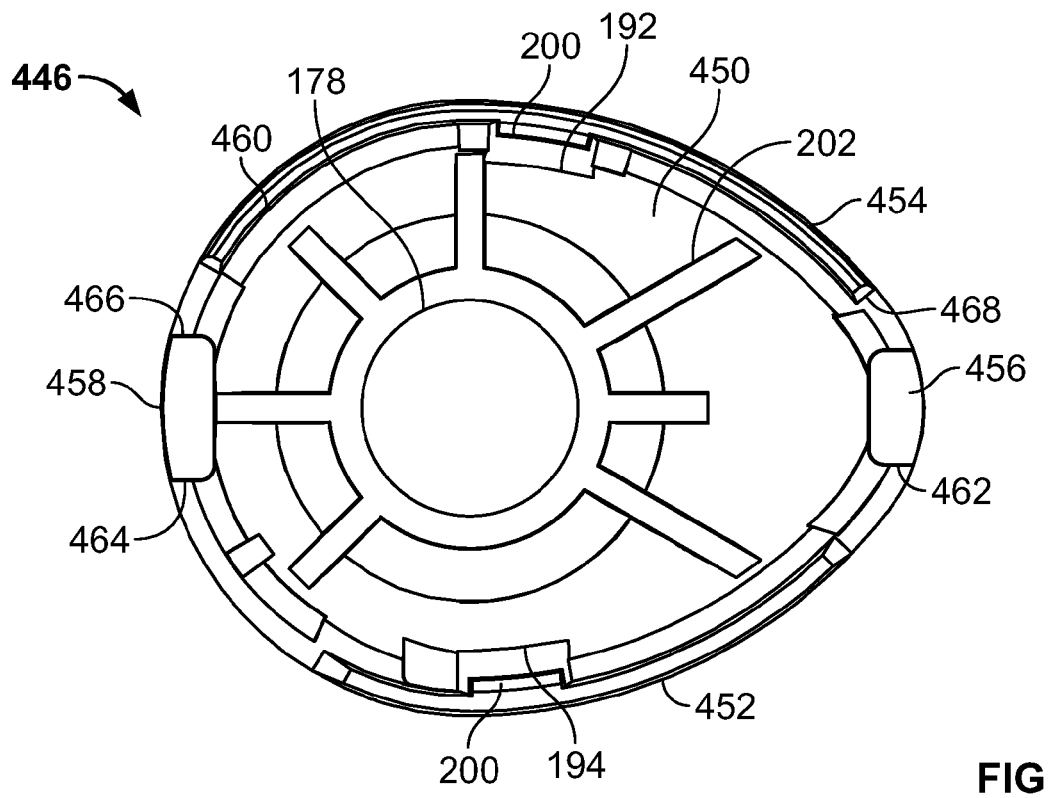
FIG. 70 is a bottom view of a cap of an exemplary monitoring device according to the present disclosure.
Figure 71:
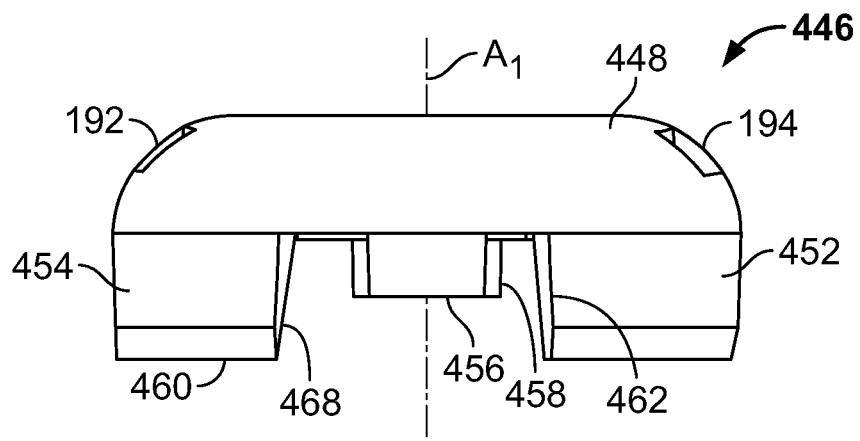
FIG. 71 is a front view of a cap of an exemplary monitoring device according to the present disclosure.
Figure 72:
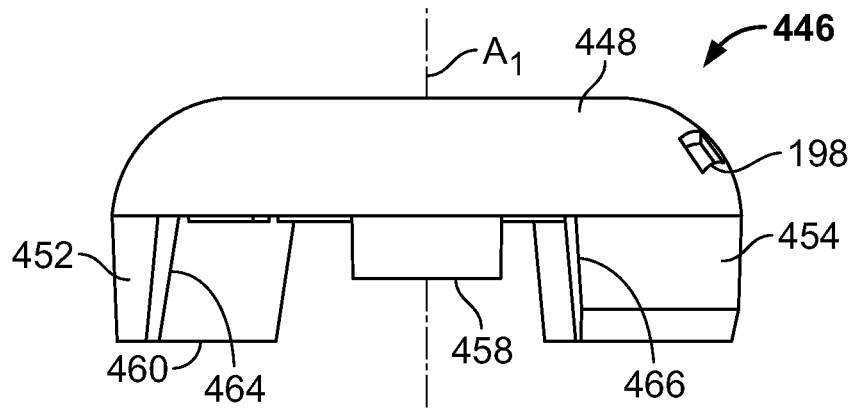
FIG. 72 is a rear view of a cap of an exemplary monitoring device according to the present disclosure.
Figure 73:
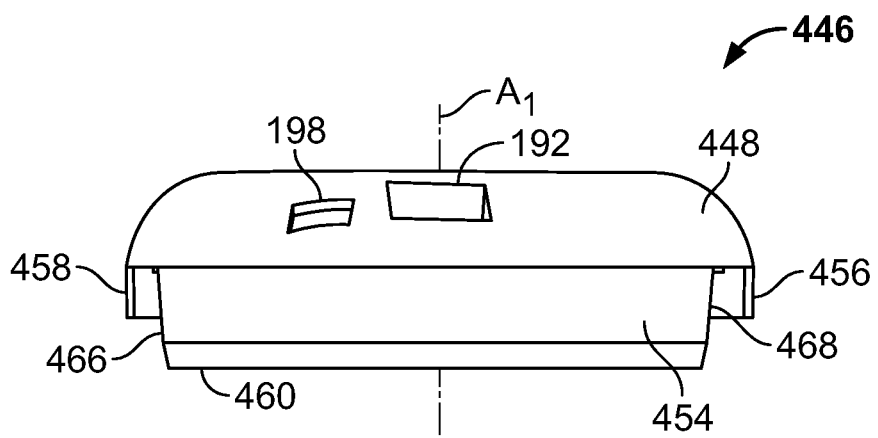
FIG. 73 is a side view of a cap of an exemplary monitoring device according to the present disclosure.
Figure 74:
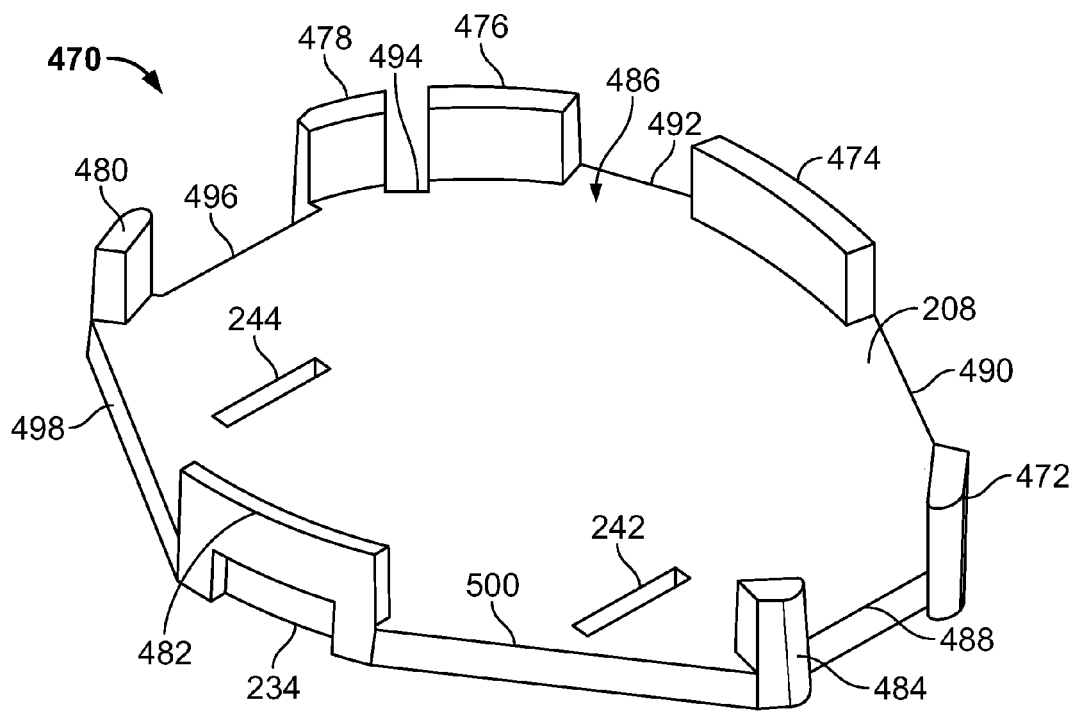
FIG. 74 is a top perspective view of a chassis of an exemplary monitoring device according to the present disclosure.
Figure 75:
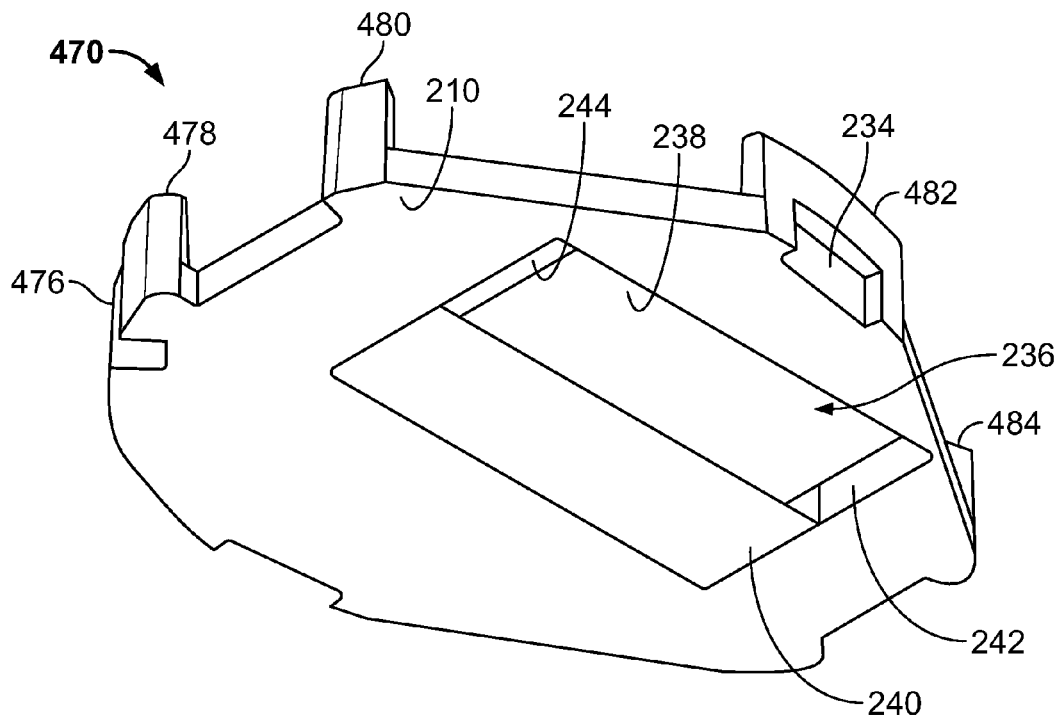
FIG. 75 is a bottom perspective view of a chassis of an exemplary monitoring device according to the present disclosure.
Figure 76:
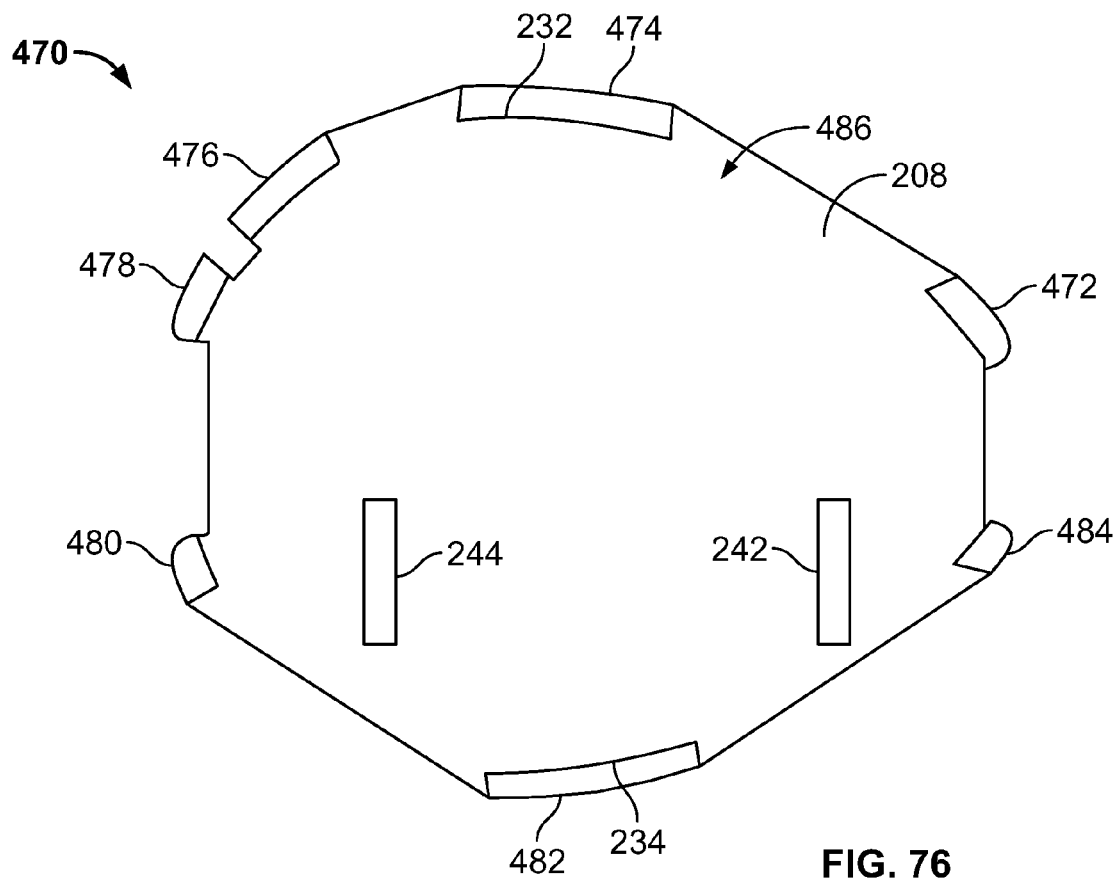
FIG. 76 is a top view of a chassis of an exemplary monitoring device according to the present disclosure.
Figure 77:
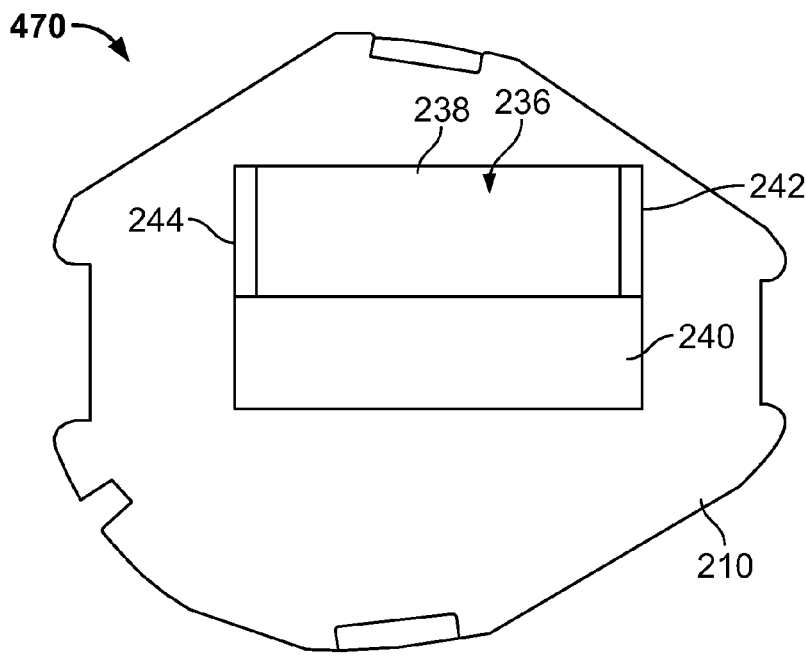
FIG. 77 is a bottom view of a chassis of an exemplary monitoring device according to the present disclosure.
Figure 78:
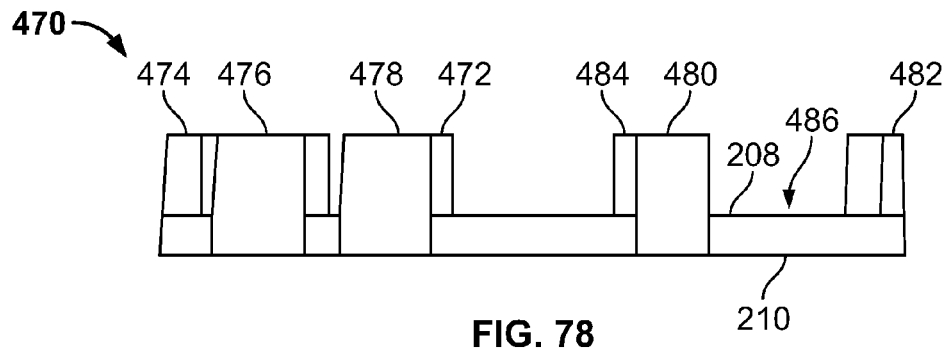
FIG. 78 is a rear view of a chassis of an exemplary monitoring device according to the present disclosure.
Figure 79:
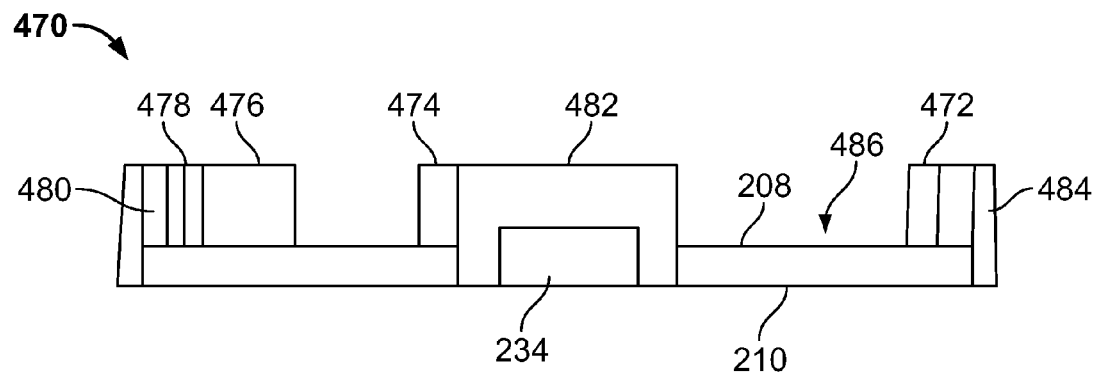
FIG. 79 is a side view of a chassis of an exemplary monitoring device according to the present disclosure.
Figure 80:
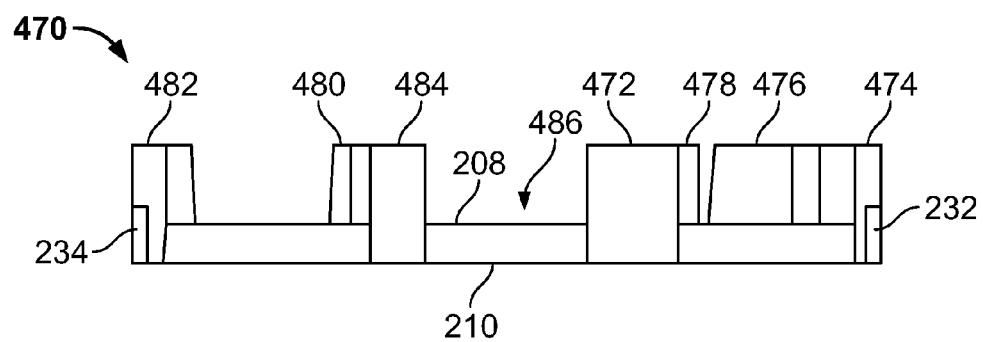
FIG. 80 is a front view of a chassis of an exemplary monitoring device according to the present disclosure.
Figure 81:
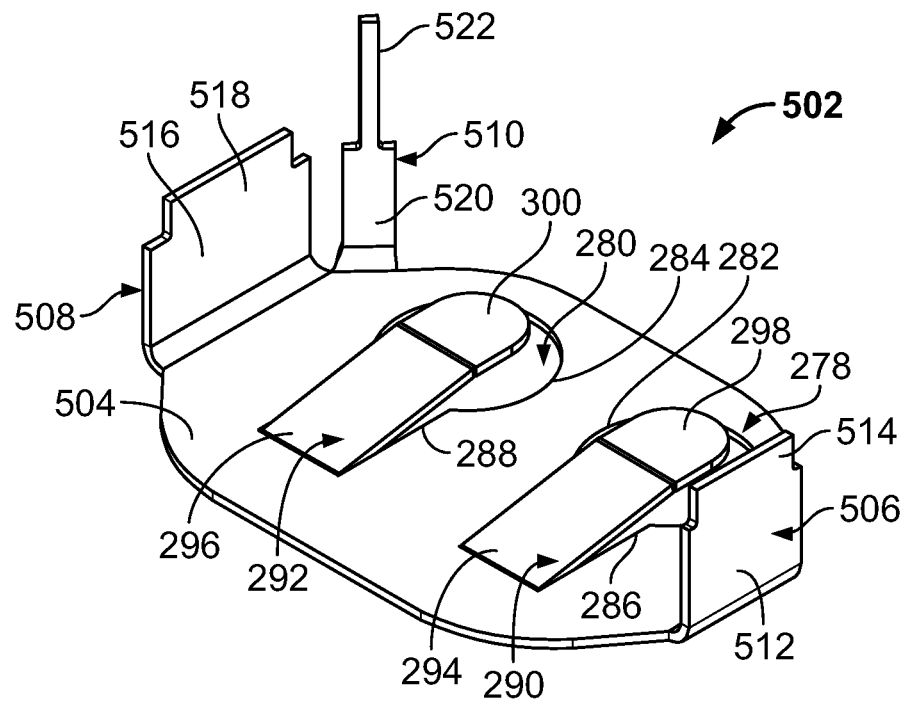
FIG. 81 is a top perspective view of a positive electrical contact of an exemplary monitoring device according to the present disclosure.
Figure 82:
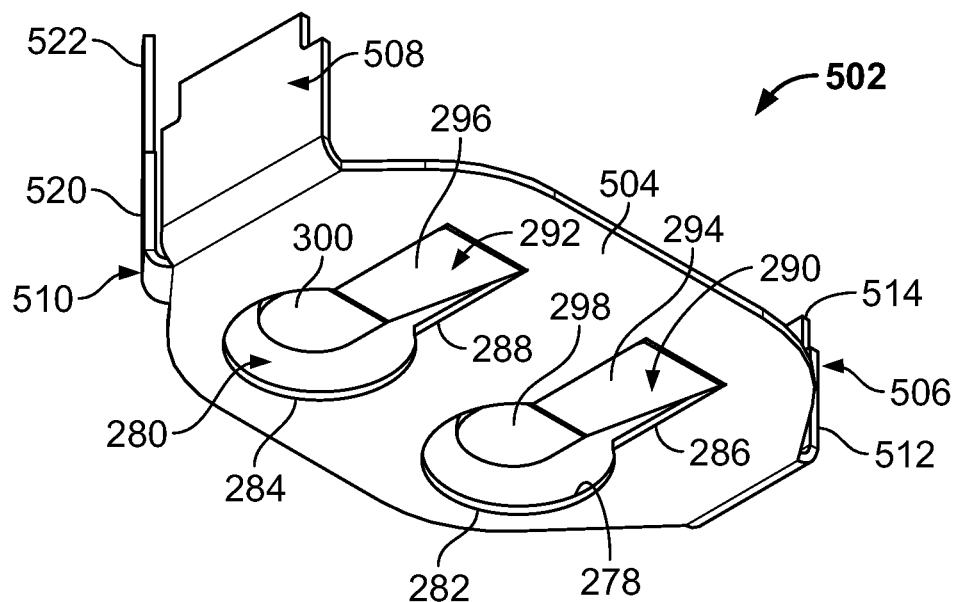
FIG. 82 is a bottom perspective view of a positive electrical contact of an exemplary monitoring device according to the present disclosure.
Figure 83:
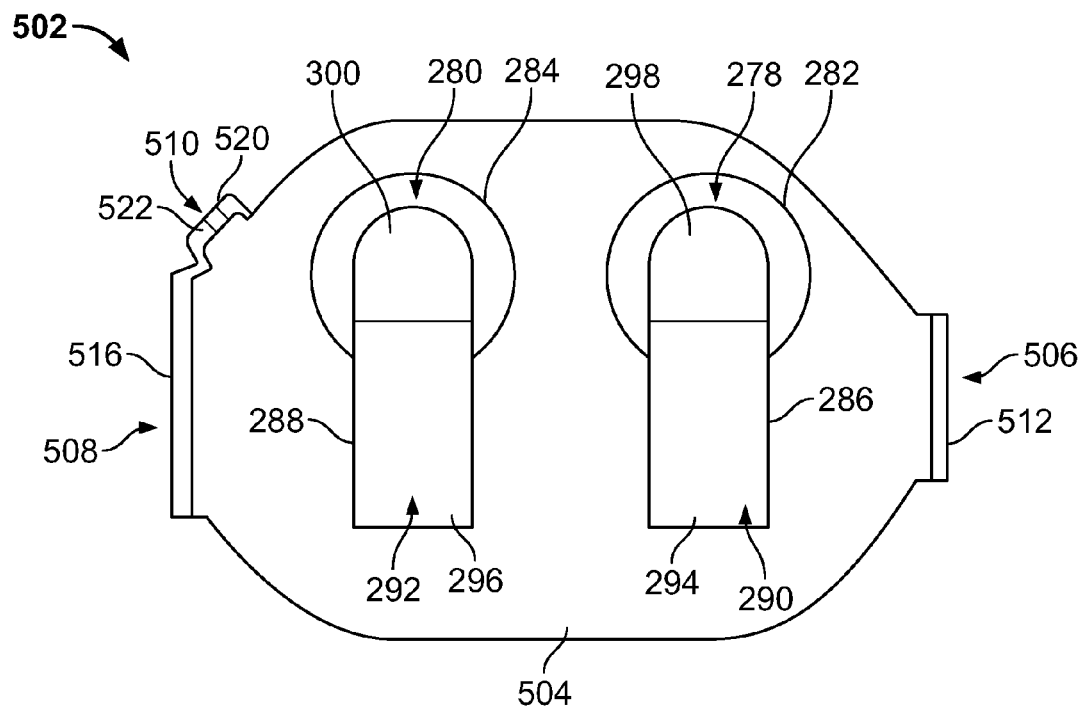
FIG. 83 is a top view of a positive electrical contact of an exemplary monitoring device according to the present disclosure.
Figure 84:
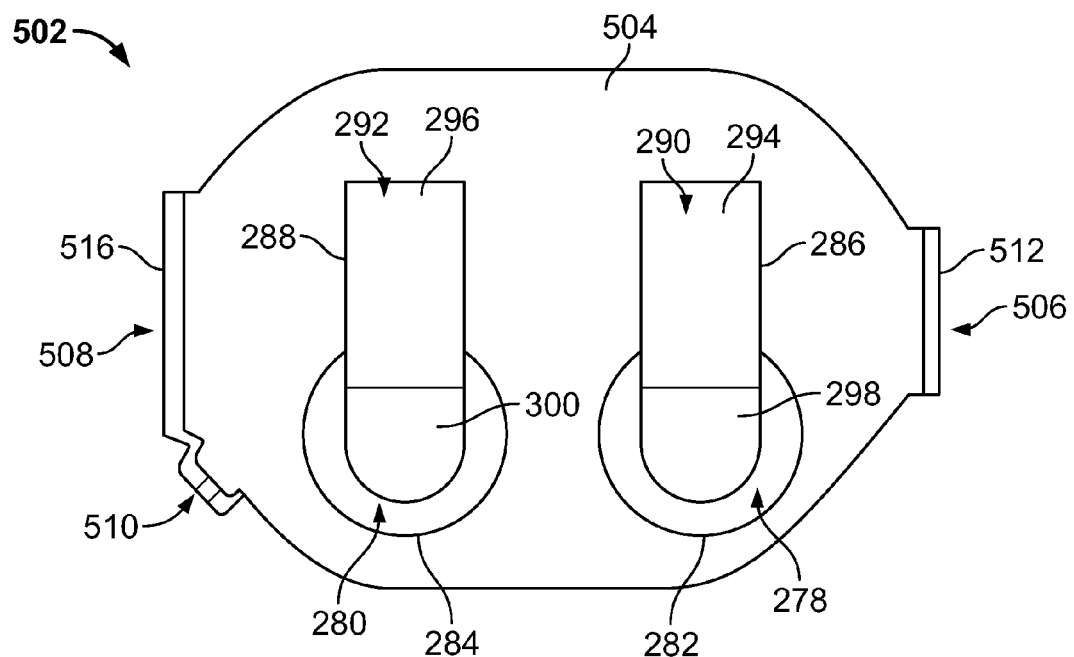
FIG. 84 is a bottom perspective view of a positive electrical contact of an exemplary monitoring device according to the present disclosure.
Figure 85:
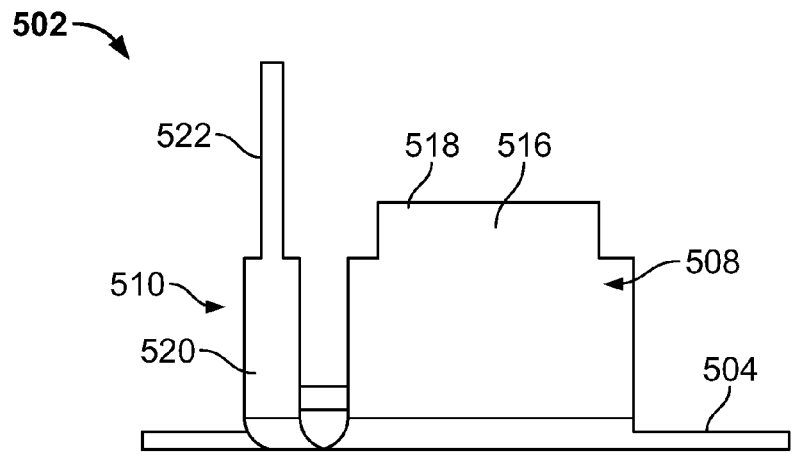
FIG. 85 is a side view of a positive electrical contact of an exemplary monitoring device according to the present disclosure.
Figure 86:
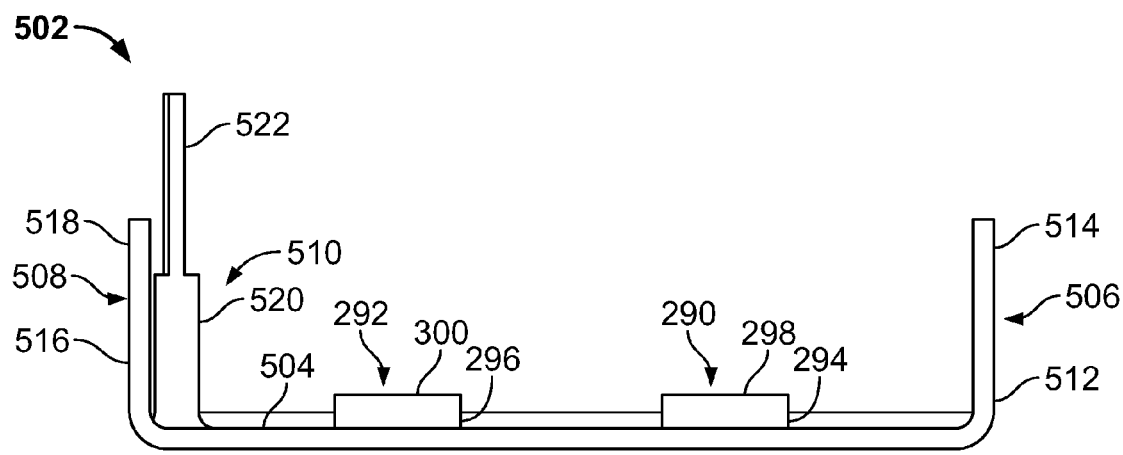
FIG. 86 is a front view of a positive electrical contact of an exemplary monitoring device according to the present disclosure.
Figure 87:
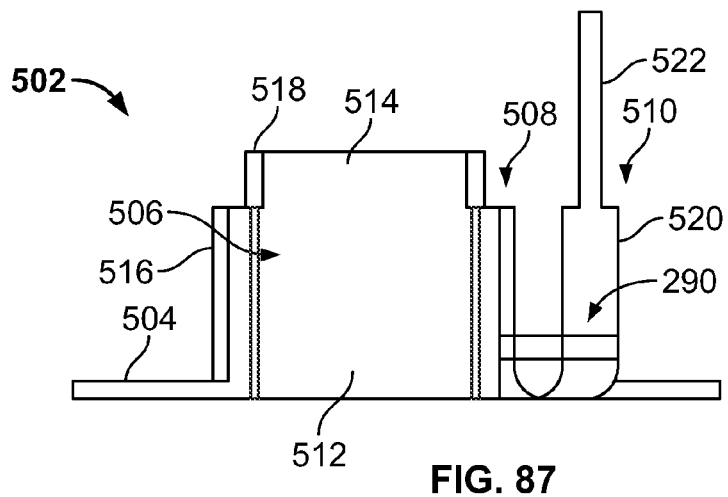
FIG. 87 is a side view of a positive electrical contact of an exemplary monitoring device according to the present disclosure.

FIG. 52 shows a side cross-sectional view of the device 100 in an assembled configuration. In particular, the device 100 includes the cover 102, the base 104, the cap 172, the chassis 206, the positive electrical contact 254, the negative electrical contact 306, and the PCB 246. As can been seen in FIG. 52, the PCB 246 can be positioned on top of and be supported by the top surface of the first, second, third and fourth walls 212, 214, 216, 218 of the chassis 206. The cover 102 can be assembled relative to the base and cap assembly 340 by at least partially positioning the base and cap assembly 340 into the interior portion 116 of the cover 102 and providing an upward force on the base and cap assembly 340 (and/or a downward force on the cover 102) in the direction of the central vertical axis $A_1$ to snap the circumferential flange 120 of the cover 102 over the edge of the bottom surface 126 of the base 104. In some embodiments, the cover 102 can be fabricated from a resilient yet flexible material such that the cover 102 can flex slightly to snap over the edge of the bottom surface 126 of the base 104. The cover 102 can thereby be releasably interlocked relative to the base and cap assembly 340 to maintain the components of the cap assembly 338 in a weather and/or water-resistant environment. In some embodiments, the cover 102 can be prevented from rotating relative to the cap assembly 338 due to friction between the cover 102 and the cap assembly 338. It should be understood that in order to insert and/or change a battery, the cover 102 can be pulled off the base and cap assembly 340 to expose the inner passage 328 between the positive and negative electrical contacts 254, 306. Thus, the exemplary device 100 monitors performance characteristics associated with user activities involving a swinging instrument, maintains the battery in a secure housing during use of the device 100, and provides convenient access to the battery for replacement and/or insertion.

Turning now to FIGS. 53-102, an alternative exemplary embodiment of a device for monitoring and/or tracking performance characteristics associated with user activities involving swinging instruments 400 (hereinafter "device 400") is provided. It should be understood that the device 400 can be substantially similar in structure and function to the device 100 of FIGS. 1-52, except for the distinctions noted herein. Thus, like structural elements are marked with like reference characters. In particular, the one distinction between the device 400 and the device 100 is that the components define a non-circular, an off-center or an egg-shaped configuration rather than the circular configuration of the device 100. In some embodiments, the device 100 can be used for an iron golf club and the device 400 can be used for a putter golf club. The difference in configurations can provide a visual distinction to a user such that a user can continuously select the appropriate device 100, 400 for a particular golf club. In some embodiments, the off-center configuration of the device 400 can accommodate different firmware to detect shots of a different severity for a putter. In some embodiments, the off-center configuration of the device 400 can conform to the off-center configuration of the end of a putter grip.

With reference to FIGS. 53-57, perspective, side and rear views of the device 400 are provided. The device 400 includes a cover 402 and a base 404. The cover 402 can protect the internal components of the device 400 by housing the internal components in a weather and/or water-resistant environment within the cover 402. With reference to FIGS. 58-62, perspective, side, front, rear and cross-sectional views of the cover 402 are provided. The cover 402 can define a substantially egg-shaped configuration. Thus, rather than defining a circular configuration (e.g., the cover 102), the cover 402 includes an off-center extension 406 which extends away from a vertical axis $A_5$. The vertical axis $A_5$ can be centered relative to the circular portion of the cover 402, thereby being positioned closer to the rear 408 of the cover 402 than the front 410 of the cover 402. The bottom surface 112 of the cover 402 can extend along one plane along a portion of the bottom surface 112 and can be angled in a downward direction at the front 410 of the cover. For example, the bottom surface 112 can include a curved extension 412 in a downward direction away from the circumferential flange 120.

With reference to FIGS. 63-66, perspective, front, side and top views of an exemplary base 404 are provided. The base 404 includes a support portion 414 and a fastening portion 124. The support portion 414 can define a substantially egg-shaped configuration complementary to the cover 402. The fastening portion 124 can be aligned with a vertical axis $A_6$ which is offset from the midpoint between a front 416 and a rear 418 of the support portion 414. The support portion 414 includes first and second walls 420, 422 circumferentially extending from a support surface 424 in a direction parallel to the vertical axis $A_6$. The first and second walls 420, 422 can be positioned at substantially opposing sides of the support surface 424 and can form first and second side openings 426, 428 located between the first and second walls 420, 422.

The circumferential distance of the first side opening 426 between the first and second walls 420, 422 can be dimensioned smaller than the circumferential distance of the second side opening 428. In some embodiments, the first wall 420 can be symmetrically configured relative to the vertical axis $A_6$ while the second wall 422 can be asymmetrically configured relative to the vertical axis $A_6$. The support surface 424 and the first and second walls 420, 422 can define an interior space 430 configured and dimensioned to house internal components, e.g., a battery, electrical contacts, a printed circuit board, support structures, and the like, which will be discussed in greater detail below. The circumferential distance of the second side opening 428 can be dimensioned to permit a battery to be slid into the interior space 430 through the second side opening 428 without interference from the first and second walls 420, 422. The circumferential distance of the first side opening 426 can be dimensioned to permit insertion of a narrow instrument or device through the first side opening 426 to push the battery out of the interior space 430 through the second side opening 428. In some embodiments, the base 404 can include first and second circumferential lips 432, 434 between the first and second walls 420, 422 extending from the support surface 424 in a direction parallel to the vertical axis $A_6$.

Each of the first and second walls 420, 422 can include a slot 436, 438 extending a partial distance from the top surface 440 in the direction of the support surface 424 in a direction parallel to the vertical axis $A_6$. Each of the first and second walls 420, 422 can further include an interior vertical rib 442, 444 aligned with and positioned below the slots 436, 438. The slots 436, 438 and the vertical ribs 442, 444 can provide a space configured and dimensioned to receive complementary extensions from a cap (which will be discussed below) such that the base 404 and the cap can interlock to maintain the internal components therein.

With reference to FIGS. 67-73, perspective, top, bottom, front, rear and side views of an exemplary cap 446 are provided. The cap 446 can define a substantially egg-shaped configuration complementary to the cover 402 and the base 404. The cap 446 includes an outer surface 448, e.g., a top surface, and an interior surface 450. The cap 446 includes first and second walls 452, 454 circumferentially extending form the interior surface 450 along a portion of the circumference of the cap 446 in a direction parallel to a vertical axis $A_7$. The first and second walls 452, 454 can be positioned on opposing sides of the cap 446. The circumferential distance of first wall 452 can be dimensioned smaller than the circumferential distance of the second wall 454. In particular, the circumferential distance of the first wall 452 can be dimensioned complementary to the first side opening 426 of the support portion 414 of the base 404, and the circumferential distance of the second wall 454 can be dimensioned complementary to the second side opening 428 of the support portion 414 of the base 404.

The cap 446 further includes first and second protrusions 456, 458 extending from the interior surface 450 in a direction parallel to the vertical axis $A_7$. The first and second protrusions 456, 458 can extend a partial distance between the interior surface 450 and the bottom surface 460 of the cap 446, e.g., approximately half of the distance of the first and second walls 452, 454. The first and second protrusions 456, 458 can be positioned on opposing sides of the cap 446. In some embodiments, the first protrusion 456 can be dimensioned wider than the second protrusion 458. In particular, the first and second protrusions 456, 458 can be dimensioned complementary to the first and second slots 432, 438 of the support portion 414 of the base 404. The first and second walls 452, 545, and the first and second protrusions 456, 458 can thereby form first, second, third and fourth side openings 462, 464, 466, 468. In particular, the first side opening 462 can be formed between the first wall 452 and the first protrusion 456, the second side opening 464 can be formed between the first wall 452 and the second protrusion 458, the third side opening 466 can be formed between the second wall 454 and the second protrusion 458, and the fourth side opening 468 can be formed between the second wall 454 and the first protrusion 456. The circumferential distance of the second side opening 464 can be dimensioned greater than the first, third and fourth side openings 462, 466, 468 to accommodate the asymmetrical portion of the second wall 422 of the support portion 414 of the base 404.

With reference to FIGS. 74-80, perspective, top, bottom, side and front views of an exemplary chassis 470 are provided. The chassis 470 can be configured and dimensioned complementary to the configuration of the base 404 and the cap 446, e.g., a substantially egg-shaped configuration. The chassis 470 includes first-seventh walls 472-484 extending along the perimeter in a direction away from and perpendicular to the top surface 208. The first-seventh walls 472-484 can form an interior space 486 for housing and/or supporting a printed circuit board. The circumferential distance of the second and sixth walls 474, 482 can be dimensioned greater than the circumferential distance of the first, third, fourth, fifth and seventh walls 472, 476, 478, 480, 484.

The first-seventh walls 476-484 can form first-seventh side openings 488-500 therebetween. In particular, the first side opening 488 can be formed between the first and seventh walls 472, 484, the second side opening 490 can be formed between the first and second walls 472, 474, the third side opening 492 can be formed between the second and third walls 474, 476, the fourth side opening 494 can be formed between the third and fourth walls 476, 478, the fifth side opening 496 can be formed between the fourth and fifth walls 478, 480, the sixth side opening 498 can be formed between the fifth and sixth walls 480, 482, and the seventh side opening 500 can be formed between the sixth and seventh walls 482, 484. It should be understood that the walls 476-484 and the openings 488-500 can be configured and dimensioned to mate with the components of the base 404 and the cap 446.

With reference to FIGS. 81-87, perspective, top, bottom, side and front views of an exemplary positive electrical contact 502 are provided. The positive electrical contact 502 includes a planar body 504 defining a substantially rectangular configuration with chamfered corners. The body 504 includes first, second and third walls 506, 508, 510 extending perpendicularly relative to the body 504 on opposing sides of the body 504. In particular, the third wall 510 can be offset from the second wall 508 and can be positioned along one of the chamfered corners of the body 504.

The first and second walls 506, 508 can define body portions 512, 516, e.g., a substantially rectangular body portions, and a first and second rectangular extensions 514, 518 extending therefrom in a direction parallel to the first and second wall 506, 508, respectively. The extensions 514, 518 can be narrower in width as compared to the first and second walls 506, 508, respectively. The first wall 506 can be narrower in width as compared to the second wall 508. The third wall 510 can define a body portion 520, e.g., a substantially rectangular body portion, and an extension 522 extending therefrom in a direction parallel to the third wall 510.

Figure 88:
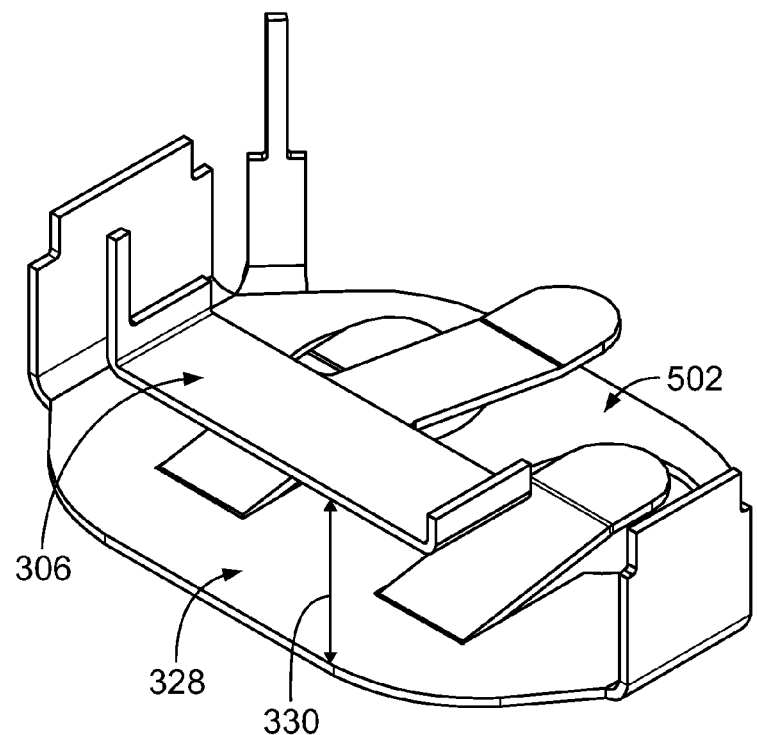
FIG. 88 is a top perspective view of a positive electrical contact and a negative electrical contact of an exemplary monitoring device according to the present disclosure.
Figure 89:
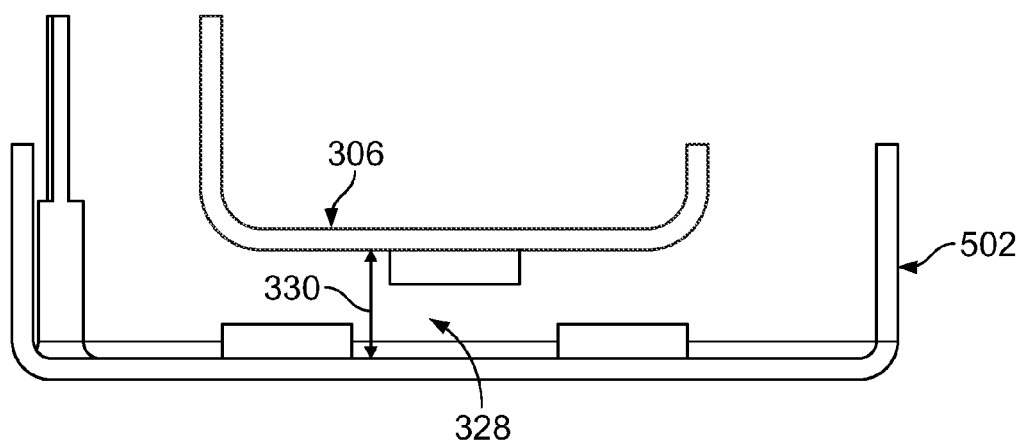
FIG. 89 is a front view of a positive electrical contact and a negative electrical contact of an exemplary monitoring device according to the present disclosure.
Figure 90:
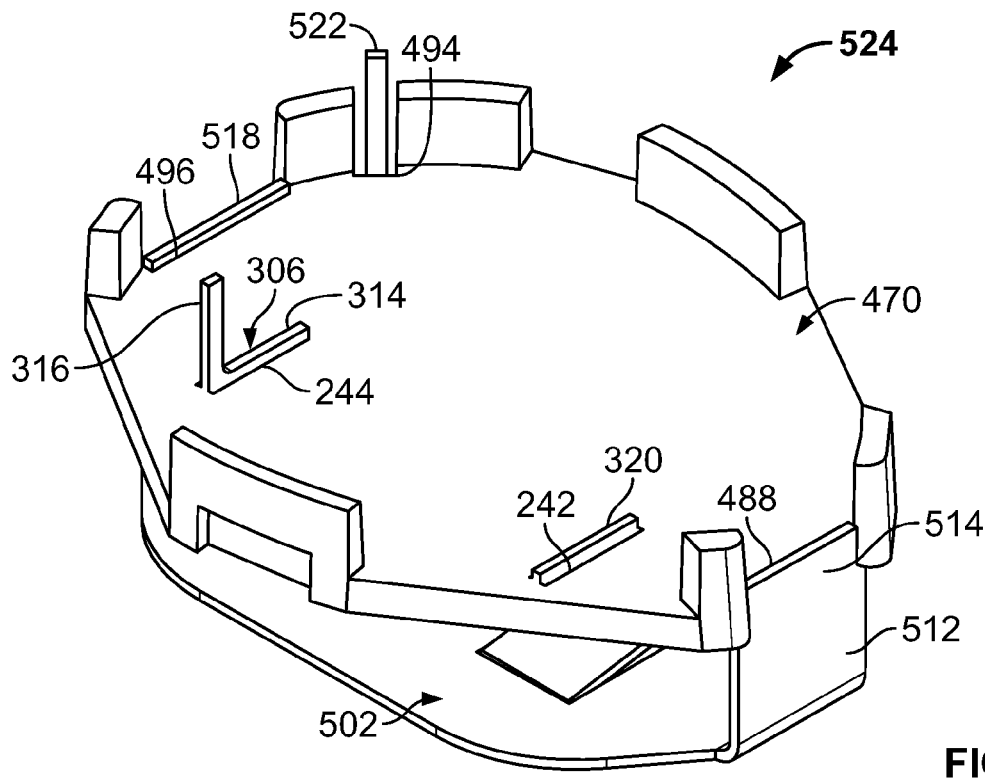
FIG. 90 is a top perspective view of a chassis assembly including a chassis, a positive electrical contact and a negative electrical contact of an exemplary monitoring device according to the present disclosure.
Figure 91:
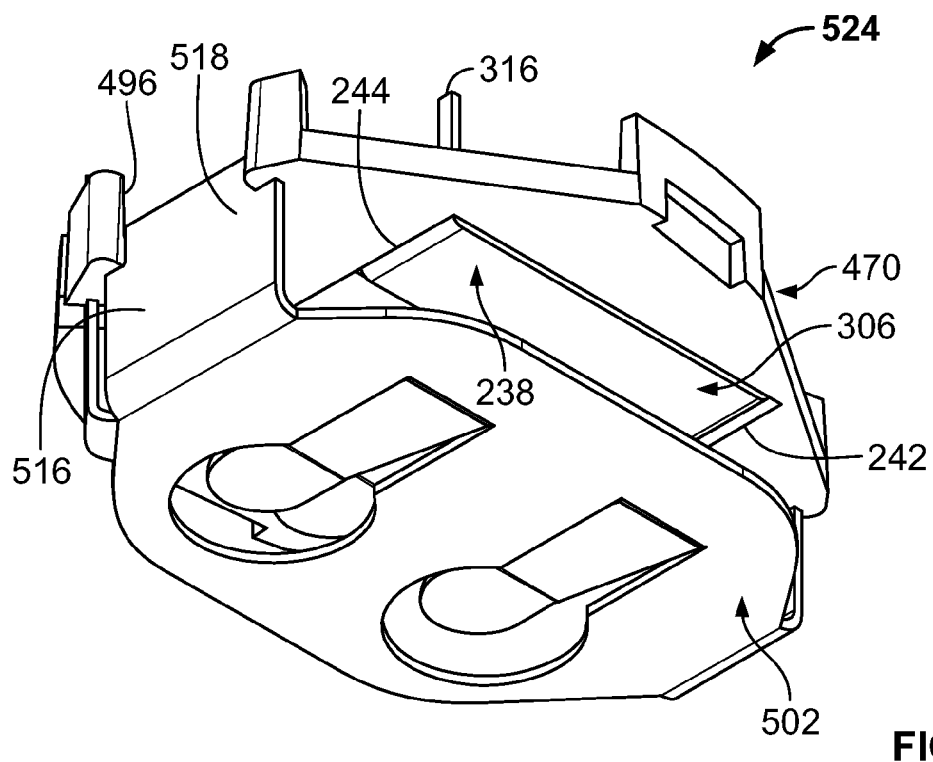
FIG. 91 is a bottom perspective view of a chassis assembly including a chassis, a positive electrical contact and a negative electrical contact of an exemplary monitoring device according to the present disclosure.
Figure 92:
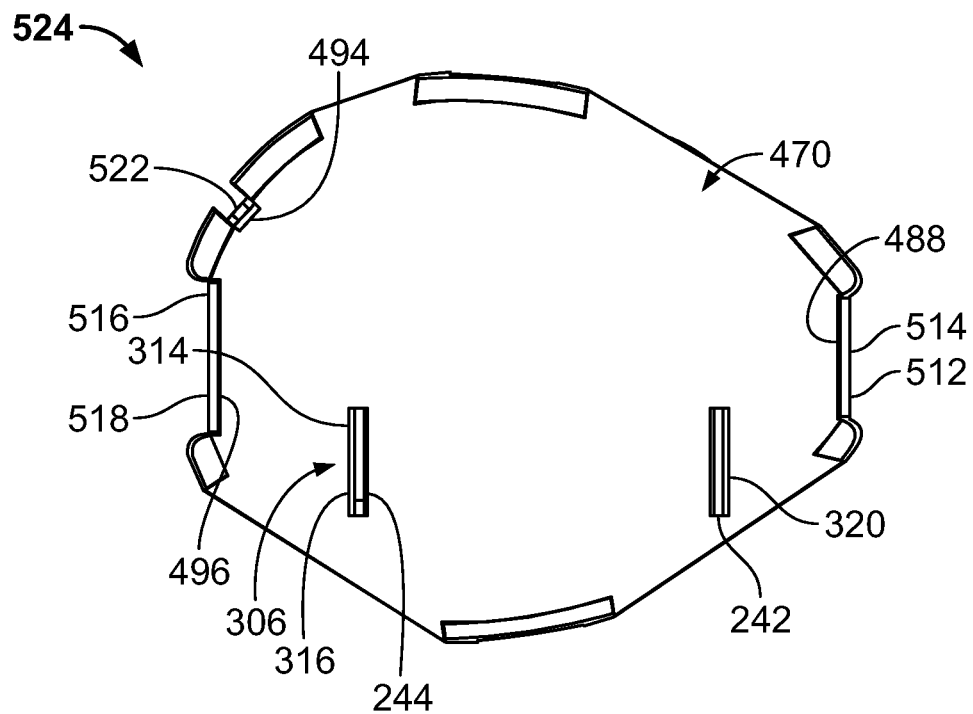
FIG. 92 is a top view of a chassis assembly including a chassis, a positive electrical contact and a negative electrical contact of an exemplary monitoring device according to the present disclosure.
Figure 93:
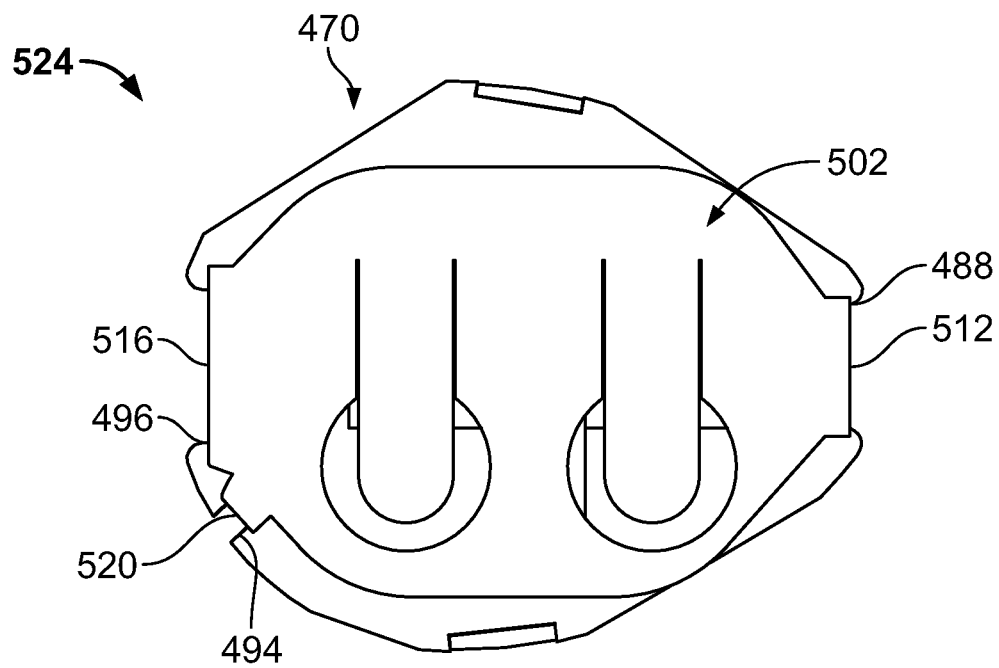
FIG. 93 is a bottom view of a chassis assembly including a chassis, a positive electrical contact and a negative electrical contact of an exemplary monitoring device according to the present disclosure.
Figure 94:
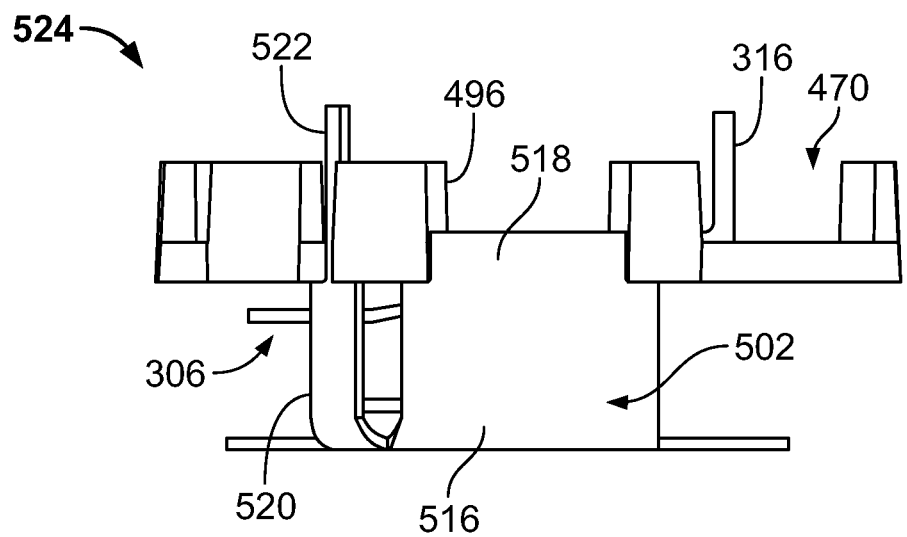
FIG. 94 is a side view of a chassis assembly including a chassis, a positive electrical contact and a negative electrical contact of an exemplary monitoring device according to the present disclosure.
Figure 95:
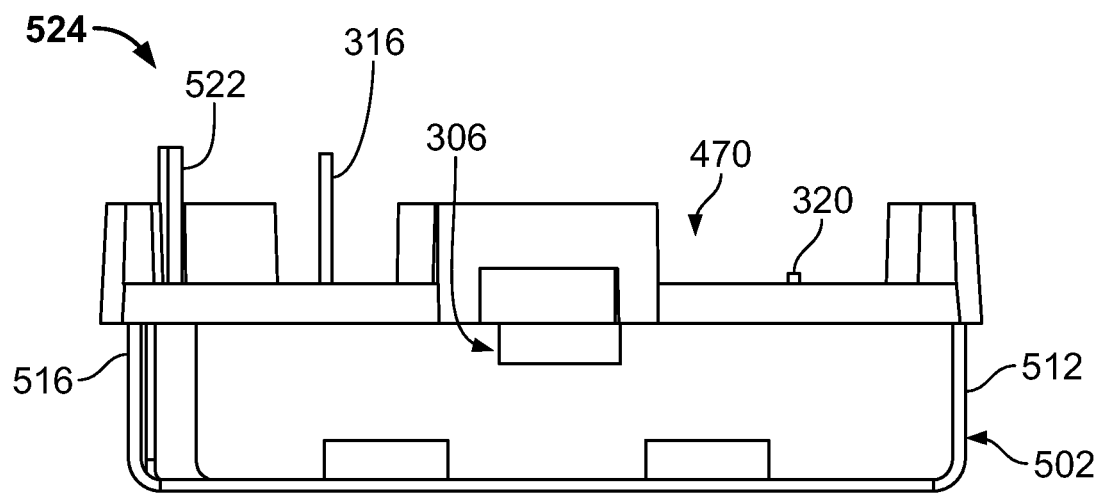
FIG. 95 is a front view of a chassis assembly including a chassis, a positive electrical contact and a negative electrical contact of an exemplary monitoring device according to the present disclosure.
Figure 96:
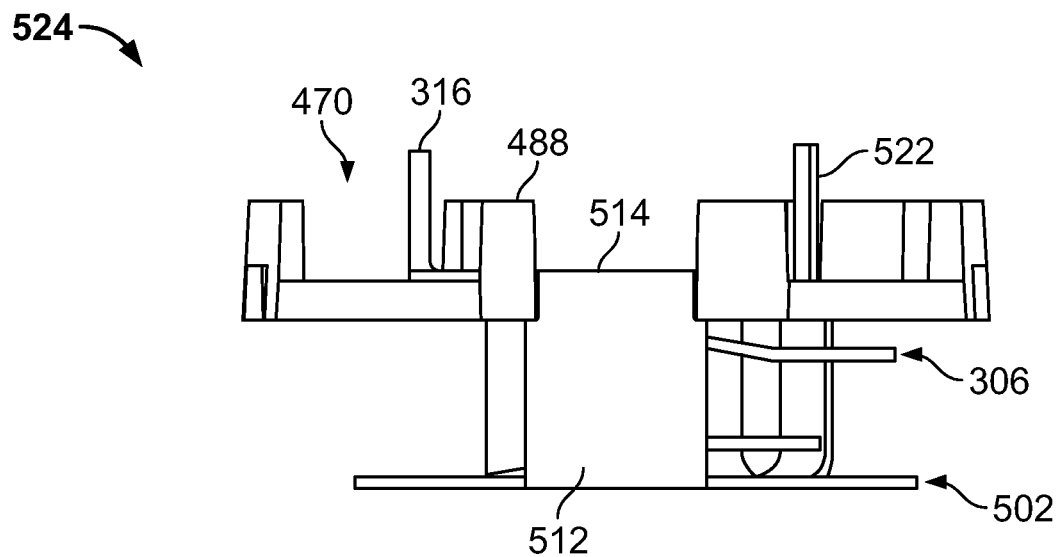
FIG. 96 is a side view of a chassis assembly including a chassis, a positive electrical contact and a negative electrical contact of an exemplary monitoring device according to the present disclosure.

With reference to FIGS. 88 and 89, perspective and front views of the positive electrical contact 502 and the negative electrical contact 306 (see, e.g., FIGS. 30-36) are provided. In particular, FIGS. 88 and 89 illustrate the spaced relationship between the positive and negative electrical contacts 502, 306 which define an inner passage 328 having a height 330 for receiving a battery therein.

FIGS. 90-96 show perspective, top, bottom, side and front views of an exemplary chassis assembly 524 including a chassis 470, a positive electrical contact 502 and a negative electrical contact 306. In particular, the negative electrical contact 306 can be assembled with the chassis 470 by aligning and inserting the body portion 314 and the extension 316 of the negative electrical contact 306 into and through the second electrical slot 244 of the chassis 470, and aligning and inserting the second wall 320 of the negative electrical contact 306 into and through the first electrical slot 242 of the chassis 470. The body 308 of the negative electrical contact 306 can further be received by the deep recess 238 on the bottom surface 210 of the chassis 470. The positive electrical contact 502 can be assembled with the chassis 470 by aligning and inserting the extensions 514, 418, 522 of the positive electrical contact 502 into and at least partially through the first, fifth and fourth side openings 488, 496, 494, respectively. The extensions 316, 522 of the negative and positive electrical contacts 306, 502 can thereby extend above the top surface 208 of the chassis 470.

Figure 97:
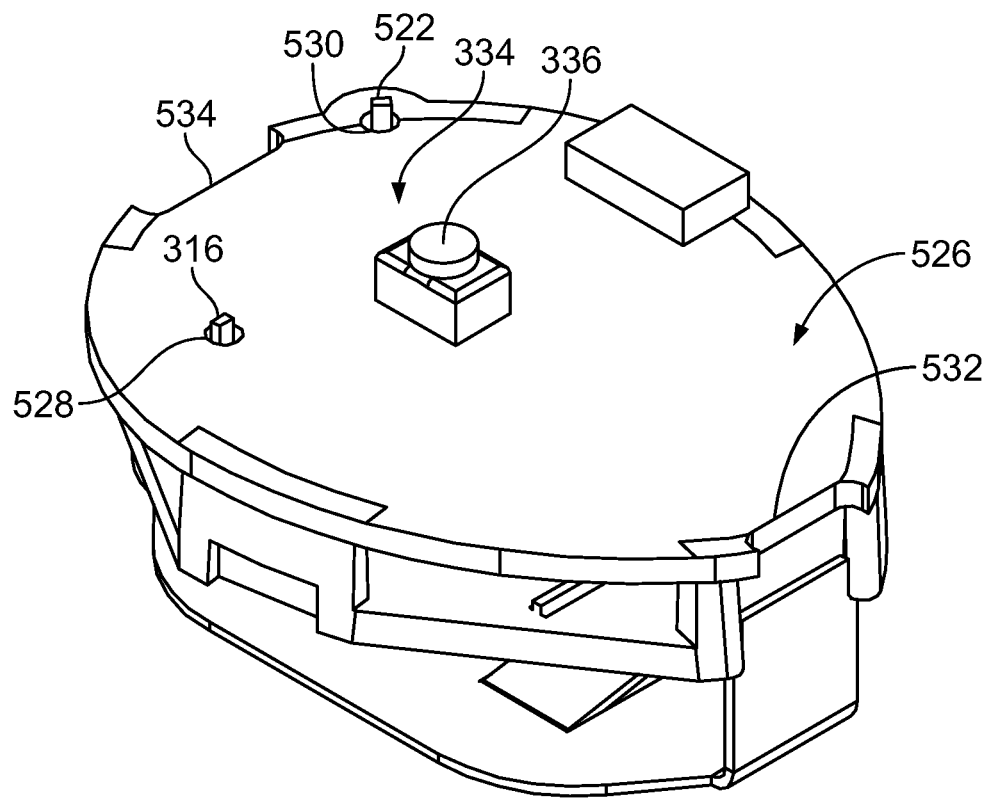
FIG. 97 is a top perspective view of a chassis assembly including a chassis, a positive electrical contact, a negative electrical contact and a printed circuit board of an exemplary monitoring device according to the present disclosure.

FIG. 97 shows a top perspective view of a chassis assembly 524 including a printed circuit board (PCB) 526. The asymmetrical positioning of the extensions 316, 522 of the negative and positive electrical contacts 306, 502 can assist in guiding insertion and proper alignment of the PCB 526. For example, a hole 528 of the PCB 526 can receive the extension 316 and a notch 530 of the PCB 526 can receive the extension 522. In addition, upon positioning the PCB 526 on the top surface of the chassis 470, first and second notches 532, 534 of the PCB 526 can align with the first and fifth side openings 488, 496 of the chassis 470 to permit mating with the cap 446.

Figure 98:
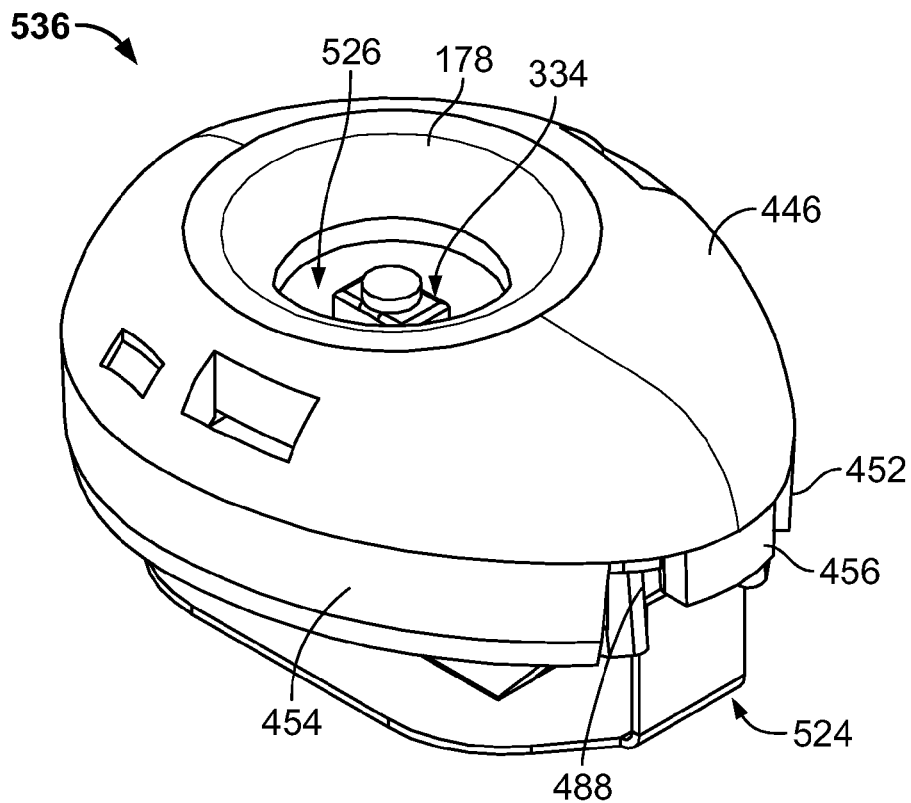
FIG. 98 is a top perspective view of a cap assembly including a chassis assembly and a cap of an exemplary monitoring device according to the present disclosure.
Figure 99:
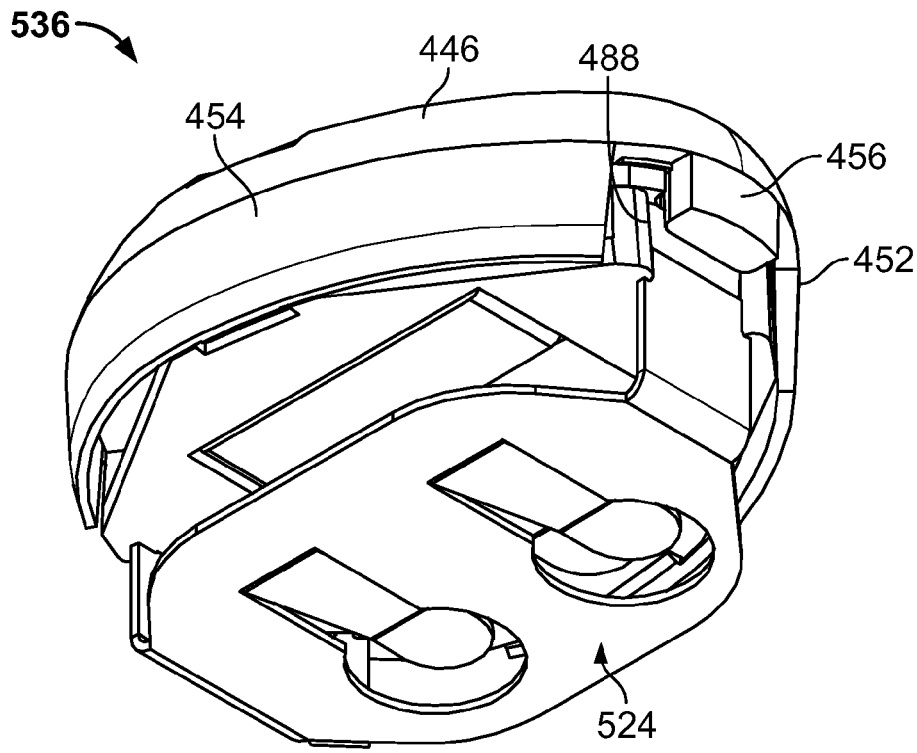
FIG. 99 is a bottom perspective view of a cap assembly including a chassis assembly and a cap of an exemplary monitoring device according to the present disclosure.

With reference to FIGS. 98 and 99, perspective views of an exemplary cap assembly 536 are provided. In particular, the cap assembly 536 includes a chassis assembly 524, a PCB 526 and a cap 446. As discussed above, the protrusions and side openings of the cap 446 and the chassis assembly 524 can mate in the assembled configuration. For example, FIGS. 98 and 99 show the first protrusion 456 of the cap 446 aligned with and inserted through the first side opening 488 of the chassis 470. It should be understood that the second protrusion 458 can be similarly aligned with and inserted through the fifth side opening 496. In the assembled configuration, the actuator 334 of the PCB 526 can be centered relative to the opening 178 of the cap 446. Thus, except for the exposed actuator 334, the PCB 526 can be enclosed by the chassis 502 and the cap 446.

Figure 100:
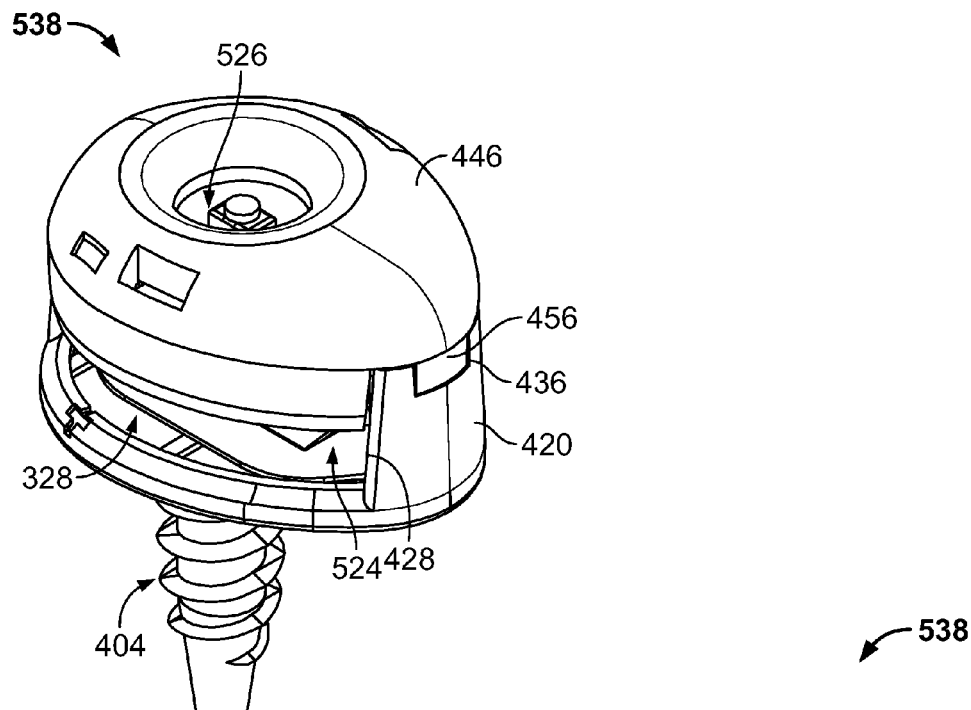
FIG. 100 is a top perspective view of a base and cap assembly including a chassis assembly, a base and a cap of an exemplary monitoring device according to the present disclosure.
Figure 101:
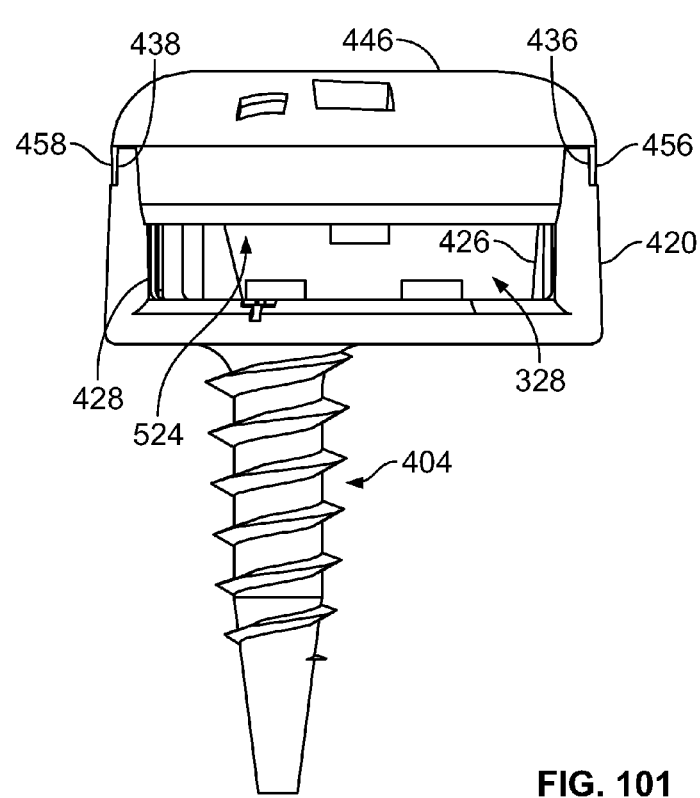
FIG. 101 is a side view of a base and cap assembly including a chassis assembly, a base and a cap of an exemplary monitoring device according to the present disclosure.

FIGS. 100 and 101 show perspective and side views of an exemplary base and cap assembly 538. In particular, the base and cap assembly 538 include a cap 446, a chassis assembly 524, a PCB 526 and a base 404. As discussed above, the protrusions and slots of the cap 446 and the base 404 can mate in the assembled configuration. For example, the first and second protrusions 456, 458 of the cap 446 can be aligned and mated with the first and second slots 436, 438 of the base 404. In some embodiments, the base 404 can be fixedly secured, e.g., ultrasonically welded, snapped, and the like, to the cap assembly 536 such that the base 404 and the cap assembly 536 cannot be separated from each other. The internal components of the cap assembly 536 can thereby be protected from exposure and/or undesired disassembly.

As can be seen in FIG. 101, in the assembled configuration, the inner passage 328 between the positive and negative electrical contacts 502, 306 can be maintained and exposed through a portion of the second side opening 428 in the base 404. Further, in the assembled configuration, a portion of the first side opening 426 in the base 404 can extend into the inner passage 328 on an opposing side of the base and cap assembly 538 relative to the first side opening 428. Thus, a battery can be slid or inserted into the inner passage 328 and pushed into the inner passage 328 until the battery is fully positioned or enclosed within the base and cap assembly 538. For replacement of the battery, an instrument or device, e.g., a golf tee, can be passed through the first side opening 426 to push or eject the battery from the second side opening 428 and out of the inner passage 328.

Figure 102:
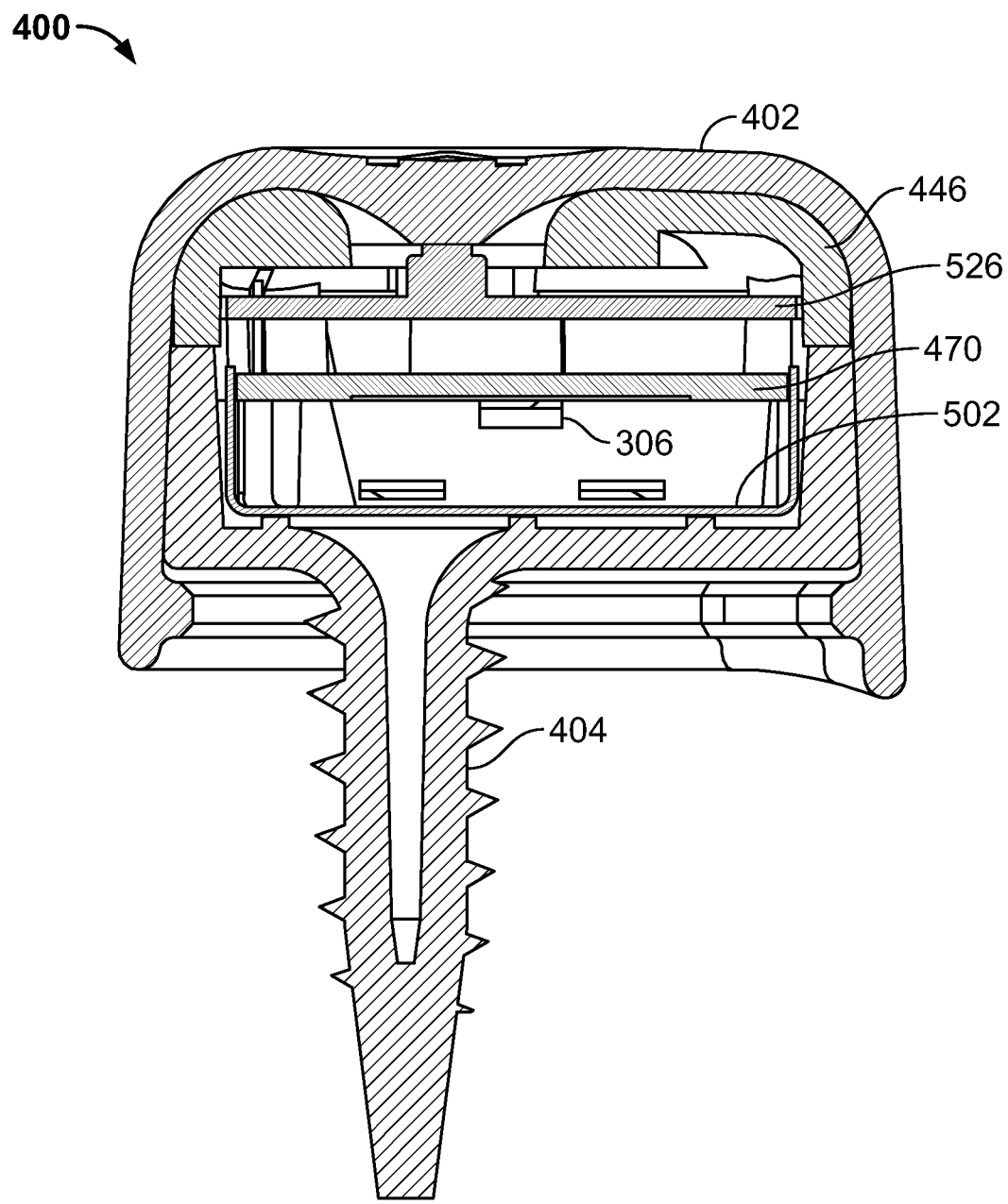
FIG. 102 is a side cross-sectional view of an exemplary monitoring device according to the present disclosure.

FIG. 102 shows a side cross-sectional view of the device 400 in an assembled configuration. In particular, the device 400 includes the cover 402, the base 404, the cap 446, the chassis 470, the positive electrical contact 502, the negative electrical contact 306, and the PCB 526. The cover 402 can be assembled relative to the base and cap assembly 538 by at least partially positioning the base and cap assembly 538 into the interior portion 116 of the cover 402 and providing an upward force on the base and cap assembly 538 (and/or a downward force on the cover 402) to snap the circumferential flange 120 of the cover 402 over the edge of the bottom surface 126 of the base 404. Thus, the exemplary device 400 monitors performance characteristics associated with user activities involving a swinging instrument, maintains the battery in a secure housing during use of the device 400, and provides convenient access to the battery for replacement and/or insertion.

Figure 103:
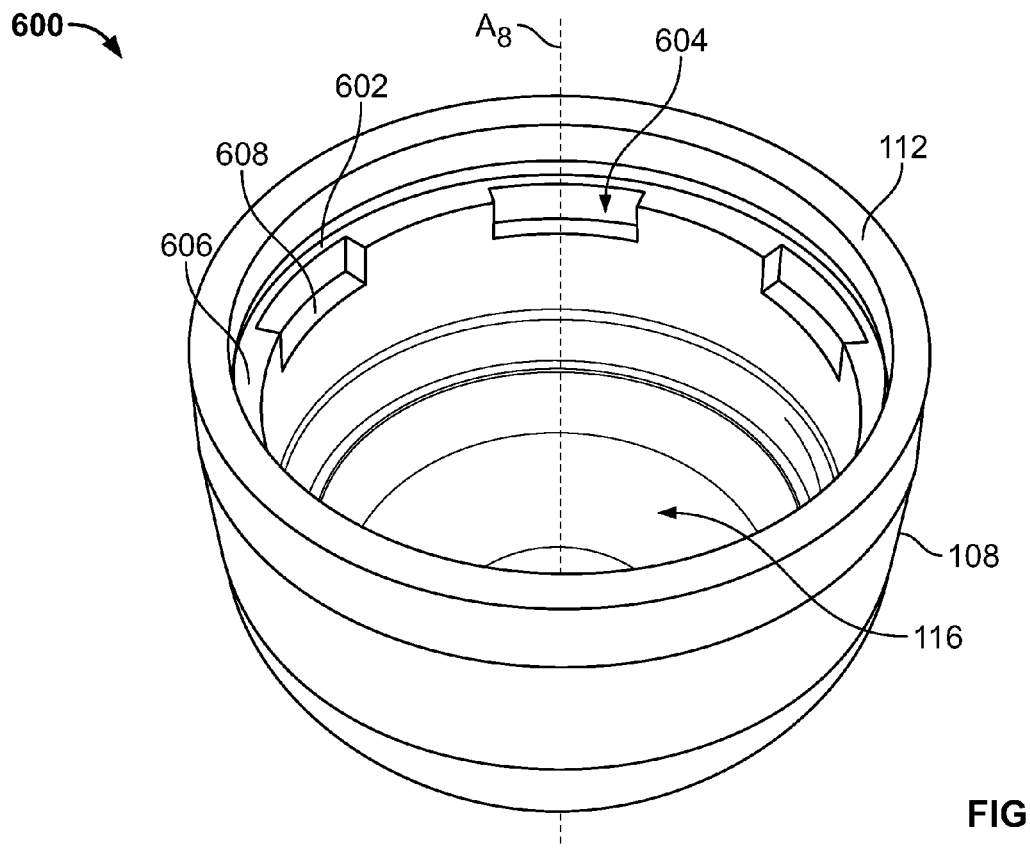
FIG. 103 is a bottom perspective view of a cover of an exemplary monitoring device according to the present disclosure.
Figure 104:
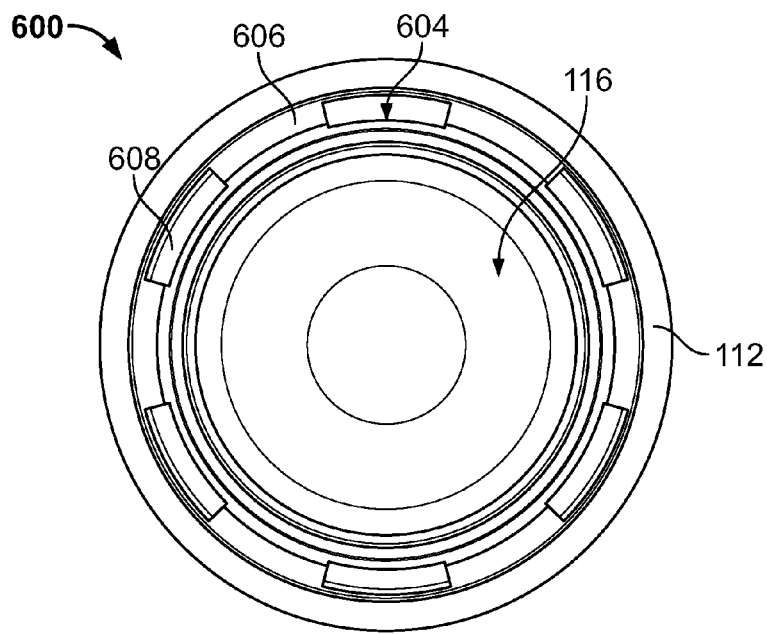
FIG. 104 is a bottom view of a cover of an exemplary monitoring device according to the present disclosure.

Turning now to FIGS. 103-111, an alternative embodiment of an exemplary device is provided. It should be understood that the device can be substantially similar in structure and function to the device 100 of FIGS. 1-52, except for the distinctions noted herein. Thus, like structural elements are marked with like reference characters. FIGS. 103 and 104 show perspective and bottom views of an exemplary cover 600. Rather than including a circumferential flange, the cover 600 can include a circumferential groove 602 offset from the bottom surface 112. Adjacent to the groove 602, the cover 600 further includes undulating features 604. The undulating features 604 can include a plurality of circumferentially positioned male and female members 606, 608, e.g., grooves, configured and dimensioned to receive complementary male and female members of the base. For example, the male members 606 can extend closer to the bottom surface 112 relative to the female members 608 in a direction substantially parallel to the central vertical axis $A_8$.

Figure 105:
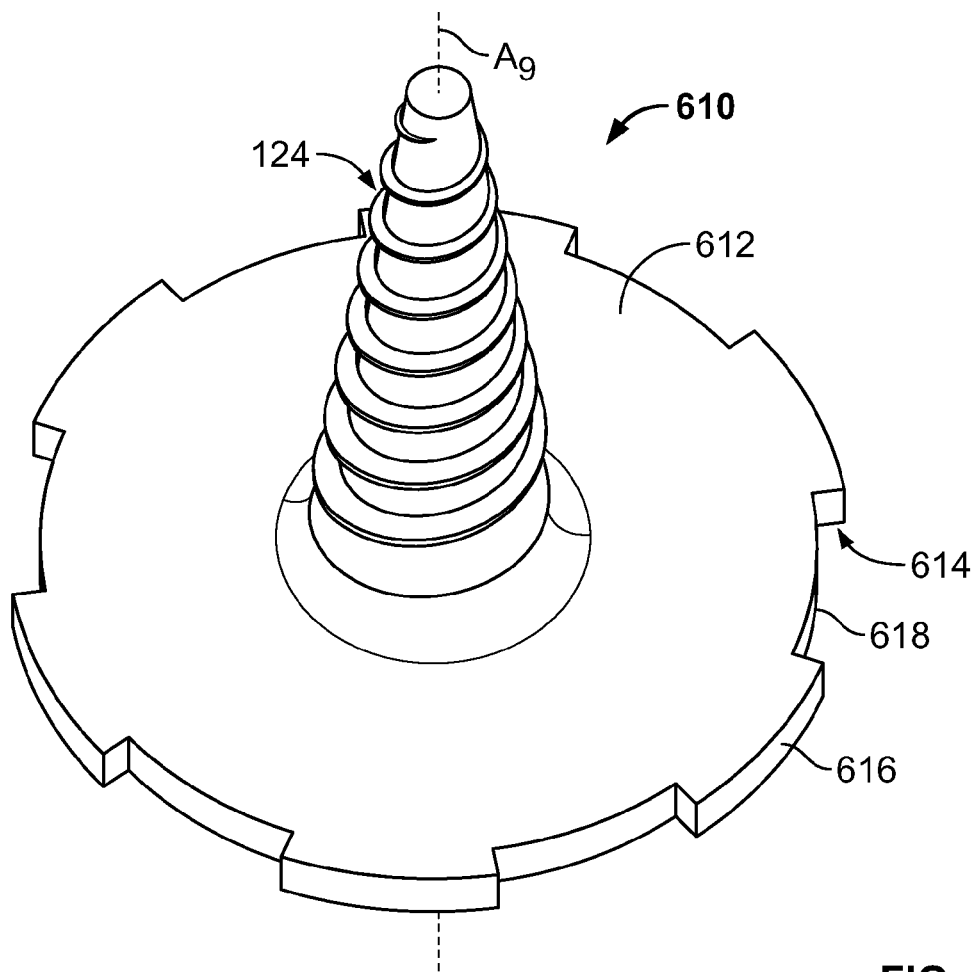
FIG. 105 is a bottom perspective view of a base of an exemplary monitoring device according to the present disclosure.
Figure 106:
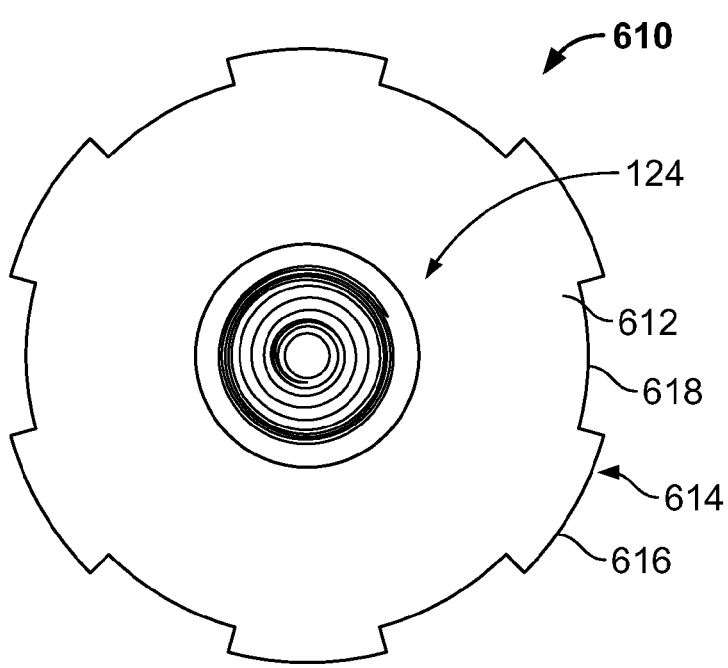
FIG. 106 is a bottom view of a base of an exemplary monitoring device according to the present disclosure.
Figure 107:
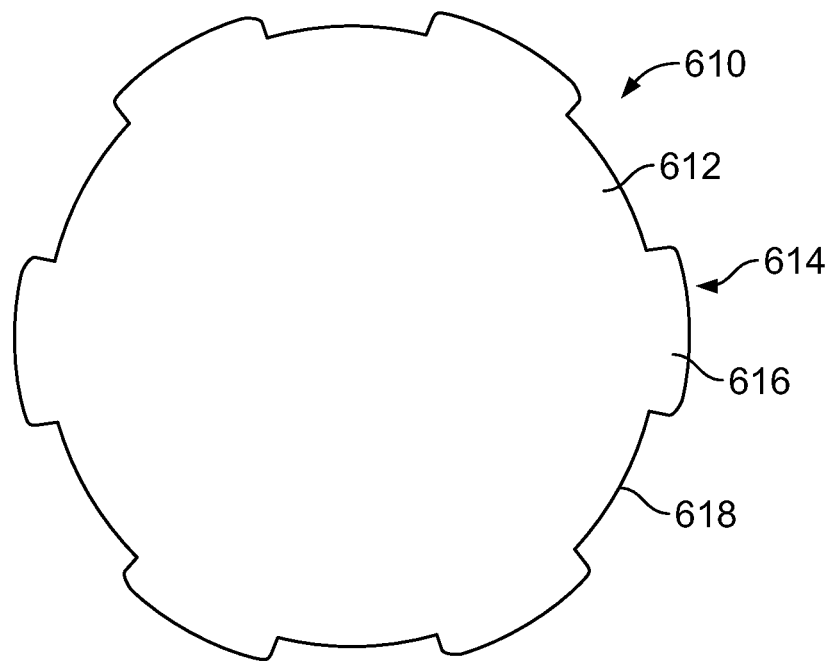
FIG. 107 is a top view of a base of an exemplary monitoring device according to the present disclosure.
Figure 108:
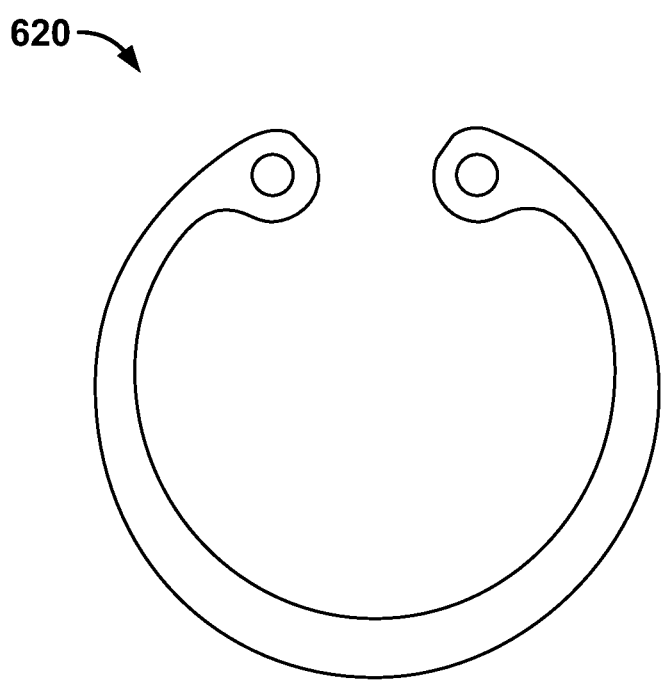
FIG. 108 is a top view of a retaining ring of an exemplary monitoring device according to the present disclosure.

FIGS. 105-107 show perspective, bottom and top views of an exemplary base 610. In some embodiments, the base 610 can include features of the bases discussed above. The base 610 includes a support portion 612 from which extends the fastening portion 124. The support portion 612 can define undulating features 614 extending therefrom. In particular, the undulating features 614 include a plurality of male and female members 616, 618 extending radially relative to the central vertical axis $A_9$. Although illustrated as substantially rectangular, in some embodiments, the male and female members 616, 618 can define alternative configurations, e.g., triangular, oval, semicircular, and the like. The male and female members 616, 618 of the base 610 can be configured and dimensioned to be complementary to the male and female members 606, 608 of the cover 600 such that the male and female members 616, 618 can be inserted into the corresponding male and female members 606, 608. The interlocked undulating features 604, 614 can thereby prevent rotation of the cover 600 relative to the base 610.

Further, the male and female members 616, 618 can be inserted into the corresponding male and female members 606, 608 such that the support portion 612 of the base 610 is positioned beyond the circumferential groove 602, e.g., farther from the bottom surface 112 of the cover 600 than the circumferential groove 602. Once the base 610 and the cover 600 are assembled, a retaining ring 620 of FIG. 108 can be compressed and inserted into the circumferential groove 602 to lock the cover 600 and the base 610 together. In particular, the retaining ring 620 can be compressed to fit the retaining ring 620 within the circumferential groove 602 and, upon release, the retaining ring 620 can expand to prevent removal of the base 610 from the cover 600.

Figure 109:
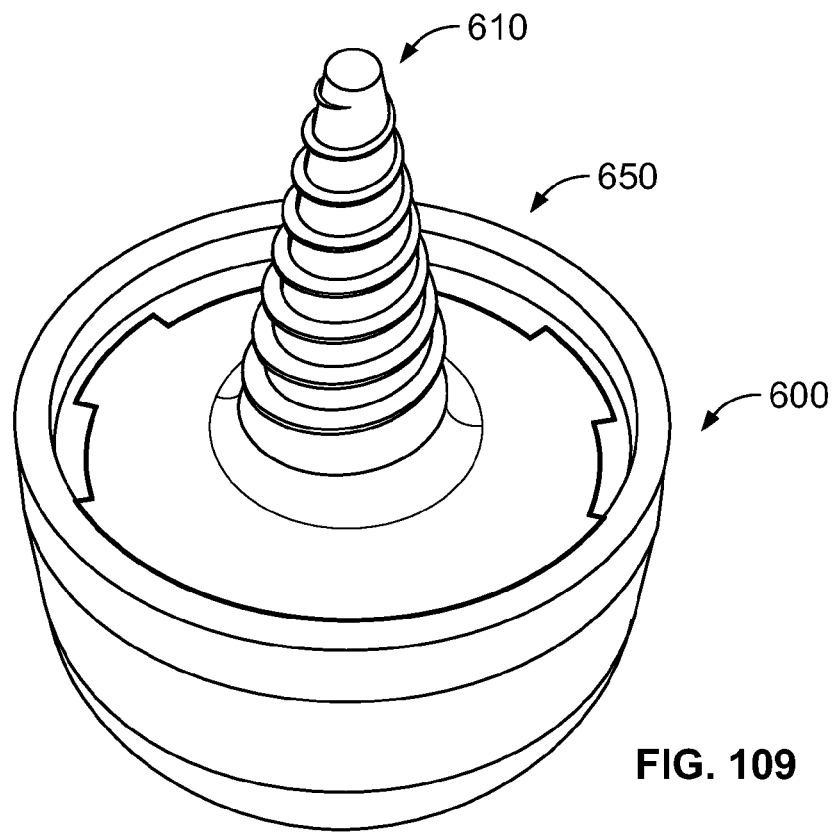
FIG. 109 is a bottom perspective view of an exemplary monitoring device according to the present disclosure.
Figure 110:
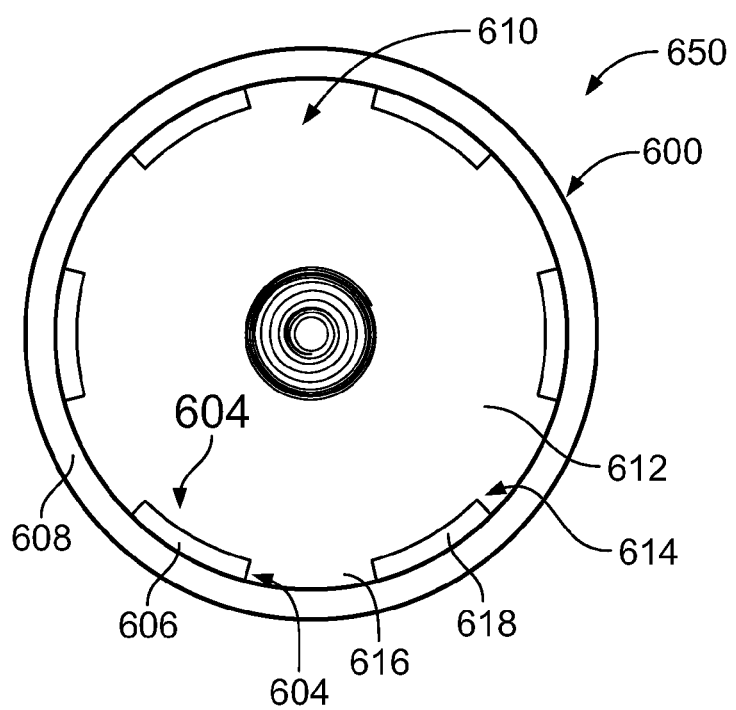
FIG. 110 is a bottom view of an exemplary monitoring device according to the present disclosure.
Figure 111:
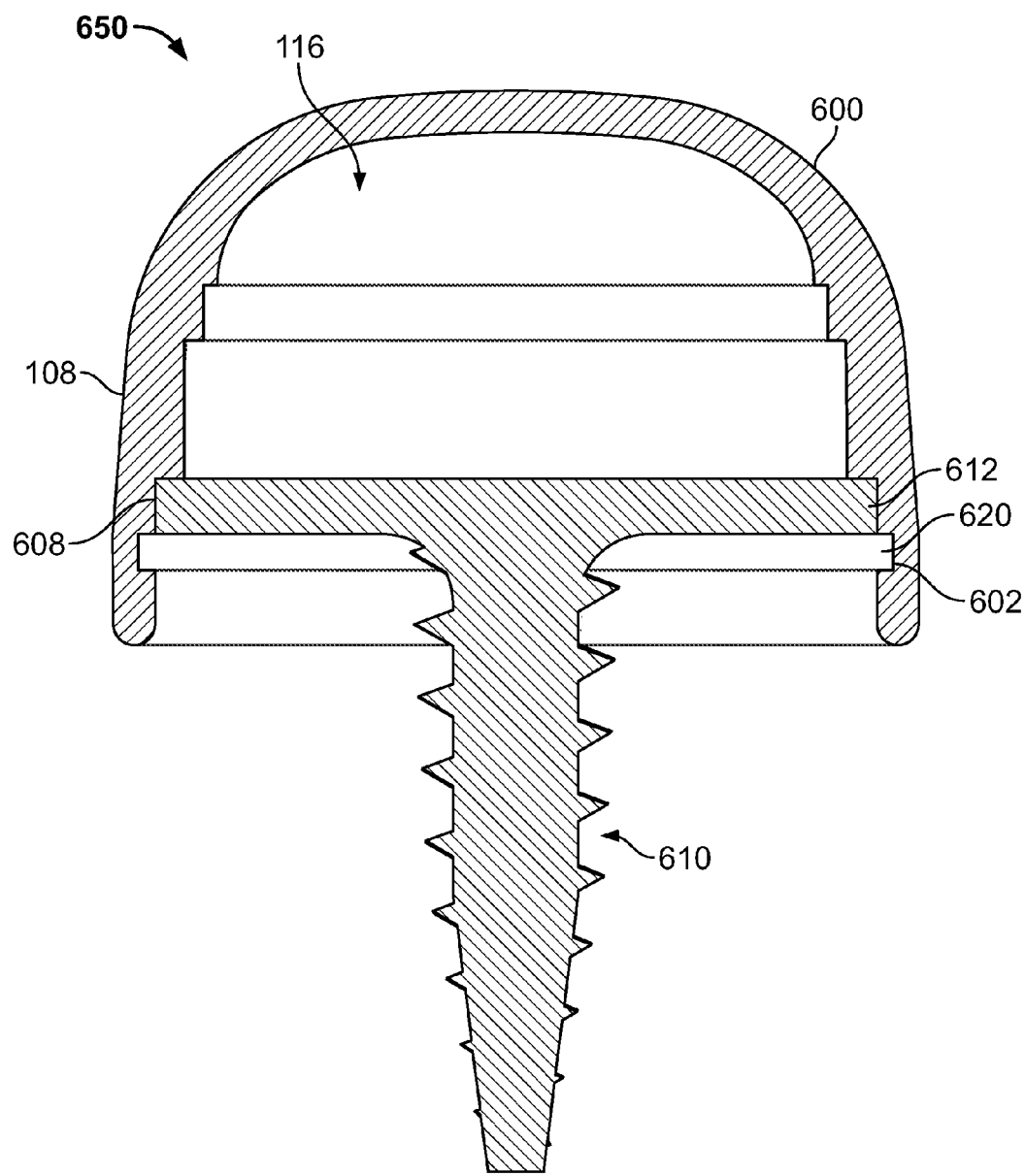
FIG. 111 is a side cross-sectional view of an exemplary monitoring device according to the present disclosure.

With reference to FIGS. 109-111, perspective, bottom and cross-sectional views of an exemplary device 650 are provided. In particular, FIGS. 109-111 show the base 610 assembled with the cover 600 and FIG. 111 shows the retaining ring 620 positioned within the circumferential groove 602 of the cover 600 to interlock the base 610 relative to the cover 600. It should be understood that the interior space 116 can be configured and dimensioned to include, e.g., a PCB, a chassis, a positive electrical contact, a negative electrical contact, a cap, a battery, and the like. Thus, the exemplary devices discussed herein can monitor performance characteristics associated with user activities involving a swinging instrument, maintain the battery in a secure housing during use of the devices, and provide convenient access to the battery for replacement and/or insertion.

While exemplary embodiments have been described herein, it is expressly noted that these embodiments should not be construed as limiting, but rather that additions and modifications to what is expressly described herein also are included within the scope of the invention. Moreover, it is to be understood that the features of the various embodiments described herein are not mutually exclusive and can exist in various combinations and permutations, even if such combinations or permutations are not made express herein, without departing from the spirit and scope of the invention.

The invention claimed is:

1. A device for attachment to a swinging instrument, comprising:
    a cover,
    a base including a fastening portion and a support portion,
    a chassis for supporting a printed circuit board,
    positive and negative electrical contacts, and
    a cap configured and dimensioned to mate relative to the support portion of the base,
    wherein the support portion supports the chassis, the printed circuit board, the positive and negative electrical contacts, and the cap,
    wherein the cover is configured and dimensioned detachably interlock relative to the base to cover the chassis, the printed circuit board, the positive and negative electrical contacts, and the cap,
    wherein in the mated configuration, the cap and the base form a battery opening configured and dimensioned to receive therethrough a battery, and
    wherein the positive electrical contact comprises a body, first and second walls extending from the body, and extensions extending from the first and second walls, the first wall being asymmetrical relative to the second wall.

2. The device according to claim 1, wherein the cover comprises an inner circumferential flange configured and dimensioned to snap over an edge of a bottom surface of the base to detachably interlock the cover to the base.

3. The device according to claim 1, wherein the cover and the base comprise complementary undulating features for detachably interlocking the cover to the base.

4. The device according to claim 1, comprising a retaining ring positioned within a circumferential groove in an inner surface of the cover to detachably interlock the cover and the base.

5. The device according to claim 1, wherein the cover comprises a depressible button on a top surface for actuating an actuator of the printed circuit board.

6. The device according to claim 5, wherein the depressible button translates a protrusion on an interior surface of the cover through an opening in the cap to actuate the actuator of the printed circuit board.

7. The device according to claim 1, wherein the fastening portion comprises a shaft including an external thread.

8. The device according to claim 1, wherein the support portion of the base comprises a first side opening and a second side opening, at least a portion of the first side opening forming the battery opening.

9. The device according to claim 1, wherein in the mated configuration, the cap and the base form an opening configured and dimensioned to receive an instrument therethrough to eject the battery.

10. The device according to claim 1, wherein the support portion of the base comprises two or more slots and the cap comprises two or more complementary protrusions extending therefrom, the two or more slots and the two or more complementary protrusions being configured and dimensioned to mate relative to each other.

11. The device according to claim 1, wherein the chassis comprises two electrical slots for receiving extensions of the negative electrical contact therethrough.

12. The device according to claim 11, wherein the chassis comprises a recessed portion on a bottom surface for receiving a body portion of the negative electrical contact.

13. The device according to claim 1, wherein the chassis comprises a plurality of side openings or slots for receiving extensions of the positive electrical contact therethrough.

14. The device according to claim 1, wherein the negative electrical contact comprises a body, first and second walls extending from the body, and an extension extending from the first wall, the first wall being asymmetrical relative to the second wall.

15. The device according to claim 1, wherein the cover defines an off-center configuration.

16. The device according to claim 1, wherein the battery opening is a side opening.

17. A device for attachment to a swinging instrument, comprising:
    a cover,
    a base including a fastening portion and a support portion,
    a chassis for supporting a printed circuit board,
    positive and negative electrical contacts, and
    a cap configured and dimensioned to mate relative to the support portion of the base,
    wherein the support portion supports the chassis, the printed circuit board, the positive and negative electrical contacts, and the cap,
    wherein the cover is configured and dimensioned detachably interlock relative to the base to cover the chassis, the printed circuit board, the positive and negative electrical contacts, and the cap,
    wherein in the mated configuration, the cap and the base form a battery opening configured and dimensioned to receive therethrough a battery, and
    wherein the negative electrical contact comprises a body, first and second walls extending from the body, and an extension extending from the first wall, the first wall being asymmetrical relative to the second wall.

18. The device according to claim 17, wherein the cover comprises an inner circumferential flange configured and dimensioned to snap over an edge of a bottom surface of the base to detachably interlock the cover to the base.

19. The device according to claim 17, wherein the cover and the base comprise complementary undulating features for detachably interlocking the cover to the base.

20. The device according to claim 17, wherein the cover comprises a depressible button on a top surface for actuating an actuator of the printed circuit board.

21. The device according to claim 20, wherein the depressible button translates a protrusion on an interior surface of the cover through an opening in the cap to actuate the actuator of the printed circuit board.

22. The device according to claim 17, wherein the fastening portion comprises a shaft including an external thread.

23. The device according to claim 17, wherein the support portion of the base comprises a first side opening and a second side opening, at least a portion of the first side opening forming the battery opening.

24. The device according to claim 17, wherein the support portion of the base comprises two or more slots and the cap comprises two or more complementary protrusions extending therefrom, the two or more slots and the two or more complementary protrusions being configured and dimensioned to mate relative to each other.

25. The device according to claim 17, wherein the chassis comprises two electrical slots for receiving the extension of the negative electrical contact therethrough.

26. The device according to claim 25, wherein the chassis comprises a recessed portion on a bottom surface for receiving a body portion of the negative electrical contact.

27. The device according to claim 17, wherein the chassis comprises a plurality of side openings or slots for receiving extensions of the positive electrical contact therethrough.

28. The device according to claim 17, wherein the cover defines an off-center configuration.

29. The device according to claim 17, wherein the battery opening is a side opening.

* * * * *